United States Patent
Varshney et al.

(10) Patent No.: US 12,492,252 B2
(45) Date of Patent: Dec. 9, 2025

(54) ANTI-GPC3 ANTIBODY, ANTI-GPC3 CHIMERIC ANTIGEN RECEPTOR AND GPC3/CD3 BISPECIFIC ANTIBODY

(71) Applicant: SHANDONG BOAN BIOTECHNOLOGY CO., LTD., Yantai (CN)

(72) Inventors: Avanish Varshney, Westford, MA (US); Kehao Zhao, Newton, MA (US); Li Zhou, West Roxbury, MA (US); Xin Kai, Woburn, MA (US); Liangjun Wei, Nanjing (CN); Ninghai Wang, Woburn, MA (US)

(73) Assignee: Shandong Boan Biotechnology Co., Ltd., Shandong (CN)

( * ) Notice: Subject to any disclaimer, the term of this patent is extended or adjusted under 35 U.S.C. 154(b) by 520 days.

(21) Appl. No.: 18/014,021

(22) PCT Filed: Jun. 30, 2021

(86) PCT No.: PCT/CN2021/103447
§ 371 (c)(1),
(2) Date: Dec. 30, 2022

(87) PCT Pub. No.: WO2022/002112
PCT Pub. Date: Jan. 6, 2022

(65) Prior Publication Data
US 2023/0357385 A1  Nov. 9, 2023

Related U.S. Application Data

(60) Provisional application No. 63/063,550, filed on Aug. 10, 2020, provisional application No. 63/047,239, filed on Jul. 1, 2020.

(51) Int. Cl.
*C07K 16/28* (2006.01)
*A61K 40/11* (2025.01)
(Continued)

(52) U.S. Cl.
CPC .............. *C07K 16/28* (2013.01); *A61K 40/11* (2025.01); *A61K 40/31* (2025.01);
(Continued)

(58) Field of Classification Search
None
See application file for complete search history.

(56) References Cited

U.S. PATENT DOCUMENTS 5,571,894 A  11/1996  Wels et al.
5,587,458 A  12/1996  King et al.
(Continued)

FOREIGN PATENT DOCUMENTS

CN  101687915  3/2010
CN  103833852  6/2014
(Continued)

OTHER PUBLICATIONS

Almagro et al., "Humanization of antibodies," Front Biosci, Jan. 2008, 13:1619-33.
(Continued)

*Primary Examiner* — Karl J Puttlitz
(74) *Attorney, Agent, or Firm* — Fish & Richardson P.C.

(57) ABSTRACT

Provided herein are novel Glypican 3 (GPC3) antibodies or antigen binding fragments and GPC3/CD3 bispecific antibodies. The present application also provides chimeric antigen receptors comprising the antibodies or antigen-binding fragments, related CAR-T cells, and preparation methods and uses of the same. The present application further provides pharmaceutical compositions comprising GPC3 antibodies or antigen binding fragments, related GPC3/CD3 bispecific antibodies, related GPC3 CAR or CAR-T cells, and methods of treating cancer in a subject in need thereof by administering the Glypican 3 (GPC3) antibodies or antigen binding fragments, the bispecific antibodies, the (Continued)

chimeric antigen receptors, the CAR-T cells, or the pharmaceutical compositions. The cancers treated in accordance with the application include Glypican-3-positive cancers.

20 Claims, 14 Drawing Sheets

Specification includes a Sequence Listing.

(51) Int. Cl.
  *A61K 40/31* (2025.01)
  *A61K 40/42* (2025.01)
  *A61P 35/00* (2006.01)
  *C12N 15/63* (2006.01)

(52) U.S. Cl.
  CPC .......... *A61K 40/4261* (2025.01); *A61P 35/00* (2018.01); *C12N 15/63* (2013.01); *A61K 2239/38* (2023.05); *A61K 2239/53* (2023.05); *C07K 2317/31* (2013.01); *C07K 2317/565* (2013.01); *C07K 2317/622* (2013.01)

(56) References Cited

U.S. PATENT DOCUMENTS

| | | | |
|---|---|---|---|
| 5,869,046 | A | 2/1999 | Presta et al. |
| 6,248,516 | B1 | 6/2001 | Winter et al. |
| 2011/0287533 | A1 | 11/2011 | Chang |
| 2012/0034228 | A1 | 2/2012 | Kufer et al. |
| 2016/0130347 | A1 | 5/2016 | Bruenker et al. |
| 2016/0215261 | A1 | 7/2016 | Li et al. |
| 2016/0264671 | A1 | 9/2016 | Kufer et al. |
| 2018/0134789 | A1 | 5/2018 | Baeuerle et al. |
| 2018/0244805 | A1 | 8/2018 | Nezu et al. |
| 2019/0284279 | A1 | 9/2019 | Kong et al. |
| 2020/0055932 | A1 | 2/2020 | Dahlhoff et al. |
| 2023/0075633 | A1 | 3/2023 | Varshney et al. |

FOREIGN PATENT DOCUMENTS

| | | |
|---|---|---|
| CN | 104140974 | 11/2014 |
| CN | 105829347 | 8/2016 |
| CN | 105949324 | 9/2016 |
| CN | 107043425 | 8/2017 |
| CN | 107556387 | 1/2018 |
| CN | 107614522 | 1/2018 |
| CN | 110003332 | 7/2019 |
| CN | 111196856 | 5/2020 |
| EP | 404097 | 12/1990 |
| JP | 2015536908 | 12/2015 |
| JP | 2019513014 | 5/2019 |
| WO | WO 1993001161 | 1/1993 |
| WO | WO 1993016185 | 8/1993 |
| WO | WO 2010037835 | 4/2010 |
| WO | WO 2010088522 | 8/2010 |
| WO | WO 2013070468 | 5/2013 |
| WO | WO 2013167153 | 11/2013 |
| WO | WO 2014056783 | 4/2014 |
| WO | WO 2017118675 | 7/2017 |
| WO | WO 2017156178 | 9/2017 |
| WO | WO 2017159287 | 9/2017 |
| WO | WO 2018114754 | 6/2018 |
| WO | WO 2019086497 | 5/2019 |
| WO | WO 2019241216 | 12/2019 |
| WO | WO 2020025792 | 2/2020 |
| WO | WO 2020135674 | 7/2020 |
| WO | WO 2020139956 | 7/2020 |
| WO | WO 2020147321 | 7/2020 |
| WO | WO 2021121215 | 6/2021 |
| WO | WO 2022166940 | 8/2022 |

OTHER PUBLICATIONS

Bacac et al., "A Novel Carcinoembryonic Antigen T-Cell Bispecific Antibody (CEA TCB) for the Treatment of Solid Tumors," Clin Cancer Res, Jul. 2016, 22(13):3286-97.
Brinkmann et al., "The making of bispecific antibodies," MABS, Jan. 2017, 9(2):182-212.
Cao et al., "Improved chemotherapy for hepatocellular carcinoma," Anticancer Research, Apr. 1, 2012, 32(4):1379-1386.
Cartellieri et al., "Chimeric antigen receptor-engineered T cells for immunotherapy of cancer," Journal of Biomedicine and Biotechnology, May 5, 2010, 2010(956304):1-14.
Chothia et al., "Canonical Structures for the Hypervariable Regions of Immunoglobulins," J Mol Biol, Aug. 1987, 196(4):901-17.
Extended European Search Report in European Appln No. 20902716.8, mailed on Jul. 17, 2023, 15 pages.
Filmus et al., "Glypican-3: a marker and a therapeutic target in hepatocellular carcinoma," The FEBS Journal, May 2013, 280(10):2471-2476.
Filmus et al., "Glypicans: proteoglycans with a surprise," The Journal of Clinical Investigation, Aug. 15, 2001, 108(4):497-501.
GenBank Accession No. AFM30911.1, "glypican 3 isoform 2 precursor [*Homo sapiens*]," Jun. 18, 2012, 2 pages.
Grupp et al., "Adoptive cellular therapy," Cancer immunology and immunotherapy, Aug. 11, 2010, 149-172.
Handbook of Experimental Pharmacology vol. 113: The Pharmacology of Monoclonal Antibodies, Rosenberg et al.(ed)., 1994, Chapter 11, 47 pages.
Hayward et al., "Lysis of CD3 hybridoma targets by cloned human CD4 lymphocytes," Immunology, May 1988, 64(1):87-92.
Heeley et al., "Mutations flanking the polyglutamine repeat in the modulatory domain of rat glucocorticoid receptor lead to an increase in affinity for hormone," Endocr Res, Aug. 2002, 28(3):217-29.
Holliger et al., "'Diabodies': Small bivalent and bispecific antibody fragments," Proc Natl Acad Sci USA, Jul. 1993, 90(14):6444-48.
Huang et al., "Tailoring cytolytic activity, proliferation and cytokine release via CD3 engineering of DART molecules for redirected T-cell killing," Keystone Symposium "Antibodies as drugs: Translating molecules into treatments," Mar. 1, 2018, 1 page.
Hudson et al., "Engineered antibodies," Nature Medicine, Jan. 2003, 9(1):129-134.
Huston et al., "Protein Engineering of Single-Chain Fv Analogs and Fusion Proteins," Methods Enzymol, 1991, 203:46-88.
International Preliminary Report on Patentability in International Appln. No. PCT/CN2020/136452, mailed on Jun. 30, 2022, 7 pages.
International Preliminary Report on Patentability in International Appln. No. PCT/CN2021/103447, mailed on Jan. 12, 2023, 6 pages.
International Search Report and Written Opinion in International Appln. No. PCT/CN2020/136452, mailed on Mar. 12, 2021, 13 pages.
International Search Report and Written Opinion in International Appln. No. PCT/CN2021/103447, mailed on Oct. 9, 2021, 14 pages.
International Search Report and Written Opinion in International Appln. No. PCT/CN2022/075326, mailed on May 11, 2022, 16 pages.
Ishiguro et al., "An anti-glypican 3/CD3 bispecific T cell-redirecting antibody for treatment of solid tumors," Science Translational Medicine, Jan. 2017, 9(410):eaal4291, 14 pages.
Johnson et al., "Construction of single-chain Fv derivatives monoclonal antibodies and their production in *Escherichia coli*," Methods Enzymol, 1991, 203:88-98.
Kipriyanov et al., "Two amino acid mutations in an anti-human CD3 single chain Fv antibody fragment that affect the yield on bacterial secretion but not the affinity," Protein Eng, Apr. 1997, 10(4):445-53.
Kuby Immunology, 6th ed., Kindt et al (ed)., 2007, Chapter 4, p. 91, 1 page.
Labrijn et al., "Bispecific antibodies: a mechanistic review of the pipeline," Nat Rev Drug Discov, Aug. 2019, 18:585-608.
Lau et al., "Loss of the imprinted IGF2/cation-independent mannose 6-phosphate receptor results in fetal overgrowth and perinatal lethality," Genes & Development, Dec. 15, 1994, 8(24):2953-2963.
Ledbetter et al., "Valency of CD3 binding and internalization of the CD3 cell-surface complex control T cell responses to second

(56) References Cited

OTHER PUBLICATIONS signals: distinction between effects on protein kinase C, cytoplasmic free calcium, and proliferation," J Immunol, Jun. 1986, 136(11):3945-52.

Liljeblad et al., "Analysis of agalacto-IgG in rheumatoid arthritis using surface plasmon resonance," Glycoconj J, May 2000, 17(5):323-9.

Ludwig et al., "Mouse mutants lacking the type 2 IGF receptor (IGF2R) are rescued from perinatal lethality in Igf2 and Igf1r Null backgrounds," Developmental Biology, Aug. 1, 1996, 177(2):517-535.

Mølgaard et al., "Balanced secretion of anti-CEA × anti-CD3 diabody chains using the 2A self-cleaving peptide maximizes diabody assembly and tumor-specific cytotoxicity," Gene Ther, Apr. 2017, 24(4):208-14.

Moore et al., "Tuning T cell affinity improves efficacy and safety of anti-CD38 × anti-CD3 bispecific antibodies in monkeys—a potential therapy for multiple myeloma," Blood, Dec. 3, 2015, 126(23):1798.

Office Action in Chinese Appln. No. 202110794916.9, dated Aug. 9, 2022, 8 pages (with English Translation).

Office Action in Chinese Appln. No. 202110794916.9, dated Jun. 10, 2022, 13 pages (with English Translation).

Partial Supplemental European Search Report in European Appln. No. 20902716.8, mailed on Apr. 12, 2023, 18 pages.

Savoldo et al., "CD28 costimulation improves expansion and persistence of chimeric antigen receptor—modified T cells in lymphoma patients," The Journal of Clinical Investigation, May 2, 2011, 121(5): 1822-1826.

Suurs et al., "A review of bispecific antibodies and antibody constructs in oncology and clinical challenges," Pharmacology & Therapeutics, Sep. 1, 2019, 201:103-119.

Tabernero et al., "Phase Ia and Ib studies of the novel carcinoembryonic antigen (CEA) T-cell bispecific (CEA CD3 TCB) antibody as a single agent and in combination with atezolizumab: Preliminary efficacy and safety in patients with metastatic colorectal cancer (mCRC)," Abstract, Presented at Proceedings of 2017 ASCO Annual Meeting I, Chicago, IL, Jun. 2-6, 2017; J Clin Oncol, May 2017, 35(15)(Suppl.):3002.

Vafa et al., "Perspective: Designing T-cell engagers with better therapeutic windows," Frontiers in Oncology, Apr. 15, 2020, 10(446):1-7.

Wang et al., "Regulation of embryonic growth and lysosomal targeting by the imprinted Igf2/Mpr gene," Nature, Dec. 1, 1994, 372(6505):464-467 (Abstract Only).

Wu et al., "Construction of GPC3-CAR-T cell targeting hepatocellular carcinoma and identification of its function," Chin J. Cancer Biother., Jul. 2017, 24(7):748-755 (with English abstract).

Yang et al., "A common pathway for T lymphocyte activation involving both the CD3-Ti complex and CD2 sheep erythrocyte receptor determinants," J Immunol, Aug. 1986, 137(4):1097-100.

Yaokai, "Anti-GPC3 × CD3 bispecific antigens the construction of the body and its activities against liver cancer," May 2018, Thesis for the master's degree, Xiamen University, May 2018, 84 pages, (with English abstract).

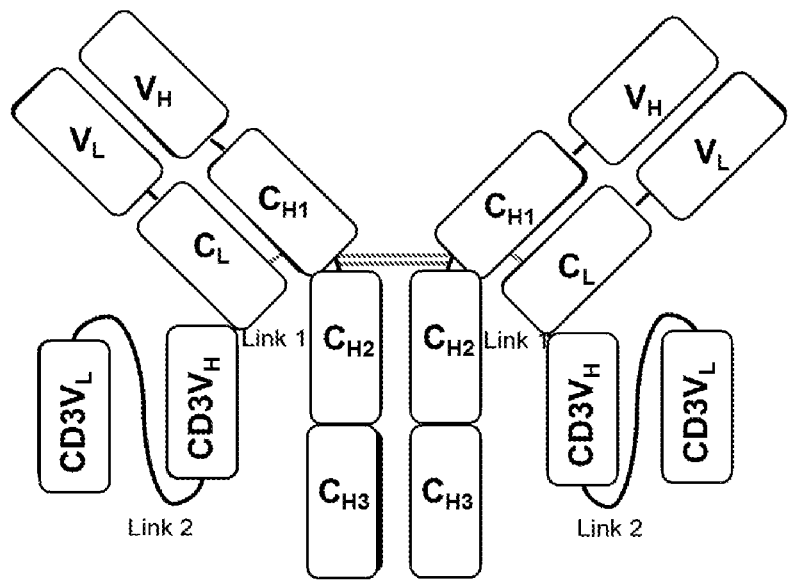
Fig. 1
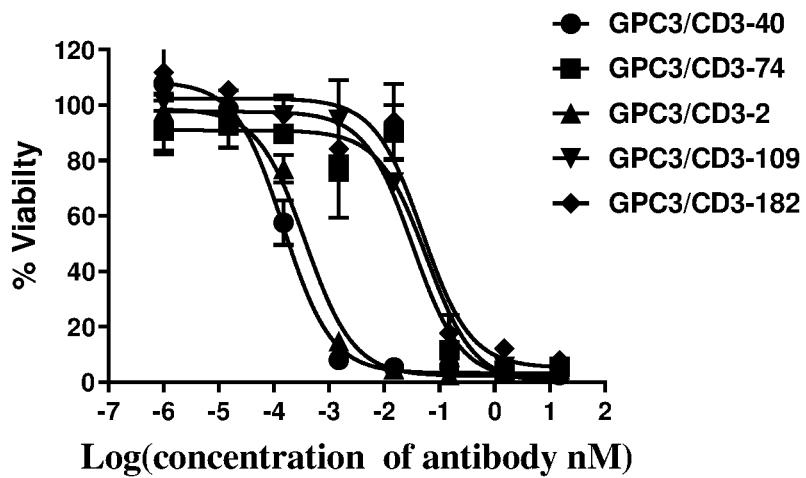
Fig. 2A
| Antibody | HepG2 | |
|---|---|---|
| | EC50 nM | Span |
| GPC3/CD3-40 | 0.00015 | -105.2 |
| GPC3/CD3-74 | 0.05779 | -91.0 |
| GPC3/CD3-2 | 0.00037 | -96.3 |
| GPC3/CD3-109 | 0.03264 | -96.6 |
| GPC3/CD3-182 | 0.04971 | -97.1 |
Fig. 2B

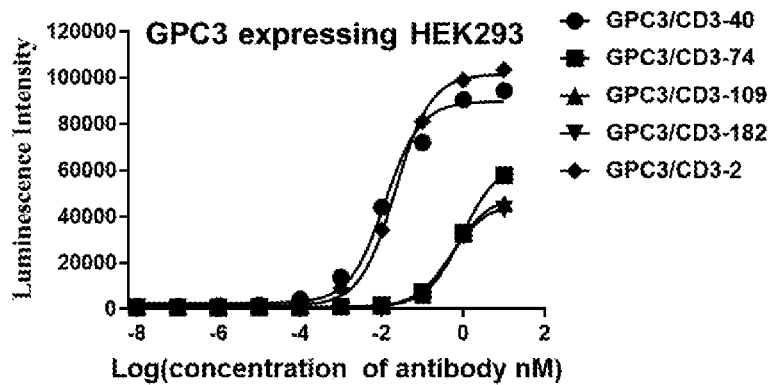
Fig. 4A
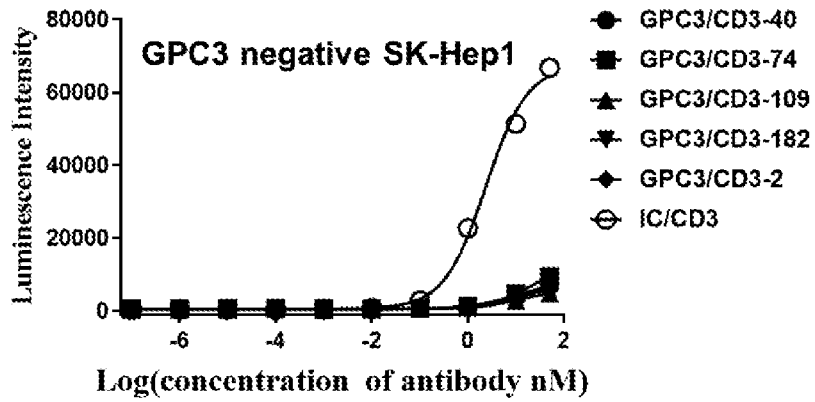
Fig. 4B
| Antibody | GPC3⁺ HEK-293 | |
|---|---|---|
| | EC50 nM | Span |
| GPC3/CD3-40 | 0.0119 | 87218 |
| GPC3/CD3-74 | 0.9236 | 62167 |
| GPC3/CD3-2 | 0.0217 | 100157 |
| GPC3/CD3-109 | 0.5625 | 48047 |
| GPC3/CD3-182 | 0.4875 | 45021 |
Fig. 4C

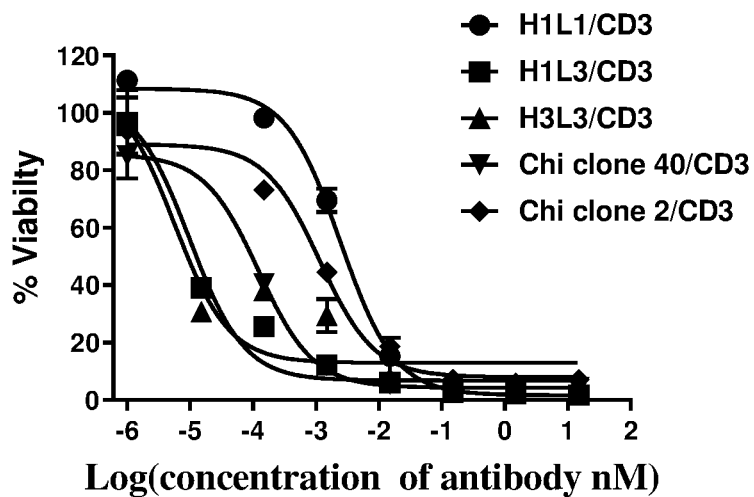
Fig. 5A
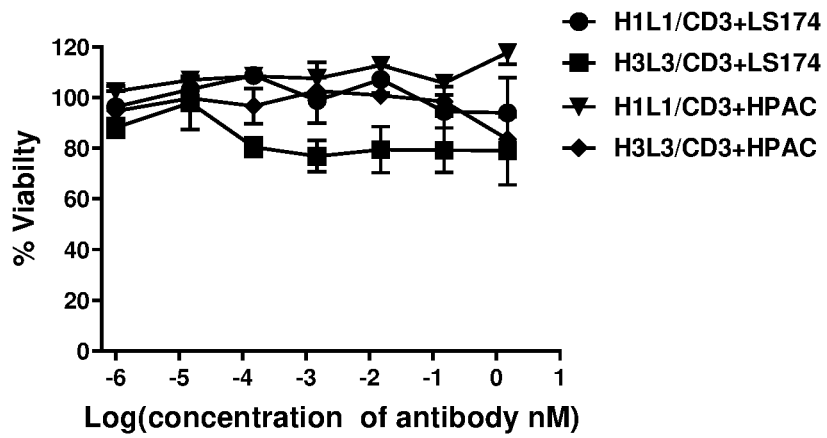
Fig. 5B
| Antibody | HepG2 cell | |
|---|---|---|
| | EC50 nM | Span |
| H1L1/CD3 | 0.0024 | -106.8 |
| H1L3/CD3 | 9.824e-006 | -98.5 |
| H3L3/CD3 | 5.643e-006 | -96.7 |
| Chi clone 40/CD3 | 0.0001 | -81.2 |
| Chi clone 2/CD3 | 0.0011 | -81.0 |
Fig. 5C H1L3/1a3b2b1

H1L1/1a3b2b1

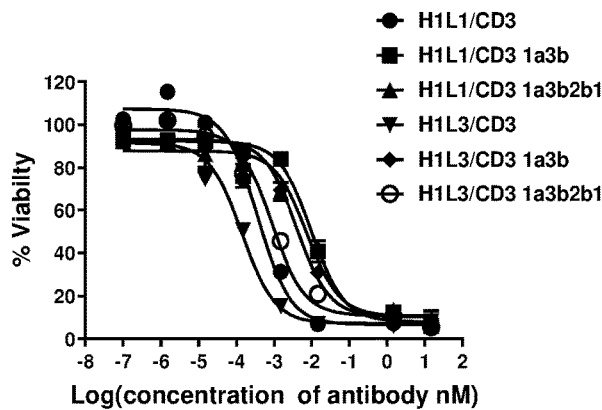
Fig. 7A
| Antibody | HepG2 cell | |
|---|---|---|
| | EC50 nM | Span |
| H1L1/CD3 | 0.00036 | -100.7 |
| H1L1/CD3 1a3b | 0.01000 | -84.3 |
| H1L1/CD3 1a3b2b1 | 0.0076 | -77.2 |
| H1L3/CD3 | 0.00013 | -84.2 |
| H1L3/CD3 1a3b | 0.00404 | -82.9 |
| H1L3/CD3 1a3b2b1 | 0.00086 | -86.7 |
Fig. 7B
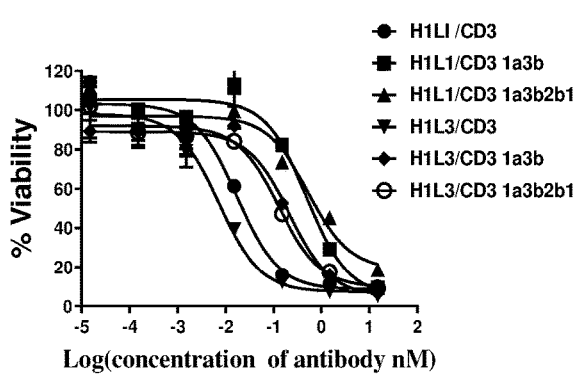
Fig. 7C
| Antibody | HepG2 cell | |
|---|---|---|
| | EC50 nM | Span |
| H1L1/CD3 | 0.01726 | -94.6 |
| H1L1/CD3 1a3b | 0.50280 | -100.2 |
| H1L1/CD3 1a3b2b1 | 0.53870 | -78.2 |
| H1L3/CD3 | 0.00721 | -90.7 |
| H1L3/CD3 1a3b | 0.21540 | -83.8 |
| H1L3/CD3 1a3b2b1 | 0.12910 | -82.4 |
Fig. 7D
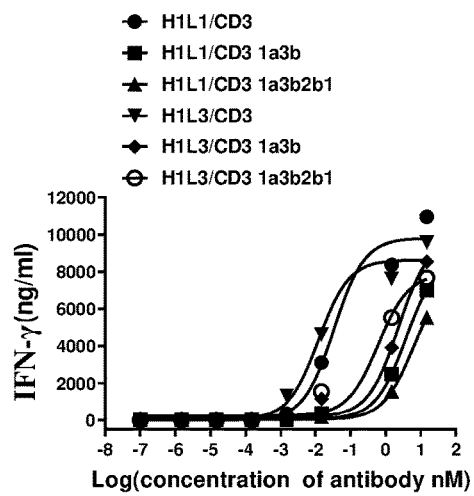
Fig. 8A
| Antibody | HepG2 cell | |
|---|---|---|
| | EC50 nM | Span |
| H1L1/CD3 | 0.034 | 9818 |
| H1L1/CD3 1a3b | 3.83 | 8742 |
| H1L1/CD3 1a3b2b1 | 6.07 | 7734 |
| H1L3/CD3 | 0.012 | 8604 |
| H1L3/CD3 1a3b | 2.339 | 9652 |
| H1L3/CD3 1a3b2b1 | 0.617 | 7661 |
Fig. 8B

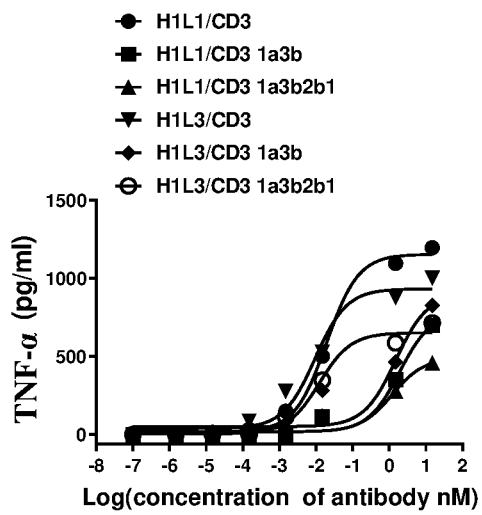
Fig. 8C
| Antibody | HepG2 cell | |
|---|---|---|
| | EC50 nM | Span |
| H1L1/CD3 | 0.0194 | 1134 |
| H1L1/CD3 1a3b | 1.938 | 768.4 |
| H1L1/CD3 1a3b2b1 | 1.195 | 472.4 |
| H1L3/CD3 | 0.0094 | 892.9 |
| H1L3/CD3 1a3b | 1.513 | 850.4 |
| H1L3/CD3 1a3b2b1 | 0.0122 | 647.1 |
Fig. 8D
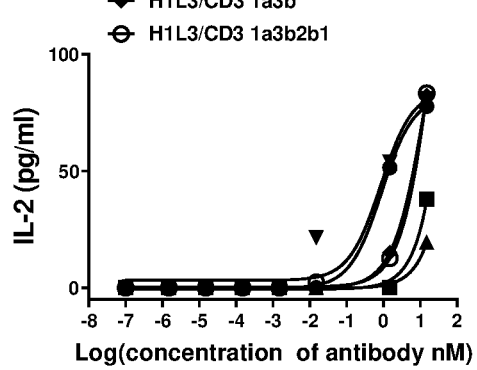
Fig. 8E
| Antibody | HepG2 cell | |
|---|---|---|
| | EC50 nM | Span |
| H1L1/CD3 | 0.9019 | 82.6 |
| H1L1/CD3 1a3b | ND | ND |
| H1L1/CD3 1a3b2b1 | ND | ND |
| H1L3/CD3 | 0.849 | 81.65 |
| H1L3/CD3 1a3b | 14.43 | 161.7 |
| H1L3/CD3 1a3b2b1 | 26.37 | 228.8 |
Fig. 8F
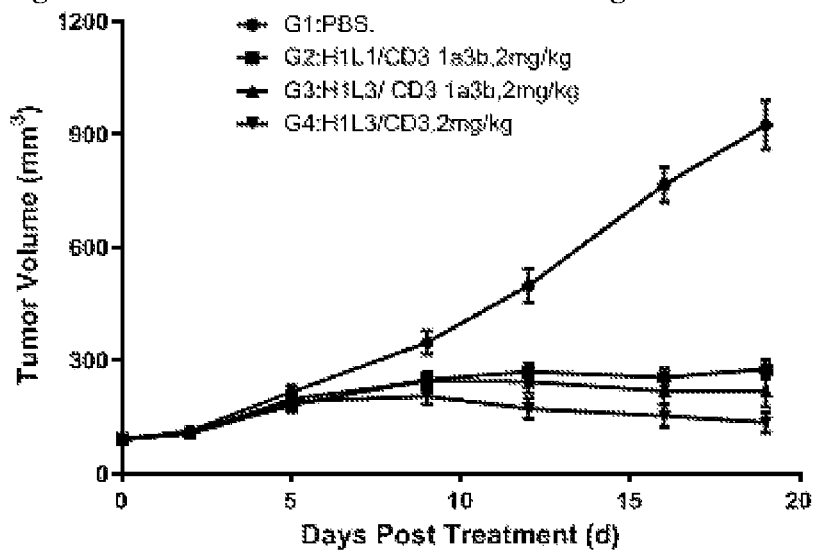
Fig. 9A

SEQUENCE LISTING

<160> NUMBER OF SEQ ID NOS: 74

<210> SEQ ID NO 1
<211> LENGTH: 10
<212> TYPE: PRT
<213> ORGANISM: Artificial Sequence
<220> FEATURE:
<223> OTHER INFORMATION: HCDR1

<400> SEQUENCE: 1

Gly Phe Ser Leu Ser Thr Tyr Trp Met Thr
1               5                   10

<210> SEQ ID NO 2
<211> LENGTH: 16
<212> TYPE: PRT
<213> ORGANISM: Artificial Sequence
<220> FEATURE:
<223> OTHER INFORMATION: HCDR2

<400> SEQUENCE: 2

Ile Ile Ser Pro Ala Gly Ser Ala Tyr Tyr Ala Ser Trp Ala Lys Gly
1               5                   10                  15

<210> SEQ ID NO 3
<211> LENGTH: 8
<212> TYPE: PRT
<213> ORGANISM: Artificial Sequence
<220> FEATURE:
<223> OTHER INFORMATION: HCDR3

<400> SEQUENCE: 3

Ala Gly Gly Gly Gly Met Asp Pro
1               5

<210> SEQ ID NO 4
<211> LENGTH: 12
<212> TYPE: PRT
<213> ORGANISM: Artificial Sequence
<220> FEATURE:
<223> OTHER INFORMATION: LCDR1

<400> SEQUENCE: 4

Gln Ser Ser Gln Ser Ile Val Lys Asn Tyr Leu Ser
1               5                   10

<210> SEQ ID NO 5
<211> LENGTH: 7
<212> TYPE: PRT
<213> ORGANISM: Artificial Sequence
<220> FEATURE:
<223> OTHER INFORMATION: LCDR2

<400> SEQUENCE: 5

Lys Ala Ser Thr Leu Pro Ser
1               5

<210> SEQ ID NO 6
<211> LENGTH: 10
<212> TYPE: PRT
<213> ORGANISM: Artificial Sequence
<220> FEATURE:
<223> OTHER INFORMATION: LCDR3

<400> SEQUENCE: 6

Ala Ala Ser Tyr Ser Asp Asn Ile Tyr Val
1               5                   10

<210> SEQ ID NO 7
<211> LENGTH: 114
<212> TYPE: PRT
<213> ORGANISM: Artificial Sequence
<220> FEATURE:
<223> OTHER INFORMATION: VH1

<400> SEQUENCE: 7

Gln Cys Gln Ser Val Glu Glu Ser Gly Gly Leu Val Gln Pro Gly
1               5                   10                  15

Gly Ser Leu Arg Leu Ser Cys Ala Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Ser Pro Ala Gly Ser Ala Tyr Tyr Ala Ser Trp Ala
    50                  55                  60

Lys Gly Arg Phe Thr Ile Ser Arg Asp Asn Ser Ala Thr Val Tyr Leu
65                  70                  75                  80

Gln Met Asn Ser Leu Arg Ala Glu Asp Thr Ala Val Tyr Phe Cys Ala
                85                  90                  95

Gly Gly Gly Gly Met Asp Pro Trp Gly Gln Gly Thr Leu Val Thr Val
            100                 105                 110

Ser Ser

<210> SEQ ID NO 8
<211> LENGTH: 109
<212> TYPE: PRT
<213> ORGANISM: Artificial Sequence
<220> FEATURE:
<223> OTHER INFORMATION: VL1

<400> SEQUENCE: 8

Asp Ile Val Leu Thr Gln Ser Pro Ser Ala Met Ser Ala Ser Val Gly
1               5                   10                  15

Asp Arg Val Thr Ile Thr Cys Gln Ser Ser Gln Ser Ile Val Lys Asn
            20                  25                  30

Tyr Leu Ser Trp Phe Gln Gln Lys Pro Gly Lys Pro Pro Lys Arg Leu
        35                  40                  45

Ile Tyr Lys Ala Ser Thr Leu Pro Ser Gly Val Pro Ser Arg Phe Ser
    50                  55                  60

Gly Ser Gly Ser Gly Thr Glu Phe Thr Leu Thr Ile Ser Ser Leu Gln
65                  70                  75                  80

Pro Glu Asp Phe Ala Thr Tyr Tyr Cys Ala Ala Ser Tyr Ser Asp Asn
                85                  90                  95

Ile Tyr Val Phe Gly Gly Gly Thr Lys Val Glu Ile Lys
            100                 105

<210> SEQ ID NO 9
<211> LENGTH: 109
<212> TYPE: PRT
<213> ORGANISM: Artificial Sequence
<220> FEATURE:
<223> OTHER INFORMATION: VL3

<400> SEQUENCE: 9

Asp Pro Val Leu Thr Gln Ser Pro Ser Ala Met Ser Ala Ser Val Gly
1               5                   10                  15

Asp Arg Val Thr Ile Thr Cys Gln Ser Ser Gln Ser Ile Val Lys Asn

```
            20                  25                  30
Tyr Leu Ser Trp Phe Gln Gln Lys Pro Gly Gln Pro Pro Lys Arg Leu
            35                  40                  45

Ile Tyr Lys Ala Ser Thr Leu Pro Ser Gly Val Pro Ser Arg Phe Ser
        50                  55                  60

Gly Ser Gly Ser Gly Thr Glu Phe Thr Leu Thr Ile Ser Ser Leu Gln
 65                 70                  75                  80

Pro Glu Asp Phe Ala Thr Tyr Tyr Cys Ala Ala Ser Tyr Ser Asp Asn
                85                  90                  95

Ile Tyr Val Phe Gly Gly Gly Thr Lys Val Glu Ile Lys
            100                 105

<210> SEQ ID NO 10
<211> LENGTH: 125
<212> TYPE: PRT
<213> ORGANISM: Artificial Sequence
<220> FEATURE:
<223> OTHER INFORMATION: anti-CD3-VH

<400> SEQUENCE: 10

Glu Val Gln Leu Val Glu Ser Gly Gly Gly Leu Val Gln Pro Gly Gly
 1               5                  10                  15

Ser Leu Lys Leu Ser Cys Ala Ala Ser Gly Phe Thr Phe Asn Lys Tyr
            20                  25                  30

Ala Met Asn Trp Val Arg Gln Ala Pro Gly Lys Gly Leu Glu Trp Val
        35                  40                  45

Ala Arg Ile Arg Ser Lys Tyr Asn Asn Tyr Ala Thr Tyr Tyr Ala Asp
    50                  55                  60

Ser Val Lys Asp Arg Phe Thr Ile Ser Arg Asp Asp Ser Lys Asn Thr
65                  70                  75                  80

Ala Tyr Leu Gln Met Asn Asn Leu Lys Thr Glu Asp Thr Ala Val Tyr
                85                  90                  95

Tyr Cys Val Arg His Gly Asn Phe Gly Asn Ser Tyr Ile Ser Tyr Trp
            100                 105                 110

Ala Tyr Trp Gly Gln Gly Thr Leu Val Thr Val Ser Ser
        115                 120                 125

<210> SEQ ID NO 11
<211> LENGTH: 109
<212> TYPE: PRT
<213> ORGANISM: Artificial Sequence
<220> FEATURE:
<223> OTHER INFORMATION: anti-CD3-VL

<400> SEQUENCE: 11

Gln Thr Val Val Thr Gln Glu Pro Ser Leu Thr Val Ser Pro Gly Gly
 1               5                  10                  15

Thr Val Thr Leu Thr Cys Gly Ser Ser Thr Gly Ala Val Thr Ser Gly
            20                  25                  30

Tyr Tyr Pro Asn Trp Val Gln Gln Lys Pro Gly Gln Ala Pro Arg Gly
        35                  40                  45

Leu Ile Gly Gly Thr Lys Phe Leu Ala Pro Gly Thr Pro Ala Arg Phe
    50                  55                  60

Ser Gly Ser Leu Leu Gly Gly Lys Ala Ala Leu Thr Leu Ser Gly Val
65                  70                  75                  80

Gln Pro Glu Asp Glu Ala Glu Tyr Tyr Cys Ala Leu Trp Tyr Ser Asn
                85                  90                  95
```

```
Arg Trp Val Phe Gly Gly Gly Thr Lys Leu Thr Val Leu
            100                 105

<210> SEQ ID NO 12
<211> LENGTH: 125
<212> TYPE: PRT
<213> ORGANISM: Artificial Sequence
<220> FEATURE:
<223> OTHER INFORMATION: anti-CD3 OPT1a3b-VH

<400> SEQUENCE: 12

Glu Val Gln Leu Val Glu Ser Gly Gly Gly Leu Val Lys Pro Gly Gly
1               5                   10                  15

Ser Leu Lys Leu Ser Cys Ala Ala Ser Gly Phe Thr Phe Ser Thr Tyr
            20                  25                  30

Ala Met Asn Trp Val Arg Gln Ala Pro Gly Lys Gly Leu Glu Trp Val
        35                  40                  45

Ala Arg Ile Arg Ser Lys Tyr Asn Asn Tyr Ala Thr Tyr Tyr Ala Asp
    50                  55                  60

Ser Val Lys Asp Arg Phe Thr Ile Ser Arg Asp Asp Ser Lys Asn Thr
65                  70                  75                  80

Ala Tyr Leu Gln Met Asn Asn Leu Arg Thr Glu Asp Thr Ala Val Tyr
                85                  90                  95

Tyr Cys Val Arg His Gly Asn Trp Gly Asn Ser Tyr Ile Ser Tyr Trp
            100                 105                 110

Ala Tyr Trp Gly Gln Gly Thr Thr Val Thr Val Ser Ser
        115                 120                 125

<210> SEQ ID NO 13
<211> LENGTH: 110
<212> TYPE: PRT
<213> ORGANISM: Homo sapiens

<400> SEQUENCE: 13

Ala Pro Glu Leu Leu Gly Gly Pro Ser Val Phe Leu Phe Pro Pro Lys
1               5                   10                  15

Pro Lys Asp Thr Leu Met Ile Ser Arg Thr Pro Glu Val Thr Cys Val
            20                  25                  30

Val Val Asp Val Ser His Glu Asp Pro Glu Val Lys Phe Asn Trp Tyr
        35                  40                  45

Val Asp Gly Val Glu Val His Asn Ala Lys Thr Lys Pro Arg Glu Glu
    50                  55                  60

Gln Tyr Asn Ser Thr Tyr Arg Val Val Ser Val Leu Thr Val Leu His
65                  70                  75                  80

Gln Asp Trp Leu Asn Gly Lys Glu Tyr Lys Cys Lys Val Ser Asn Lys
                85                  90                  95

Ala Leu Pro Ala Pro Ile Glu Lys Thr Ile Ser Lys Ala Lys
            100                 105                 110

<210> SEQ ID NO 14
<211> LENGTH: 125
<212> TYPE: PRT
<213> ORGANISM: Artificial Sequence
<220> FEATURE:
<223> OTHER INFORMATION: anti-CD3 OPT1a3b2b1-VH

<400> SEQUENCE: 14

Glu Val Gln Leu Val Glu Ser Gly Gly Gly Leu Val Lys Pro Gly Gly
1               5                   10                  15
```

```
Ser Leu Lys Leu Ser Cys Ala Ala Ser Gly Phe Thr Phe Ser Thr Tyr
            20                  25                  30

Ala Met Asn Trp Val Arg Gln Ala Pro Gly Lys Gly Leu Glu Trp Val
        35                  40                  45

Ala Arg Ile Arg Ser Lys Tyr Asn Asn Tyr Ala Thr Thr Tyr Ala Asp
    50                  55                  60

Ser Val Lys Asp Arg Phe Thr Ile Ser Arg Asp Asp Ser Lys Asn Thr
65                  70                  75                  80

Ala Tyr Leu Gln Met Asn Asn Leu Arg Thr Glu Asp Thr Ala Val Tyr
                85                  90                  95

Tyr Cys Val Arg His Gly Asn Gly Asn Ser Tyr Ile Ser Tyr Trp
            100                 105                 110

Ala Tyr Trp Gly Gln Gly Thr Thr Val Thr Val Ser Ser
        115                 120                 125

<210> SEQ ID NO 15
<211> LENGTH: 110
<212> TYPE: PRT
<213> ORGANISM: Artificial Sequence
<220> FEATURE:
<223> OTHER INFORMATION: CH2 of human IgG1 heavy chain (with LALA
      mutation)

<400> SEQUENCE: 15

Ala Pro Glu Ala Ala Gly Gly Pro Ser Val Phe Leu Phe Pro Pro Lys
1               5                   10                  15

Pro Lys Asp Thr Leu Met Ile Ser Arg Thr Pro Glu Val Thr Cys Val
            20                  25                  30

Val Val Asp Val Ser His Glu Asp Pro Glu Val Lys Phe Asn Trp Tyr
        35                  40                  45

Val Asp Gly Val Glu Val His Asn Ala Lys Thr Lys Pro Arg Glu Glu
    50                  55                  60

Gln Tyr Asn Ser Thr Tyr Arg Val Val Ser Val Leu Thr Val Leu His
65                  70                  75                  80

Gln Asp Trp Leu Asn Gly Lys Glu Tyr Lys Cys Lys Val Ser Asn Lys
                85                  90                  95

Ala Leu Pro Ala Pro Ile Glu Lys Thr Ile Ser Lys Ala Lys
            100                 105                 110

<210> SEQ ID NO 16
<211> LENGTH: 114
<212> TYPE: PRT
<213> ORGANISM: Artificial Sequence
<220> FEATURE:
<223> OTHER INFORMATION: Clone 40-VH

<400> SEQUENCE: 16

Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Ser Pro Ala Gly Ser Ala Tyr Tyr Ala Ser Trp Ala
    50                  55                  60

Lys Gly Arg Phe Thr Ile Ser Lys Thr Ser Ser Ala Thr Val Asp Leu
65                  70                  75                  80

Lys Met Thr Ser Leu Thr Thr Ala Asp Thr Ala Thr Tyr Phe Cys Ala
```

-continued

```
                85                  90                  95
Gly Gly Gly Gly Met Asp Pro Trp Gly Pro Gly Thr Leu Val Thr Val
            100                 105                 110
Ser Ser

<210> SEQ ID NO 17
<211> LENGTH: 109
<212> TYPE: PRT
<213> ORGANISM: Artificial Sequence
<220> FEATURE:
<223> OTHER INFORMATION: Clone 40-VL

<400> SEQUENCE: 17

Asp Pro Val Leu Thr Gln Thr Pro Ser Ser Val Ser Ala Ala Val Gly
1               5                   10                  15

Gly Thr Val Ser Ile Ser Cys Gln Ser Ser Gln Ser Ile Val Lys Asn
            20                  25                  30

Tyr Leu Ser Trp Phe Gln Gln Lys Pro Gly Gln Pro Pro Lys Arg Leu
        35                  40                  45

Ile Tyr Lys Ala Ser Thr Leu Pro Ser Gly Val Pro Ser Arg Phe Lys
    50                  55                  60

Gly Ser Gly Ser Gly Thr Glu Phe Thr Leu Thr Ile Ser Asp Leu Glu
65                  70                  75                  80

Cys Asp Asp Ala Ala Thr Tyr Tyr Cys Ala Ala Ser Tyr Ser Asp Asn
                85                  90                  95

Ile Tyr Val Phe Gly Gly Gly Thr Glu Val Val Val Lys
            100                 105

<210> SEQ ID NO 18
<211> LENGTH: 114
<212> TYPE: PRT
<213> ORGANISM: Artificial Sequence
<220> FEATURE:
<223> OTHER INFORMATION: VH2

<400> SEQUENCE: 18

Gln Cys Gln Ser Val Glu Glu Ser Gly Gly Leu Val Gln Pro Gly
1               5                   10                  15

Gly Ser Leu Arg Leu Ser Cys Ala Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Ser Pro Ala Gly Ser Ala Tyr Tyr Ala Ser Trp Ala
    50                  55                  60

Lys Gly Arg Phe Thr Ile Ser Lys Thr Asn Ser Ala Thr Val Tyr Leu
65                  70                  75                  80

Gln Met Asn Ser Leu Arg Ala Glu Asp Thr Ala Thr Tyr Phe Cys Ala
                85                  90                  95

Gly Gly Gly Gly Met Asp Pro Trp Gly Gln Gly Thr Leu Val Thr Val
            100                 105                 110

Ser Ser

<210> SEQ ID NO 19
<211> LENGTH: 114
<212> TYPE: PRT
<213> ORGANISM: Artificial Sequence
<220> FEATURE:
<223> OTHER INFORMATION: VH3
```

```
<400> SEQUENCE: 19

Gln Cys Gln Ser Val Glu Glu Ser Gly Gly Leu Val Gln Pro Gly
1               5                   10                  15

Gly Ser Leu Arg Leu Ser Cys Thr Val Ser Gly Phe Ser Leu Ser Thr
            20                  25                  30

Tyr Trp Met Thr Trp Val Arg Gln Ala Pro Gly Lys Gly Leu Glu Trp
            35                  40                  45

Ile Gly Ile Ile Ser Pro Ala Gly Ser Ala Tyr Tyr Ala Ser Trp Ala
50                  55                  60

Lys Gly Arg Phe Thr Ile Ser Lys Thr Asn Ser Ala Thr Val Tyr Leu
65                  70                  75                  80

Gln Met Asn Ser Leu Arg Ala Glu Asp Thr Ala Thr Tyr Phe Cys Ala
                85                  90                  95

Gly Gly Gly Gly Met Asp Pro Trp Gly Gln Gly Thr Leu Val Thr Val
            100                 105                 110

Ser Ser

<210> SEQ ID NO 20
<211> LENGTH: 109
<212> TYPE: PRT
<213> ORGANISM: Artificial Sequence
<220> FEATURE:
<223> OTHER INFORMATION: VL2

<400> SEQUENCE: 20

Asp Pro Val Leu Thr Gln Ser Pro Ser Ala Met Ser Ala Ser Val Gly
1               5                   10                  15

Asp Arg Val Thr Ile Thr Cys Gln Ser Ser Gln Ser Ile Val Lys Asn
            20                  25                  30

Tyr Leu Ser Trp Phe Gln Gln Lys Pro Gly Lys Pro Pro Lys Arg Leu
            35                  40                  45

Ile Tyr Lys Ala Ser Thr Leu Pro Ser Gly Val Pro Ser Arg Phe Ser
50                  55                  60

Gly Ser Gly Ser Gly Thr Glu Phe Thr Leu Thr Ile Ser Ser Leu Gln
65                  70                  75                  80

Pro Glu Asp Phe Ala Thr Tyr Tyr Cys Ala Ala Ser Tyr Ser Asp Asn
                85                  90                  95

Ile Tyr Val Phe Gly Gly Gly Thr Lys Val Glu Ile Lys
            100                 105

<210> SEQ ID NO 21
<211> LENGTH: 6
<212> TYPE: PRT
<213> ORGANISM: Artificial Sequence
<220> FEATURE:
<223> OTHER INFORMATION: HCDR1

<400> SEQUENCE: 21

Ser Thr Tyr Asn Met Gly
1               5

<210> SEQ ID NO 22
<211> LENGTH: 17
<212> TYPE: PRT
<213> ORGANISM: Artificial Sequence
<220> FEATURE:
<223> OTHER INFORMATION: HCDR2

<400> SEQUENCE: 22
```

```
Thr Ile Ser Ser Ser Thr Gly Asn Thr Tyr Tyr Ala Thr Trp Ala Lys
1               5                   10                  15

Gly

<210> SEQ ID NO 23
<211> LENGTH: 7
<212> TYPE: PRT
<213> ORGANISM: Artificial Sequence
<220> FEATURE:
<223> OTHER INFORMATION: HCDR3

<400> SEQUENCE: 23

Val Asn Asn Met Gly Asp Ile
1               5

<210> SEQ ID NO 24
<211> LENGTH: 13
<212> TYPE: PRT
<213> ORGANISM: Artificial Sequence
<220> FEATURE:
<223> OTHER INFORMATION: LCDR1

<400> SEQUENCE: 24

Gln Ala Ser Glu Ser Val Tyr Lys Asp Asn Arg Leu Ala
1               5                   10

<210> SEQ ID NO 25
<211> LENGTH: 7
<212> TYPE: PRT
<213> ORGANISM: Artificial Sequence
<220> FEATURE:
<223> OTHER INFORMATION: LCDR2

<400> SEQUENCE: 25

Leu Ala Ser Thr Leu Ala Ser
1               5

<210> SEQ ID NO 26
<211> LENGTH: 12
<212> TYPE: PRT
<213> ORGANISM: Artificial Sequence
<220> FEATURE:
<223> OTHER INFORMATION: LCDR3

<400> SEQUENCE: 26

Gly Gly Tyr Lys Asp Ser Leu Phe Asp Gly Phe Pro
1               5                   10

<210> SEQ ID NO 27
<211> LENGTH: 116
<212> TYPE: PRT
<213> ORGANISM: Artificial Sequence
<220> FEATURE:
<223> OTHER INFORMATION: Clone 2-VH

<400> SEQUENCE: 27

Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
                20                  25                  30

Tyr Asn Met Gly Trp Ile Arg Gln Ala Pro Gly Glu Gly Leu Glu Tyr
            35                  40                  45

Ile Gly Thr Ile Ser Ser Ser Thr Gly Asn Thr Tyr Tyr Ala Thr Trp
        50                  55                  60
```

```
Ala Lys Gly Arg Phe Thr Ile Ser Lys Thr Ser Thr Thr Val Asp
 65                  70                  75                  80

Leu Lys Ile Thr Asn Leu Thr Glu Asp Thr Ala Thr Tyr Phe Cys
                 85                  90                  95

Val Arg Val Asn Asn Met Gly Asp Ile Trp Gly Pro Gly Thr Leu Val
            100                 105                 110

Thr Val Ser Leu
        115

<210> SEQ ID NO 28
<211> LENGTH: 112
<212> TYPE: PRT
<213> ORGANISM: Artificial Sequence
<220> FEATURE:
<223> OTHER INFORMATION: Clone 2- VL

<400> SEQUENCE: 28

Ala Ile Val Met Thr Gln Thr Pro Ser Ser Lys Ser Val Ala Val Gly
 1               5                  10                  15

Asp Thr Val Thr Ile Asn Cys Gln Ala Ser Glu Ser Val Tyr Lys Asp
             20                  25                  30

Asn Arg Leu Ala Trp Phe Gln Gln Lys Pro Gly Gln Ala Pro Lys Leu
         35                  40                  45

Leu Ile Tyr Leu Ala Ser Thr Leu Ala Ser Gly Val Pro Ser Arg Phe
 50                  55                  60

Lys Gly Ser Gly Ser Gly Thr Glu Phe Thr Leu Thr Ile Ser Asp Val
 65                  70                  75                  80

Val Cys Asp Asp Ala Ala Thr Tyr Tyr Cys Gly Gly Tyr Lys Asp Ser
                 85                  90                  95

Leu Phe Asp Gly Phe Pro Phe Gly Gly Gly Thr Glu Val Val Lys
            100                 105                 110

<210> SEQ ID NO 29
<211> LENGTH: 21
<212> TYPE: PRT
<213> ORGANISM: Homo sapiens

<400> SEQUENCE: 29

Met Ala Leu Pro Val Thr Ala Leu Leu Leu Pro Leu Ala Leu Leu Leu
 1               5                  10                  15

His Ala Ala Arg Pro
            20

<210> SEQ ID NO 30
<211> LENGTH: 47
<212> TYPE: PRT
<213> ORGANISM: Artificial Sequence
<220> FEATURE:
<223> OTHER INFORMATION: CD8 hinge

<400> SEQUENCE: 30

Thr Thr Thr Pro Ala Pro Arg Pro Pro Thr Pro Ala Pro Thr Ile Ala
 1               5                  10                  15

Ser Gln Pro Leu Ser Leu Arg Pro Glu Ala Cys Arg Pro Ala Ala Gly
             20                  25                  30

Gly Ala Val His Thr Arg Gly Leu Asp Phe Ala Cys Asp Ile Tyr
         35                  40                  45

<210> SEQ ID NO 31
<211> LENGTH: 22
```

```
<212> TYPE: PRT
<213> ORGANISM: Homo sapiens

<400> SEQUENCE: 31

Ile Trp Ala Pro Leu Ala Gly Thr Cys Gly Val Leu Leu Leu Ser Leu
1               5                   10                  15

Val Ile Thr Leu Tyr Cys
            20

<210> SEQ ID NO 32
<211> LENGTH: 42
<212> TYPE: PRT
<213> ORGANISM: Homo sapiens

<400> SEQUENCE: 32

Lys Arg Gly Arg Lys Lys Leu Leu Tyr Ile Phe Lys Gln Pro Phe Met
1               5                   10                  15

Arg Pro Val Gln Thr Thr Gln Glu Glu Asp Gly Cys Ser Cys Arg Phe
            20                  25                  30

Pro Glu Glu Glu Glu Gly Gly Cys Glu Leu
            35                  40

<210> SEQ ID NO 33
<211> LENGTH: 112
<212> TYPE: PRT
<213> ORGANISM: Homo sapiens

<400> SEQUENCE: 33

Arg Val Lys Phe Ser Arg Ser Ala Asp Ala Pro Ala Tyr Lys Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
    50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110

<210> SEQ ID NO 34
<211> LENGTH: 22
<212> TYPE: PRT
<213> ORGANISM: Artificial Sequence
<220> FEATURE:
<223> OTHER INFORMATION: P2A

<400> SEQUENCE: 34

Gly Ser Gly Ala Thr Asn Phe Ser Leu Leu Lys Gln Ala Gly Asp Val
1               5                   10                  15

Glu Glu Asn Pro Gly Pro
            20

<210> SEQ ID NO 35
<211> LENGTH: 386
<212> TYPE: PRT
<213> ORGANISM: Homo sapiens
```

<400> SEQUENCE: 35

```
Leu Leu Leu Val Thr Ser Leu Leu Cys Glu Leu Pro His Pro Ala
1               5                   10                  15

Phe Leu Leu Ile Pro Ala Cys Gly Ala Asp Ser Tyr Glu Met Glu
            20                  25                  30

Asp Gly Val Arg Lys Cys Lys Cys Glu Gly Pro Cys Arg Lys Val
        35                  40                  45

Cys Asn Gly Ile Gly Ile Gly Glu Phe Lys Asp Ser Leu Ser Ile Asn
    50                  55                  60

Ala Thr Asn Ile Lys His Phe Lys Asn Cys Thr Ser Ile Ser Gly Asp
65                  70                  75                  80

Leu His Ile Leu Pro Val Ala Phe Arg Gly Asp Ser Phe Thr His Thr
                85                  90                  95

Pro Pro Leu Asp Pro Gln Glu Leu Asp Ile Leu Lys Thr Val Lys Glu
            100                 105                 110

Ile Thr Gly Phe Leu Leu Ile Gln Ala Trp Pro Glu Asn Arg Thr Asp
            115                 120                 125

Leu His Ala Phe Glu Asn Leu Glu Ile Ile Arg Gly Arg Thr Lys Gln
130                 135                 140

His Gly Gln Phe Ser Leu Ala Val Val Ser Leu Asn Ile Thr Ser Leu
145                 150                 155                 160

Gly Leu Arg Ser Leu Lys Glu Ile Ser Asp Gly Asp Val Ile Ile Ser
                165                 170                 175

Gly Asn Lys Asn Leu Cys Tyr Ala Asn Thr Ile Asn Trp Lys Lys Leu
            180                 185                 190

Phe Gly Thr Ser Gly Gln Lys Thr Lys Ile Ile Ser Asn Arg Gly Glu
            195                 200                 205

Asn Ser Cys Lys Ala Thr Gly Gln Val Cys His Ala Leu Cys Ser Pro
210                 215                 220

Glu Gly Cys Trp Gly Pro Glu Pro Arg Asp Cys Val Ser Cys Arg Asn
225                 230                 235                 240

Val Ser Arg Gly Arg Glu Cys Val Asp Lys Cys Asn Leu Leu Glu Gly
                245                 250                 255

Glu Pro Arg Glu Phe Val Glu Asn Ser Glu Cys Ile Gln Cys His Pro
            260                 265                 270

Glu Cys Leu Pro Gln Ala Met Asn Ile Thr Cys Thr Gly Arg Gly Pro
            275                 280                 285

Asp Asn Cys Ile Gln Cys Ala His Tyr Ile Asp Gly Pro His Cys Val
290                 295                 300

Lys Thr Cys Pro Ala Gly Val Met Gly Glu Asn Asn Thr Leu Val Trp
305                 310                 315                 320

Lys Tyr Ala Asp Ala Gly His Val Cys His Leu Cys His Pro Asn Cys
                325                 330                 335

Thr Tyr Gly Cys Thr Gly Pro Gly Leu Glu Gly Cys Pro Thr Asn Gly
            340                 345                 350

Pro Lys Ile Pro Ser Ile Ala Thr Gly Met Val Gly Ala Leu Leu Leu
            355                 360                 365

Leu Leu Val Val Ala Leu Gly Ile Gly Leu Phe Met Arg Arg Arg His
370                 375                 380

Ile Val
385
```

<210> SEQ ID NO 36

```
<211> LENGTH: 507
<212> TYPE: PRT
<213> ORGANISM: Artificial Sequence
<220> FEATURE:
<223> OTHER INFORMATION: GC33 CAR

<400> SEQUENCE: 36

Asp Val Val Met Thr Gln Ser Pro Leu Ser Leu Pro Val Thr Pro Gly
1               5                   10                  15

Glu Pro Ala Ser Ile Ser Cys Arg Ser Ser Gln Ser Leu Val His Ser
                20                  25                  30

Asn Ala Asn Thr Tyr Leu His Trp Tyr Leu Gln Lys Pro Gly Gln Ser
            35                  40                  45

Pro Gln Leu Leu Ile Tyr Lys Val Ser Asn Arg Phe Ser Gly Val Pro
        50                  55                  60

Asp Arg Phe Ser Gly Ser Gly Ser Gly Thr Asp Phe Thr Leu Lys Ile
65                  70                  75                  80

Ser Arg Val Glu Ala Glu Asp Val Gly Val Tyr Tyr Cys Ser Gln Asn
                85                  90                  95

Thr His Val Pro Pro Thr Phe Gly Gln Gly Thr Lys Leu Glu Ile Lys
            100                 105                 110

Arg Gly Gly Gly Gly Ser Gly Gly Gly Gly Ser Gly Gly Gly Gly Ser
        115                 120                 125

Gln Val Gln Leu Val Gln Ser Gly Ala Glu Val Lys Lys Pro Gly Ala
130                 135                 140

Ser Val Lys Val Ser Cys Lys Ala Ser Gly Tyr Thr Phe Thr Asp Tyr
145                 150                 155                 160

Glu Met His Trp Val Arg Gln Ala Pro Gly Gln Gly Leu Glu Trp Met
                165                 170                 175

Gly Ala Leu Asp Pro Lys Thr Gly Asp Thr Ala Tyr Ser Gln Lys Phe
            180                 185                 190

Lys Gly Arg Val Thr Leu Thr Ala Asp Glu Ser Thr Ser Thr Ala Tyr
        195                 200                 205

Met Glu Leu Ser Ser Leu Arg Ser Glu Asp Thr Ala Val Tyr Tyr Cys
210                 215                 220

Thr Arg Phe Tyr Ser Tyr Thr Tyr Trp Gly Gln Gly Thr Leu Val Thr
225                 230                 235                 240

Val Ser Ser Thr Thr Thr Pro Ala Pro Arg Pro Pro Thr Pro Ala Pro
                245                 250                 255

Thr Ile Ala Ser Gln Pro Leu Ser Leu Arg Pro Glu Ala Cys Arg Pro
            260                 265                 270

Ala Ala Gly Gly Ala Val His Thr Arg Gly Leu Asp Phe Ala Cys Asp
        275                 280                 285

Ile Tyr Ile Trp Ala Pro Leu Ala Gly Thr Cys Gly Val Leu Leu Leu
290                 295                 300

Ser Leu Val Ile Thr Leu Tyr Cys Arg Ser Lys Arg Ser Arg Leu Leu
305                 310                 315                 320

His Ser Asp Tyr Met Asn Met Thr Pro Arg Arg Pro Gly Pro Thr Arg
                325                 330                 335

Lys His Tyr Gln Pro Tyr Ala Pro Pro Arg Asp Phe Ala Ala Tyr Arg
            340                 345                 350

Ser Lys Arg Gly Arg Lys Lys Leu Leu Tyr Ile Phe Lys Gln Pro Phe
        355                 360                 365

Met Arg Pro Val Gln Thr Thr Gln Glu Glu Asp Gly Cys Ser Cys Arg
370                 375                 380
```

```
Phe Pro Glu Glu Glu Gly Gly Cys Glu Leu Arg Val Lys Phe Ser
385                 390                 395                 400

Arg Ser Ala Asp Ala Pro Ala Tyr Lys Gln Gly Gln Asn Gln Leu Tyr
            405                 410                 415

Asn Glu Leu Asn Leu Gly Arg Arg Glu Glu Tyr Asp Val Leu Asp Lys
        420                 425                 430

Arg Arg Gly Arg Asp Pro Glu Met Gly Gly Lys Pro Arg Arg Lys Asn
    435                 440                 445

Pro Gln Glu Gly Leu Tyr Asn Glu Leu Gln Lys Asp Lys Met Ala Glu
450                 455                 460

Ala Tyr Ser Glu Ile Gly Met Lys Gly Glu Arg Arg Arg Gly Lys Gly
465                 470                 475                 480

His Asp Gly Leu Tyr Gln Gly Leu Ser Thr Ala Thr Lys Asp Thr Tyr
            485                 490                 495

Asp Ala Leu His Met Gln Ala Leu Pro Pro Arg
        500                 505

<210> SEQ ID NO 37
<211> LENGTH: 117
<212> TYPE: PRT
<213> ORGANISM: Artificial Sequence
<220> FEATURE:
<223> OTHER INFORMATION: Clone 17-VH

<400> SEQUENCE: 37

Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
            20                  25                  30

Tyr Asp Met Ser Trp Val Arg Gln Ala Pro Gly Lys Gly Leu Glu Tyr
        35                  40                  45

Ile Gly Trp Ile Asn Ser Gly Gly Ser Pro Tyr Tyr Ala Arg Trp Ala
    50                  55                  60

Lys Gly Arg Phe Thr Ile Ser Lys Thr Ser Thr Thr Val Asp Leu
65                  70                  75                  80

Lys Met Thr Ser Pro Thr Thr Glu Asp Thr Ala Thr Tyr Phe Cys Ala
            85                  90                  95

Arg His Arg Ser Gly Tyr Tyr Gly Asp Ile Trp Gly Pro Gly Thr Leu
        100                 105                 110

Val Thr Val Ser Leu
    115

<210> SEQ ID NO 38
<211> LENGTH: 110
<212> TYPE: PRT
<213> ORGANISM: Artificial Sequence
<220> FEATURE:
<223> OTHER INFORMATION: Clone 17-VL

<400> SEQUENCE: 38

Asp Pro Val Leu Thr Gln Thr Pro Ser Val Ser Ala Ala Val Gly
1               5                   10                  15

Asp Thr Val Ser Ile Asn Cys Gln Ser Ser Gln Asn Val Tyr Lys Asn
            20                  25                  30

Arg Leu Ala Trp Tyr Gln Gln Lys Pro Gly Gln Pro Pro Lys Leu Leu
        35                  40                  45

Ile Tyr Gly Ala Ser Thr Leu Ala Ser Gly Val Pro Ser Arg Phe Lys
```

```
                    50                  55                  60
Gly Ser Gly Ser Gly Thr Gln Phe Thr Leu Thr Ile Ser Asp Leu Glu
 65                  70                  75                  80

Cys Asp Asp Ala Ala Thr Tyr Tyr Cys Ala Gly Gly Tyr Ser Thr Ile
                     85                  90                  95

Val Asp Asn Thr Phe Gly Gly Gly Thr Glu Val Val Val Lys
                    100                 105                 110
```

<210> SEQ ID NO 39
<211> LENGTH: 114
<212> TYPE: PRT
<213> ORGANISM: Artificial Sequence
<223> OTHER INFORMATION: Clone 23-VH

<400> SEQUENCE: 39

```
Gln Cys Gln Ser Val Glu Glu Ser Gly Gly Arg Leu Val Thr Pro Gly
 1               5                  10                  15

Thr Ala Leu Thr Leu Thr Cys Thr Val Ser Gly Phe Ser Leu Ser Thr
                    20                  25                  30

Tyr Trp Met Thr Trp Val Arg Gln Ala Pro Gly Lys Gly Leu Glu Trp
                    35                  40                  45

Ile Gly Ile Ile Asn Pro Gly Gly Ser Ala Tyr Tyr Ala Ser Trp Ala
                    50                  55                  60

Lys Gly Arg Phe Thr Ile Ser Lys Thr Ser Ala Thr Val Asp Leu
 65                  70                  75                  80

Lys Met Thr Ser Leu Thr Ala Ala Asp Thr Ala Thr Tyr Phe Cys Ala
                     85                  90                  95

Gly Gly Gly Gly Met Asp Pro Trp Gly Pro Gly Thr Leu Val Thr Val
                    100                 105                 110

Ser Ser
```

<210> SEQ ID NO 40
<211> LENGTH: 109
<212> TYPE: PRT
<213> ORGANISM: Artificial Sequence
<220> FEATURE:
<223> OTHER INFORMATION: Clone 23-VL

<400> SEQUENCE: 40

```
Asp Pro Val Leu Thr Gln Thr Pro Ser Ser Val Ser Ala Ala Val Gly
 1               5                  10                  15

Gly Thr Val Ser Ile Ser Cys Gln Ser Ser Gln Ser Ile Ile Lys Asn
                    20                  25                  30

Tyr Leu Ser Trp Phe Gln His Lys Pro Gly Gln Pro Pro Lys Arg Leu
                    35                  40                  45

Ile Tyr Arg Ala Ser Thr Leu Pro Ser Gly Val Pro Ser Arg Phe Glu
                    50                  55                  60

Gly Ser Gly Ser Gly Thr Glu Phe Thr Leu Thr Ile Ser Asp Leu Glu
 65                  70                  75                  80

Cys Asp Asp Ala Ala Thr Tyr Tyr Cys Ala Ala Ser Tyr Ser Asp Asn
                     85                  90                  95

Ile Tyr Val Phe Gly Gly Gly Thr Glu Val Val Val Lys
                    100                 105
```

<210> SEQ ID NO 41
<211> LENGTH: 114
<212> TYPE: PRT
<213> ORGANISM: Artificial Sequence
<220> FEATURE:
<223> OTHER INFORMATION: Clone 41-VH

<400> SEQUENCE: 41

His Cys Gln Ser Val Glu Glu Ser Gly Gly Arg Leu Val Thr Pro Gly
1               5                   10                  15

Thr Ala Leu Thr Leu Thr Cys Thr Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Asn Pro Gly Gly Ser Ala Tyr Tyr Ala Ser Trp Ala
    50                  55                  60

Lys Gly Arg Phe Thr Ile Ser Lys Ala Ser Ala Thr Val Asp Leu
65                  70                  75                  80

Lys Met Thr Ser Leu Thr Ala Ala Asp Thr Ala Thr Tyr Phe Cys Ala
                85                  90                  95

Gly Gly Gly Gly Met Asp Pro Trp Gly Pro Gly Thr Leu Val Thr Val
            100                 105                 110

Ser Ser

<210> SEQ ID NO 42
<211> LENGTH: 109
<212> TYPE: PRT
<213> ORGANISM: Artificial Sequence
<220> FEATURE:
<223> OTHER INFORMATION: Clone 41-VL

<400> SEQUENCE: 42

Asp Pro Val Leu Thr Gln Thr Pro Ser Ser Val Ser Ala Ala Val Gly
1               5                   10                  15

Gly Thr Val Ser Ile Ser Cys Gln Ser Ser Gln Ser Ile Ile Lys Asn
            20                  25                  30

Tyr Leu Ser Trp Phe Gln His Lys Pro Gly Gln Pro Pro Lys Arg Leu
        35                  40                  45

Ile Tyr Arg Ala Ser Thr Leu Pro Ser Gly Val Pro Ser Arg Phe Glu
    50                  55                  60

Gly Ser Gly Ser Gly Thr Glu Phe Thr Leu Thr Ile Asn Asp Leu Glu
65                  70                  75                  80

Cys Asp Asp Ala Ala Thr Tyr Tyr Cys Ala Ala Ser Tyr Ser Asp Asn
                85                  90                  95

Ile Tyr Val Phe Gly Gly Gly Thr Glu Val Val Val Lys
            100                 105

<210> SEQ ID NO 43
<211> LENGTH: 114
<212> TYPE: PRT
<213> ORGANISM: Artificial Sequence
<220> FEATURE:
<223> OTHER INFORMATION: Clone 8-VH

<400> SEQUENCE: 43

Gln Cys Gln Ser Val Glu Glu Ser Gly Gly Arg Leu Val Thr Pro Gly
1               5                   10                  15

Thr Ala Leu Thr Leu Thr Cys Thr Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Asn Pro Gly Gly Ser Ala Tyr Tyr Ala Ser Trp Ala

```
                    50                  55                  60
Lys Gly Arg Phe Thr Ile Ser Lys Thr Ser Ser Ala Thr Val Asp Leu
 65                  70                  75                  80

Lys Met Thr Ser Leu Thr Ala Ala Asp Thr Ala Thr Tyr Phe Cys Ala
                 85                  90                  95

Gly Gly Gly Gly Met Asp Pro Trp Gly Pro Gly Thr Leu Val Thr Val
            100                 105                 110

Ser Ser

<210> SEQ ID NO 44
<211> LENGTH: 109
<212> TYPE: PRT
<213> ORGANISM: Artificial Sequence
<220> FEATURE:
<223> OTHER INFORMATION: Clone 8-VL

<400> SEQUENCE: 44

Asp Pro Val Leu Thr Gln Thr Pro Ser Ser Val Ser Ala Ala Val Gly
 1               5                  10                  15

Gly Thr Val Ser Ile Ser Cys Gln Ser Ser Gln Ser Ile Ile Lys Asn
                20                  25                  30

Tyr Leu Ser Trp Phe Gln His Lys Pro Gly Gln Pro Pro Lys Arg Leu
             35                  40                  45

Ile Tyr Arg Ala Ser Thr Leu Pro Ser Gly Val Pro Ser Arg Phe Glu
 50                  55                  60

Gly Ser Gly Ser Gly Thr Glu Phe Thr Leu Thr Ile Ser Asp Leu Glu
 65                  70                  75                  80

Cys Asp Asp Ala Ala Thr Tyr Tyr Cys Ala Ala Ser Tyr Ser Asp Asn
                 85                  90                  95

Ile Tyr Val Phe Gly Gly Gly Thr Glu Val Val Val Lys
            100                 105

<210> SEQ ID NO 45
<211> LENGTH: 114
<212> TYPE: PRT
<213> ORGANISM: Artificial Sequence
<220> FEATURE:
<223> OTHER INFORMATION: Clone 12-VH

<400> SEQUENCE: 45

Gln Cys Gln Ser Val Glu Glu Ser Gly Gly Arg Leu Val Thr Pro Gly
 1               5                  10                  15

Thr Pro Leu Thr Leu Thr Cys Thr Val Ser Gly Phe Ser Leu Ser Thr
                20                  25                  30

Tyr Trp Met Thr Trp Val Arg Gln Ala Pro Gly Lys Gly Leu Glu Trp
             35                  40                  45

Ile Gly Ile Ile Asn Pro Ser Gly Ser Ala Phe Tyr Ala Ser Trp Ala
 50                  55                  60

Lys Gly Arg Phe Thr Ile Ser Lys Thr Ser Ser Ala Thr Val Asp Leu
 65                  70                  75                  80

Lys Met Thr Ser Leu Thr Ala Ala Asp Thr Ala Thr Tyr Phe Cys Ala
                 85                  90                  95

Gly Gly Gly Gly Met Asp Pro Trp Gly Pro Gly Thr Leu Val Thr Val
            100                 105                 110

Ser Ser

<210> SEQ ID NO 46
```

<211> LENGTH: 109
<212> TYPE: PRT
<213> ORGANISM: Artificial Sequence
<220> FEATURE:
<223> OTHER INFORMATION: Clone 12-VL

<400> SEQUENCE: 46

```
Asp Pro Val Leu Thr Gln Thr Pro Ser Ser Val Ser Ala Ala Val Gly
1               5                   10                  15

Gly Thr Val Ser Ile Ser Cys Gln Ser Ser Gln Ser Ile Val Lys Asn
            20                  25                  30

Tyr Leu Ser Trp Phe Gln Gln Lys Pro Gly Gln Pro Pro Lys Arg Leu
        35                  40                  45

Ile Tyr Lys Ala Ser Thr Leu Pro Ser Gly Val Pro Ser Arg Phe Lys
50                  55                  60

Gly Ser Gly Ser Gly Thr Glu Phe Thr Leu Thr Ile Ser Asp Leu Glu
65                  70                  75                  80

Cys Asp Asp Ala Ala Thr Tyr Tyr Cys Ala Ala Ser Tyr Ser Asp Asn
                85                  90                  95

Ile Tyr Val Phe Gly Gly Gly Thr Glu Val Val Val Lys
            100                 105
```

<210> SEQ ID NO 47
<211> LENGTH: 114
<212> TYPE: PRT
<213> ORGANISM: Artificial Sequence
<220> FEATURE:
<223> OTHER INFORMATION: Clone 22-VH

<400> SEQUENCE: 47

```
Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
            20                  25                  30

Tyr Trp Met Thr Trp Val Arg Gln Ala Pro Gly Lys Gly Leu Glu Trp
        35                  40                  45

Ile Gly Ile Ile Asn Pro Thr Gly Arg Ala Tyr Tyr Ala Ser Trp Ala
50                  55                  60

Lys Gly Arg Phe Thr Ile Ser Lys Thr Ser Ala Thr Val Asp Leu
65                  70                  75                  80

Lys Met Thr Ser Leu Thr Ala Ala Asp Thr Ala Thr Tyr Phe Cys Ala
                85                  90                  95

Gly Gly Gly Gly Met Asp Pro Trp Gly Pro Gly Thr Leu Val Thr Val
            100                 105                 110

Ser Ser
```

<210> SEQ ID NO 48
<211> LENGTH: 109
<212> TYPE: PRT
<213> ORGANISM: Artificial Sequence
<220> FEATURE:
<223> OTHER INFORMATION: Clone 22-VL

<400> SEQUENCE: 48

```
Asp Pro Val Leu Thr Gln Thr Pro Ser Ser Val Ser Ala Ala Val Gly
1               5                   10                  15

Gly Thr Val Thr Ile Asn Cys Gln Ser Ser Gln Ser Val Tyr Ser Asn
            20                  25                  30

Tyr Leu Ser Trp Phe Gln Lys Lys Pro Gly Gln Pro Pro Lys Arg Leu
```

```
                35                  40                  45
Ile Tyr Lys Ala Ser Thr Leu Val Ser Gly Val Pro Ser Arg Phe Val
    50                  55                  60
Gly Ser Gly Ser Gly Thr Glu Phe Thr Leu Thr Ile Ser Asp Leu Glu
65                  70                  75                  80
Cys Asp Asp Ala Ala Thr Tyr Tyr Cys Ala Ala Ser Tyr Ser Gly Asn
                85                  90                  95
Ile Tyr Val Phe Gly Gly Gly Thr Glu Val Val Val Lys
                100                 105
```

<210> SEQ ID NO 49
<211> LENGTH: 114
<212> TYPE: PRT
<213> ORGANISM: Artificial Sequence
<220> FEATURE:
<223> OTHER INFORMATION: Clone 49-VH

<400> SEQUENCE: 49

```
Gln Cys Gln Ser Val Glu Glu Ser Gly Gly Arg Leu Val Thr Pro Gly
1               5                   10                  15
Thr Pro Leu Thr Leu Thr Cys Thr Val Ser Gly Phe Ser Leu Ser Thr
                20                  25                  30
Tyr Trp Met Thr Trp Val Arg Gln Ala Pro Gly Lys Gly Leu Glu Trp
            35                  40                  45
Ile Gly Ile Ile Asn Pro Ser Gly Ser Ala Tyr Tyr Ala Ser Trp Ala
    50                  55                  60
Lys Gly Arg Phe Thr Ile Ser Lys Thr Ser Ala Thr Val Asp Leu
65                  70                  75                  80
Lys Met Thr Ser Leu Thr Ala Ala Asp Thr Ala Thr Tyr Phe Cys Ala
                85                  90                  95
Gly Gly Gly Gly Met Asp Pro Trp Gly Pro Gly Thr Leu Val Thr Val
                100                 105                 110
Ser Ser
```

<210> SEQ ID NO 50
<211> LENGTH: 109
<212> TYPE: PRT
<213> ORGANISM: Artificial Sequence
<220> FEATURE:
<223> OTHER INFORMATION: Clone 49-VL

<400> SEQUENCE: 50

```
Asp Pro Val Leu Thr Gln Thr Pro Ser Ser Val Ser Ala Ala Val Gly
1               5                   10                  15
Gly Thr Val Ser Ile Ser Cys Gln Ser Ser Gln Ser Ile Val Lys Asn
                20                  25                  30
Tyr Leu Ser Trp Phe Gln Gln Lys Pro Gly Gln Pro Pro Lys Arg Leu
            35                  40                  45
Ile Tyr Lys Ala Ser Thr Leu Pro Ser Gly Val Pro Ser Arg Phe Lys
    50                  55                  60
Gly Ser Gly Ser Gly Thr Glu Phe Thr Leu Thr Ile Ser Asp Leu Glu
65                  70                  75                  80
Cys Asp Asp Ala Ala Thr Tyr Tyr Cys Ala Ala Ser Tyr Ser Asp Asn
                85                  90                  95
Ile Tyr Val Phe Gly Gly Gly Thr Glu Val Val Val Lys
                100                 105
```

```
<210> SEQ ID NO 51
<211> LENGTH: 117
<212> TYPE: PRT
<213> ORGANISM: Artificial Sequence
<220> FEATURE:
<223> OTHER INFORMATION: Clone 74-VH

<400> SEQUENCE: 51

Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Asn Asn
            20                  25                  30

Tyr Asp Met Ser Trp Val Arg Gln Ala Pro Gly Lys Gly Leu Gln Tyr
        35                  40                  45

Ile Gly Trp Ile Asn Ser Gly Gly Thr Ala Tyr Tyr Ala Ser Trp Ala
    50                  55                  60

Lys Gly Arg Phe Thr Ile Ser Lys Thr Ser Ser Thr Thr Val Asp Leu
65                  70                  75                  80

Lys Met Thr Ser Pro Thr Thr Glu Asp Thr Ala Thr Tyr Phe Cys Ala
                85                  90                  95

Arg His Arg Tyr Gly Tyr Tyr Gly Asp Ile Trp Gly Pro Gly Thr Leu
            100                 105                 110

Val Thr Val Ser Leu
        115

<210> SEQ ID NO 52
<211> LENGTH: 111
<212> TYPE: PRT
<213> ORGANISM: Artificial Sequence
<220> FEATURE:
<223> OTHER INFORMATION: Clone 74-VL

<400> SEQUENCE: 52

Asp Pro Val Leu Thr Gln Thr Pro Ser Val Ser Ala Ala Val Gly Gly
1               5                   10                  15

Gly Thr Val Thr Ile Asn Cys Gln Ser Ser Gln Asn Val Tyr Asn Asn
            20                  25                  30

Asn Arg Leu Ala Trp Tyr Gln Gln Lys Leu Gly Gln Pro Pro Lys Leu
        35                  40                  45

Leu Ile Tyr Phe Ala Ser Lys Leu Ala Ser Gly Val Pro Ser Arg Phe
    50                  55                  60

Ser Gly Ser Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Asn Thr
                85                  90                  95

Ile Val Asp Asn Gly Phe Gly Gly Thr Glu Val Val Lys
            100                 105                 110

<210> SEQ ID NO 53
<211> LENGTH: 103
<212> TYPE: PRT
<213> ORGANISM: Artificial Sequence
<220> FEATURE:
<223> OTHER INFORMATION: Clone 109-VH

<400> SEQUENCE: 53

Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Ser Ser
            20                  25                  30
```

Tyr Asp Met Ser Trp Val Arg Gln Ala Pro Gly Lys Gly Leu Gln Tyr
         35                  40                  45

Ile Gly Trp Met Asn Thr Asn Gly Ser Ala Tyr Tyr Ala Thr Trp Ala
 50                  55                  60

Lys Gly Arg Phe Thr Ile Ser Lys Thr Ser Thr Thr Val Asp Leu
65                  70                  75                  80

Lys Met Thr Ser Pro Thr Thr Glu Asp Thr Ala Thr Tyr Phe Cys Ala
             85                  90                  95

Arg His Arg Ser Gly Tyr Tyr
            100

<210> SEQ ID NO 54
<211> LENGTH: 111
<212> TYPE: PRT
<213> ORGANISM: Artificial Sequence
<220> FEATURE:
<223> OTHER INFORMATION: Clone 109-VL

<400> SEQUENCE: 54

Asp Pro Val Leu Thr Gln Thr Pro Ser Ser Val Ser Ala Ala Val Gly
1               5                   10                  15

Gly Thr Val Thr Ile Asn Cys Gln Ser Ser Gln Asn Val Leu Asn Gln
             20                  25                  30

Asn Arg Leu Ala Trp Tyr Gln Gln Lys Pro Gly Gln Pro Pro Lys Leu
         35                  40                  45

Leu Ile Tyr Trp Ala Ser Lys Leu Ala Ser Gly Val Pro Ser Arg Phe
 50                  55                  60

Lys Gly Ser Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Ser Ser
             85                  90                  95

Ile Val Tyr Asn Ala Phe Gly Gly Gly Thr Glu Val Val Val Lys
            100                 105                 110

<210> SEQ ID NO 55
<211> LENGTH: 114
<212> TYPE: PRT
<213> ORGANISM: Artificial Sequence
<220> FEATURE:
<223> OTHER INFORMATION: Clone 121-VH

<400> SEQUENCE: 55

Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
             20                  25                  30

Tyr Trp Met Thr Trp Val Arg Gln Ala Pro Gly Lys Gly Leu Glu Trp
         35                  40                  45

Ile Gly Ile Ile Asn Pro Ala Gly Ser Ala Tyr Tyr Ala Ser Trp Ala
 50                  55                  60

Lys Gly Arg Phe Thr Ile Ser Lys Thr Ser Ala Thr Val Asp Leu
65                  70                  75                  80

Lys Met Thr Ser Leu Thr Ala Val Asp Thr Ala Thr Tyr Phe Cys Ala
             85                  90                  95

Gly Gly Gly Gly Met Asp Pro Trp Gly Pro Gly Thr Leu Val Thr Val
            100                 105                 110

Ser Ser

<210> SEQ ID NO 56
<211> LENGTH: 109
<212> TYPE: PRT
<213> ORGANISM: Artificial Sequence
<220> FEATURE:
<223> OTHER INFORMATION: Clone 121-VL

<400> SEQUENCE: 56

```
Asp Pro Val Leu Thr Gln Thr Pro Ser Ser Val Ser Ala Ala Val Gly
1               5                   10                  15

Gly Thr Val Thr Ile Ser Cys Gln Ser Gln Asn Ile Ile Lys Asp
            20                  25                  30

Tyr Leu Ser Trp Phe Gln Gln Lys Pro Gly Gln Pro Pro Lys Arg Leu
        35                  40                  45

Ile Tyr Lys Thr Ser Thr Leu Pro Ser Gly Val Pro Ser Arg Phe Lys
    50                  55                  60

Gly Ser Gly Ser Gly Thr Glu Phe Thr Leu Thr Ile Ser Asp Leu Glu
65                  70                  75                  80

Cys Asp Asp Ala Ala Thr Tyr Tyr Cys Ala Ala Ser Tyr Ser Gly Asn
                85                  90                  95

Ile Tyr Val Phe Gly Gly Gly Thr Glu Val Val Val Lys
            100                 105
```

<210> SEQ ID NO 57
<211> LENGTH: 117
<212> TYPE: PRT
<213> ORGANISM: Artificial Sequence
<220> FEATURE:
<223> OTHER INFORMATION: Clone 122-VH

<400> SEQUENCE: 57

```
Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Ser Asn
            20                  25                  30

Tyr Asp Met Ser Trp Val Arg Gln Ala Pro Gly Lys Gly Leu Glu Tyr
        35                  40                  45

Ile Gly Trp Ile Asn Thr Gly Gly Ser Val Tyr Tyr Ala Ser Trp Ala
    50                  55                  60

Lys Gly Arg Phe Thr Ile Ser Lys Thr Ser Thr Thr Val Asp Leu
65                  70                  75                  80

Lys Leu Thr Ser Pro Thr Thr Glu Asp Thr Ala Thr Tyr Phe Cys Ala
                85                  90                  95

Arg His Arg Ser Gly Tyr Phe Gly Asp Ile Trp Gly Pro Gly Thr Leu
            100                 105                 110

Val Thr Val Ser Leu
        115
```

<210> SEQ ID NO 58
<211> LENGTH: 111
<212> TYPE: PRT
<213> ORGANISM: Artificial Sequence
<220> FEATURE:
<223> OTHER INFORMATION: Clone 122-VL

<400> SEQUENCE: 58

```
Asp Pro Val Leu Thr Gln Thr Pro Ser Ser Val Ser Ala Ala Val Gly
1               5                   10                  15
```

Gly Thr Val Thr Ile Asn Cys Gln Ser Ser Gln Asn Val Tyr Asn Asn
            20                  25                  30

Asn Arg Leu Ala Trp Tyr Gln Gln Lys Pro Gly Gln Pro Pro Lys Leu
        35                  40                  45

Leu Ile Tyr Phe Ala Ser Lys Leu Ala Ser Gly Val Pro Ser Arg Phe
    50                  55                  60

Lys Gly Asn Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Asn Ser
                85                  90                  95

Ile Val Asp Asn Gly Phe Gly Gly Thr Glu Val Val Glu
            100                 105                 110

<210> SEQ ID NO 59
<211> LENGTH: 117
<212> TYPE: PRT
<213> ORGANISM: Artificial Sequence
<220> FEATURE:
<223> OTHER INFORMATION: Clone 182-VH

<400> SEQUENCE: 59

Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Ser Asn
            20                  25                  30

Tyr Asp Met Ser Trp Val Arg Gln Ala Pro Gly Lys Gly Leu Glu Tyr
        35                  40                  45

Ile Gly Trp Ile Asn Thr Gly Gly Ser Val Tyr Tyr Ala Ser Trp Ala
    50                  55                  60

Lys Gly Arg Phe Thr Ile Ser Lys Thr Ser Thr Thr Val Asp Leu
65                  70                  75                  80

Lys Leu Thr Ser Pro Thr Thr Glu Asp Thr Ala Thr Tyr Phe Cys Ala
                85                  90                  95

Arg His Arg Ser Gly Tyr Phe Gly Asp Ile Trp Gly Pro Gly Thr Leu
            100                 105                 110

Val Thr Val Ser Leu
        115

<210> SEQ ID NO 60
<211> LENGTH: 111
<212> TYPE: PRT
<213> ORGANISM: Artificial Sequence
<220> FEATURE:
<223> OTHER INFORMATION: Clone 182-VL

<400> SEQUENCE: 60

Asp Pro Val Leu Thr Gln Thr Pro Ser Ser Val Ser Ala Ala Val Gly
1               5                   10                  15

Gly Thr Val Thr Ile Asn Cys Gln Ser Ser Gln Asn Val Tyr Asn Asn
            20                  25                  30

Asn Arg Leu Ala Trp Tyr Gln Gln Lys Pro Gly Gln Pro Pro Lys Leu
        35                  40                  45

Leu Ile Tyr Phe Ala Ser Lys Leu Ala Ser Gly Val Pro Ser Arg Phe
    50                  55                  60

Lys Gly Asn Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Asn Ser
                85                  90                  95

Ile Val Asp Asn Gly Phe Gly Ala Gly Thr Glu Val Val Lys
                100                 105                 110

<210> SEQ ID NO 61
<211> LENGTH: 116
<212> TYPE: PRT
<213> ORGANISM: Artificial Sequence
<220> FEATURE:
<223> OTHER INFORMATION: Clone 5-VH

<400> SEQUENCE: 61

Gln Cys Gln Ser Val Glu Glu Ser Gly Gly Arg Leu Val Thr Pro Gly
1               5                   10                  15

Thr Pro Leu Thr Leu Thr Cys Thr Val Ser Gly Phe Ser Leu Ser Thr
                20                  25                  30

Tyr Asn Met Gly Trp Val Arg Gln Ala Pro Gly Glu Gly Leu Glu Tyr
            35                  40                  45

Ile Gly Thr Ile Ser Ser Ser Thr Gly Asn Thr Tyr Tyr Ala Thr Trp
    50                  55                  60

Ala Lys Gly Arg Phe Thr Ile Ser Lys Thr Ser Ser Thr Thr Val Asp
65                  70                  75                  80

Leu Lys Ile Thr Asn Leu Thr Thr Glu Asp Thr Ala Thr Tyr Phe Cys
                85                  90                  95

Val Arg Val Asn Asn Met Gly Asp Ile Trp Gly Pro Gly Thr Leu Val
                100                 105                 110

Thr Val Ser Leu
        115

<210> SEQ ID NO 62
<211> LENGTH: 112
<212> TYPE: PRT
<213> ORGANISM: Artificial Sequence
<220> FEATURE:
<223> OTHER INFORMATION: Clone 5-VL

<400> SEQUENCE: 62

Ala Ile Val Met Thr Gln Thr Pro Ser Ser Lys Ser Val Ala Val Gly
1               5                   10                  15

Asp Thr Val Thr Ile Asn Cys Gln Ala Ser Glu Ser Val Tyr Lys Asp
                20                  25                  30

Asn Arg Leu Ala Trp Phe Gln Gln Lys Pro Gly Gln Pro Pro Lys Leu
            35                  40                  45

Leu Ile Tyr Leu Ala Ser Thr Leu Ala Ser Gly Val Pro Ser Arg Phe
    50                  55                  60

Lys Gly Ser Gly Ser Gly Thr Glu Phe Thr Leu Thr Ile Ser Asp Val
65                  70                  75                  80

Val Cys Asp Asp Ala Ala Thr Tyr Tyr Cys Gly Gly Tyr Lys Asp Ser
                85                  90                  95

Leu Phe Asp Gly Phe Pro Phe Gly Gly Gly Thr Glu Val Val Lys
                100                 105                 110

<210> SEQ ID NO 63
<211> LENGTH: 109
<212> TYPE: PRT
<213> ORGANISM: Artificial Sequence
<220> FEATURE:
<223> OTHER INFORMATION: CL

<400> SEQUENCE: 63

```
Arg Thr Val Ala Ala Pro Ser Val Phe Ile Phe Pro Pro Ser Asp Glu
1               5                   10                  15

Gln Leu Lys Ser Gly Thr Ala Ser Val Val Cys Leu Leu Asn Asn Phe
            20                  25                  30

Tyr Pro Arg Glu Ala Lys Val Gln Trp Lys Val Asp Asn Ala Leu Gln
            35                  40                  45

Ser Gly Asn Ser Gln Glu Ser Val Thr Glu Gln Asp Ser Lys Asp Ser
    50                  55                  60

Thr Tyr Ser Leu Ser Ser Thr Leu Thr Leu Ser Lys Ala Asp Tyr Glu
65                  70                  75                  80

Lys His Lys Val Tyr Ala Cys Glu Val Thr His Gln Gly Leu Ser Ser
                85                  90                  95

Pro Val Thr Lys Ser Phe Asn Arg Gly Glu Cys Thr Ser
            100                 105
```

<210> SEQ ID NO 64
<211> LENGTH: 103
<212> TYPE: PRT
<213> ORGANISM: Artificial Sequence
<220> FEATURE:
<223> OTHER INFORMATION: CH1

<400> SEQUENCE: 64

```
Ala Ser Thr Lys Gly Pro Ser Val Phe Pro Leu Ala Pro Ser Ser Lys
1               5                   10                  15

Ser Thr Ser Gly Gly Thr Ala Ala Leu Gly Cys Leu Val Lys Asp Tyr
            20                  25                  30

Phe Pro Glu Pro Val Thr Val Ser Trp Asn Ser Gly Ala Leu Thr Ser
            35                  40                  45

Gly Val His Thr Phe Pro Ala Val Leu Gln Ser Ser Gly Leu Tyr Ser
    50                  55                  60

Leu Ser Ser Val Val Thr Val Pro Ser Ser Ser Leu Gly Thr Gln Thr
65                  70                  75                  80

Tyr Ile Cys Asn Val Asn His Lys Pro Ser Asn Thr Lys Val Asp Lys
                85                  90                  95

Lys Val Glu Pro Lys Ser Cys
            100
```

<210> SEQ ID NO 65
<211> LENGTH: 15
<212> TYPE: PRT
<213> ORGANISM: Artificial Sequence
<220> FEATURE:
<223> OTHER INFORMATION: Hinge

<400> SEQUENCE: 65

```
Glu Pro Lys Ser Cys Asp Lys Thr His Thr Cys Pro Pro Cys Pro
1               5                   10                  15
```

<210> SEQ ID NO 66
<211> LENGTH: 107
<212> TYPE: PRT
<213> ORGANISM: Artificial Sequence
<220> FEATURE:
<223> OTHER INFORMATION: CH3

<400> SEQUENCE: 66

```
Gly Gln Pro Arg Glu Pro Gln Val Tyr Thr Leu Pro Pro Ser Arg Glu
1               5                   10                  15

Glu Met Thr Lys Asn Gln Val Ser Leu Thr Cys Leu Val Lys Gly Phe
```

```
                    20                  25                  30

Tyr Pro Ser Asp Ile Ala Val Glu Trp Glu Ser Asn Gly Gln Pro Glu
            35                  40                  45

Asn Asn Tyr Lys Thr Thr Pro Pro Val Leu Asp Ser Asp Gly Ser Phe
        50                  55                  60

Phe Leu Tyr Ser Lys Leu Thr Val Asp Lys Ser Arg Trp Gln Gln Gly
65                  70                  75                  80

Asn Val Phe Ser Cys Ser Val Met His Glu Ala Leu His Asn His Tyr
                85                  90                  95

Thr Gln Lys Ser Leu Ser Leu Ser Pro Gly Lys
            100                 105

<210> SEQ ID NO 67
<211> LENGTH: 117
<212> TYPE: PRT
<213> ORGANISM: Artificial Sequence
<220> FEATURE:
<223> OTHER INFORMATION: VH

<400> SEQUENCE: 67

Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Asn Asn
            20                  25                  30

Tyr Asp Met Ser Trp Val Arg Gln Ala Pro Gly Lys Gly Leu Gln Tyr
        35                  40                  45

Ile Gly Trp Ile Asn Ser Gly Gly Thr Ala Tyr Tyr Ala Ser Trp Ala
    50                  55                  60

Lys Gly Arg Phe Thr Ile Ser Lys Thr Ser Thr Thr Val Asp Leu
65                  70                  75                  80

Lys Met Thr Ser Pro Thr Thr Glu Asp Thr Ala Thr Tyr Phe Cys Ala
                85                  90                  95

Arg His Arg Tyr Gly Tyr Tyr Gly Asp Ile Trp Gly Pro Gly Thr Leu
            100                 105                 110

Val Thr Val Ser Leu
        115

<210> SEQ ID NO 68
<211> LENGTH: 111
<212> TYPE: PRT
<213> ORGANISM: Artificial Sequence
<220> FEATURE:
<223> OTHER INFORMATION: VL

<400> SEQUENCE: 68

Asp Pro Val Leu Thr Gln Thr Pro Ser Ser Val Ser Ala Ala Val Gly
1               5                   10                  15

Gly Thr Val Thr Ile Asn Cys Gln Ser Ser Gln Asn Val Tyr Asn Asn
            20                  25                  30

Asn Arg Leu Ala Trp Tyr Gln Gln Lys Leu Gly Gln Pro Pro Lys Leu
        35                  40                  45

Leu Ile Tyr Phe Ala Ser Lys Leu Ala Ser Gly Val Pro Ser Arg Phe
    50                  55                  60

Ser Gly Ser Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Asn Thr
                85                  90                  95
```

```
Ile Val Asp Asn Gly Phe Gly Gly Thr Glu Val Val Lys
            100                 105                 110
```

<210> SEQ ID NO 69
<211> LENGTH: 103
<212> TYPE: PRT
<213> ORGANISM: Artificial Sequence
<220> FEATURE:
<223> OTHER INFORMATION: VH

<400> SEQUENCE: 69

```
Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Ser Ser
            20                  25                  30

Tyr Asp Met Ser Trp Val Arg Gln Ala Pro Gly Lys Gly Leu Gln Tyr
        35                  40                  45

Ile Gly Trp Met Asn Thr Asn Gly Ser Ala Tyr Tyr Ala Thr Trp Ala
    50                  55                  60

Lys Gly Arg Phe Thr Ile Ser Lys Thr Ser Thr Thr Val Asp Leu
65                  70                  75                  80

Lys Met Thr Ser Pro Thr Thr Glu Asp Thr Ala Thr Tyr Phe Cys Ala
                85                  90                  95

Arg His Arg Ser Gly Tyr Tyr
            100
```

<210> SEQ ID NO 70
<211> LENGTH: 111
<212> TYPE: PRT
<213> ORGANISM: Artificial Sequence
<220> FEATURE:
<223> OTHER INFORMATION: VL

<400> SEQUENCE: 70

```
Asp Pro Val Leu Thr Gln Thr Pro Ser Ser Val Ser Ala Ala Val Gly
1               5                   10                  15

Gly Thr Val Thr Ile Asn Cys Gln Ser Ser Gln Asn Val Leu Asn Gln
            20                  25                  30

Asn Arg Leu Ala Trp Tyr Gln Gln Lys Pro Gly Gln Pro Pro Lys Leu
        35                  40                  45

Leu Ile Tyr Trp Ala Ser Lys Leu Ala Ser Gly Val Pro Ser Arg Phe
    50                  55                  60

Lys Gly Ser Gly Ser Gly Thr Gln Phe Thr Leu Thr Ile Ser Gly Val
65                  70                  75                  80

Gln Cys Asp Asp Ala Ala Thr Tyr Tyr Cys Ala Gly Gly Tyr Ser Ser
                85                  90                  95

Ile Val Tyr Asn Ala Phe Gly Gly Gly Thr Glu Val Val Lys
            100                 105                 110
```

<210> SEQ ID NO 71
<211> LENGTH: 117
<212> TYPE: PRT
<213> ORGANISM: Artificial Sequence
<220> FEATURE:
<223> OTHER INFORMATION: VH

<400> SEQUENCE: 71

```
Gln Cys Gln Ser Val Glu Glu Ser Gly Gly Arg Leu Val Thr Pro Gly
1               5                   10                  15

Thr Pro Leu Thr Leu Thr Tyr Thr Val Ser Gly Phe Ser Leu Ser Asn
```

```
                    20                  25                  30

Tyr Asp Met Ser Trp Val Arg Gln Ala Pro Gly Lys Gly Leu Glu Tyr
            35                  40                  45

Ile Gly Trp Ile Asn Thr Gly Gly Ser Val Tyr Tyr Ala Ser Trp Ala
 50                  55                  60

Lys Gly Arg Phe Thr Ile Ser Lys Thr Ser Thr Thr Val Asp Leu
 65                  70                  75                  80

Lys Leu Thr Ser Pro Thr Thr Glu Asp Thr Ala Thr Tyr Phe Cys Ala
                85                  90                  95

Arg His Arg Ser Gly Tyr Phe Gly Asp Ile Trp Gly Pro Gly Thr Leu
            100                 105                 110

Val Thr Val Ser Leu
        115

<210> SEQ ID NO 72
<211> LENGTH: 111
<212> TYPE: PRT
<213> ORGANISM: Artificial Sequence
<220> FEATURE:
<223> OTHER INFORMATION: VL

<400> SEQUENCE: 72

Asp Pro Val Leu Thr Gln Thr Pro Ser Ser Val Ser Ala Ala Val Gly
 1               5                  10                  15

Gly Thr Val Thr Ile Asn Cys Gln Ser Ser Gln Asn Val Tyr Asn Asn
                20                  25                  30

Asn Arg Leu Ala Trp Tyr Gln Gln Lys Pro Gly Gln Pro Pro Lys Leu
            35                  40                  45

Leu Ile Tyr Phe Ala Ser Lys Leu Ala Ser Gly Val Pro Ser Arg Phe
 50                  55                  60

Lys Gly Asn Gly Ser Gly Thr Gln Phe Thr Leu Thr Ile Ser Gly Val
 65                  70                  75                  80

Gln Cys Asp Asp Ala Ala Thr Tyr Tyr Cys Ala Gly Gly Tyr Asn Ser
                85                  90                  95

Ile Val Asp Asn Gly Phe Gly Ala Gly Thr Glu Val Val Val Lys
            100                 105                 110

<210> SEQ ID NO 73
<211> LENGTH: 119
<212> TYPE: PRT
<213> ORGANISM: Artificial Sequence
<220> FEATURE:
<223> OTHER INFORMATION: VH

<400> SEQUENCE: 73

Glu Val Gln Leu Val Gln Ser Gly Ala Glu Val Lys Lys Ser Gly Glu
 1               5                  10                  15

Ser Leu Lys Ile Ser Cys Lys Gly Ser Gly Tyr Ser Phe Thr Ser Tyr
                20                  25                  30

Trp Ile Gly Trp Val Arg Gln Met Pro Gly Lys Gly Leu Glu Trp Met
            35                  40                  45

Gly Ile Phe Tyr Pro Gly Asp Ser Ser Thr Arg Tyr Ser Pro Ser Phe
 50                  55                  60

Gln Gly Gln Val Thr Ile Ser Ala Asp Lys Ser Val Asn Thr Ala Tyr
 65                  70                  75                  80

Leu Gln Trp Ser Ser Leu Lys Ala Ser Asp Thr Ala Met Tyr Tyr Cys
                85                  90                  95
```

```
                    -continued

Ala Arg Arg Arg Asn Trp Gly Asn Ala Phe Asp Ile Trp Gly Gln Gly
            100                 105                 110

Thr Met Val Thr Val Ser Ser
        115

<210> SEQ ID NO 74
<211> LENGTH: 108
<212> TYPE: PRT
<213> ORGANISM: Artificial Sequence
<220> FEATURE:
<223> OTHER INFORMATION: VL

<400> SEQUENCE: 74

Glu Ile Val Leu Thr Gln Ser Pro Gly Thr Leu Ser Leu Ser Pro Gly
1               5                   10                  15

Glu Arg Ala Thr Leu Ser Cys Arg Ala Ser Gln Ser Val Ser Ser Ser
            20                  25                  30

Tyr Leu Ala Trp Tyr Gln Gln Lys Pro Gly Gln Ala Pro Arg Leu Leu
        35                  40                  45

Ile Tyr Gly Ala Ser Ser Arg Ala Thr Gly Ile Pro Asp Arg Phe Ser
    50                  55                  60

Gly Ser Gly Ser Gly Thr Asp Phe Thr Leu Thr Ile Ser Arg Leu Glu
65                  70                  75                  80

Pro Glu Asp Phe Ala Val Tyr Tyr Cys Gln Gln Tyr Gly Ser Ser Thr
                85                  90                  95

Trp Thr Phe Gly Gln Gly Thr Lys Val Glu Ile Lys
            100                 105
```

ANTI-GPC3 ANTIBODY, ANTI-GPC3 CHIMERIC ANTIGEN RECEPTOR AND GPC3/CD3 BISPECIFIC ANTIBODY

This application is a National Stage application under 35 U.S.C. § 371 of International Application No. PCT/CN2021/103447, having a filing date of Jun. 30, 2021, which claims the benefit of U.S. Provisional Patent Application No. 63/047,239, entitled "Development of GPC3/CD3 bispecific antibody for hepatocellular carcinoma therapy", filed on Jul. 1, 2020, and U.S. Provisional Patent Application No. 63/063,550, entitled "Development of GPC3/CD3 bispecific antibody and anti-GPC3 chimeric antigen receptor" filed on Aug. 10, 2020; the contents of which are herein incorporated by reference in their entireties.

TECHNICAL FIELD

The present application relates to the field of biopharmaceuticals, and particularly relates to an anti-GPC3 antibody, an anti-GPC3 chimeric antigen receptor, and a GPC3/CD3 bispecific antibody, and preparation methods and uses thereof.

BACKGROUND

Malignant tumors are one of the great causes of death in humans and a very large health problem. Liver cancer is an increasingly prevalent malignancy. It is the fifth most frequently diagnosed neoplasm and the third most common cause of cancer-related mortality. Primary liver cancers are classified into hepatocellular carcinoma (HCC), intrahepatic cholangiocarcinoma (ICC) and combined hepatocellular and cholangiocarcinoma (CHC). According to the American Cancer Society, hepatocellular carcinoma (HCC) accounts for about 80% of liver cancer cases, which does not respond to most chemotherapy drugs (1). Several markers have been used to distinguish HCC from other liver tumors. Glypican 3 (GPC3) is one of the most important markers because approximately 50-80% of those HCC patients are Glypican 3 positive. In addition, GPC3 expression in HCC is associated with a significantly worse prognosis (compared to HCC patients who are Glypican 3 negative) even after complete tumor removal, likely due to GPC3-mediated signaling for tumor growth. Glypican 3 is a member of the glypican family of heparan sulfate proteoglycans, which attach to member via a glycosylphosphatidylinositol (GPI) anchor (2). Mechanistically, GPC3 functions as a coreceptor/storage site for some ligands, e.g., Wnt and FGF and promotes the growth of hepatoma cells by stimulating canonical Wnt/β-catenin signaling (3-5). An experimental analysis using GPC3-deficient mice suggested GPC3 involvement in the regulation of Wnt, hedgehog, and fibroblast growth factor pathways to control cell growth and apoptosis during development. Glypican 3 (GPC3) is a highly tumor-specific cell surface antigen that is expressed during fetal development but is strictly suppressed in normal adult tissues (6). It belongs to a family of heparin sulfate proteoglycans that are tethered to the cell surface via a glycosylphosphatidylinositol anchor. Elevated GPC3 expression has also been reported in other tumor types such as lung, gastric, ovarian, esophageal, and others. Its oncofetal expression and role as an important signaling modulator suggest that GPC3 could be a potential therapeutic target in cancer treatment.

A T-cell redirecting antibody that employs cytotoxicity mobilizing T cells as effector cells as the mechanism for its antitumor effect has been known from the 1980s as a bispecific antibody. Unlike antibodies that employ ADCC mobilizing NK cells or macrophages as effector cells as the mechanism for their antitumor effects, a T-cell redirecting antibody is an antibody against any one of the subunits constituting the T-cell receptor (TCR) complex on T cells, and is specifically a bi-specific antibody comprising an antibody that binds to the CD3 epsilon chain and an antibody that binds to an antigen on the target cancer cell. T cells come close to cancer cells via simultaneous binding of the CD3 epsilon chain and a cancer antigen by a T-cell redirecting antibody. As a result, antitumor effects against cancer cells are considered to be exerted through the cytotoxic activity possessed by T cells.

Use of bispecific antibodies to redirect effector T cells for the targeted killing of tumor cells in a TCR-independent way has shown considerable promise both pre-clinically and clinically (7). The rationale for developing bispecific antibodies for GPC3 is to engage T-cells using anti-CD3 on one arm of antibody that activates T cells for highly potent and targeted killing of GPC3-expressing tumor cells bound on another arm of the antibody specific to GPC3. In addition, bispecific antibodies may also block the GPC3 signaling pathway and thereby inhibit tumor growth.

Attention has been increasingly paid to the role of T lymphocytes in tumor immune responses. Adoptive immunotherapy based on T lymphocytes has a certain effect on some tumors, moreover, such immune therapy method can overcome limitations of antibody treatment. However, the therapeutic effect on most tumors is still not satisfactory (8). In recent years, based on the discovery that the identification of a target cell by cytotoxic T lymphocytes (CTL) is specifically dependent on a T lymphocyte receptor (T Cell receptor, TCR), the scFv of the antibody against tumor cell-related antigen is fused to intracellular signal activation motif such as T-lymphocyte receptor CD3 or FcεRIγ to form Chimeric antigen receptors (CAR), and can be genetically modified on the surface of T lymphocytes by means such as lentivirus infection. Such CAR T lymphocytes can selectively direct T lymphocytes to tumor cells expressing the corresponding antigen and specifically kill tumor cells in a major histocompatibility complex (MHC)-independent manner. CAR T lymphocytes are a new immune therapy strategy in the tumor immunotherapy field (9).

In the second generation CAR T lymphocyte that developed afterwards, an intracellular signaling domain of CD28 or CD 137 (also known as 4-1BB) is further included, and parts of the chimeric antigen receptor are connected in the form of scFv-TM-CD28-ITAM or scFv-TM-/CD137-1TAM. Co-stimulatory effect of B7/CD28 or 4-1BBL/CD137 in the intracellular signaling domain induces sustained proliferation of T lymphocytes, and is capable of increasing the level of cytokines such as IL-2, IFN-γ and others secreted by T lymphocytes, as well as improving the in vivo survival period and the anti-tumor effect of the CAR-T (10).

The present application aims to provide GPC3 targeting antibodies or antigen binding fragments, chimeric antigen receptor T cells, or GPC3-CD3 bispecific antibodies with good anti-tumor effect against GPC3-positive tumor cells.

SUMMARY OF THE INVENTION

The present application provides novel Glypican 3 (GPC3) antibodies or antigen binding fragments and bispecific antibodies with particularly advantageous properties such as high producibility, stability, binding affinity, biological activity, specific targeting of GPC3-positive cells, targeting efficiency, remaining tumor cell killing and reduced toxicity. The present application also provides chimeric antigen receptors comprising such antibodies or such antigen-binding fragments, related CAR-T cells, and preparation methods and uses of the same. The present application further provides pharmaceutical compositions comprising GPC3 antibodies or antigen binding fragments, related GPC3/CD3 bispecific antibodies, related GPC3 CAR or CAR-T cells, and methods of treating cancer in a subject in need thereof by administering the Glypican 3 (GPC3) antibodies or antigen binding fragments, the bispecific antibodies, the chimeric antigen receptors, the CAR-T cells, or the pharmaceutical compositions. The cancers treated in accordance with the application include Glypican-3-positive cancers In one aspect, the application provides an antibody or antigen binding fragment, wherein the antibody or antigen binding fragment binds to a GPC3 protein or a variant thereof, wherein the antibody or antigen binding fragment comprises: a light chain variable region and/or a heavy chain variable region, the light chain variable region includes CDR1 comprising the amino acid sequence represented by SEQ ID NO.1, CDR2 comprising the amino acid sequence represented by SEQ ID NO. 2 and CDR3 comprising the amino acid sequence represented by SEQ ID NO. 3, and/or the heavy chain variable region includes CDR1 comprising the amino acid sequence represented by SEQ ID NO. 4, CDR2 comprising the amino acid sequence represented by SEQ ID NO. 5 and CDR3 comprising the amino acid sequence represented by SEQ ID NO. 6.

In a further aspect, the antigen binding fragment is selected from a Fab fragment, a Fab' fragment, a Fab'-SH fragment, a F(ab')2 fragment, a Fv fragment and a scFv fragment.

In a further aspect, the above-mentioned GPC3 antibody or antigen binding fragment is a monoclonal antibody and/or a humanized antibody. In a further aspect, such monoclonal antibody or humanized antibody includes antibodies produced by hybridomas or host cells transformed with an expression vector carrying an antibody gene by genetic engineering techniques. In a further aspect, the monoclonal antibody or a humanized antibody may be 1 gG antibodies comprising two heavy chains and two light chains and are further classified into four subclasses according to the constant region of their heavy chains: IgG1, IgG2, IgG3, and IgG4, and wherein the light chains may be lambda or kappa type.

The antibody or antigen binding fragment (i.e. GPC3 antibody or antigen binding fragment) specifically binds to one or more subunits or structural domains of GPC3(e.g. including full length human GPC3 protein and/or the C-terminal of GPC3 protein). In a further embodiment, the GPC3 antibody or antigen binding fragment specifically binds to C-terminal of GPC3; a cleavage between Arg358 and Cys359 of the full length human GPC3 protein by furin results in a 40-kDa N-terminal subunit and a 30-kDa C-terminal subunit linked by a disulfide bond, the 30-kDa C-terminal subunit is referred to herein as the C-terminal of GPC3.

In a further aspect, the GPC3 antibody or antigen-binding fragment thereof is a humanized antibody or antigen-binding fragment thereof, the humanized antibody or antigen-binding fragment thereof comprises a heavy chain variable region and/or a light chain variable region, and the heavy chain variable region comprises an amino acid sequence with at least 95%, 96%, 97%, 98%, 99% or 100% sequence identity to the sequence of SEQ ID NO. 7, SEQ ID NO. 18 or SEQ ID NO.19, and/or the light chain variable region comprises an amino acid sequence with at least 95%, 96%, 97%, 98%, 99% or 100% sequence identity to the sequence of SEQ ID NO. 8 or SEQ ID NO. 20 or SEQ ID NO. 9.

In a further aspect, the GPC3 antibody or antigen-binding fragment thereof is a humanized antibody or antigen-binding fragment thereof, the humanized antibody or antigen-binding fragment thereof comprises a heavy chain variable region and a light chain variable region, and the heavy chain variable region comprises an amino acid sequence with at least 95%, 96%, 97%, 98%, 99% or 100% sequence identity to the sequence of SEQ ID NO. 7, the light chain variable region comprises an amino acid sequence with at least 95%, 96%, 97%, 98%, 99% or 100% sequence identity to the sequence of SEQ ID NO. 8; or the heavy chain variable region comprises an amino acid sequence with at least 95%, 96%, 97%, 98%, 99% or 100% sequence identity to the sequence of SEQ ID NO. 7, the light chain variable region comprises an amino acid sequence with at least 95%, 96%, 97%, 98%, 99% or 100% sequence identity to the sequence of SEQ ID NO. 9.

In another aspect, the application also provides an antibody or antigen binding fragment, wherein the antibody or antigen binding fragment binds to a GPC3 protein or a variant thereof, the antibody or antigen binding fragment comprises: a light chain variable region and/or a heavy chain variable region, wherein the light chain variable region comprises CDR1 comprising the amino acid sequence represented by SEQ ID NO. 21, CDR2 comprising the amino acid sequence represented by SEQ ID NO. 22 and CDR3 comprising the amino acid sequence represented by SEQ ID NO. 23, and/or the heavy chain variable region comprises CDR1 comprising the amino acid sequence represented by SEQ ID NO. 24, CDR2 comprising the amino acid sequence represented by SEQ ID NO. 25, and CDR3 comprising the amino acid sequence represented by SEQ ID NO. 26.

In a further aspect, the disclosure provides a monoclonal GPC3 antibody including a light chain variable region and/or a heavy chain variable region, wherein the heavy chain variable region comprises an amino acid sequence with at least 95%, 96%, 97%, 98%, 99% or 100% sequence identity to the sequence of SEQ ID NO. 16, and/or the light chain variable region comprises an amino acid sequence with at least 95%, 96%, 97%, 98%, 99% or 100% sequence identity to the sequence of SEQ ID NO. 17.

In a further aspect, the disclosure also provides a monoclonal GPC3 antibody including a light chain variable region and/or a heavy chain variable region, wherein the heavy chain variable region comprises an amino acid sequence with at least 95%, 96%, 97%, 98%, 99% or 100% sequence identity to the sequence of SEQ ID NO. 27, and/or the light chain variable region comprises an amino acid sequence with at least 95%, 96%, 97%, 98%, 99% or 100% sequence identity to the sequence of SEQ ID NO. 28.

In a specific aspect, the application provides a CD3 antigen binding fragment that specifically binds to CD3, wherein the antigen binding fragment (e.g. single chain antibody fragment, scFv) comprises a heavy chain variable region (VH domain) and a light chain variable region (VL domain) wherein:
the heavy chain variable region comprises an amino acid sequence with at least 95%, 96%, 97%, 98%, 99% or 100% sequence identity to the sequence of SEQ ID NO. 10, and the light chain variable region comprises an amino acid sequence with at least 95%, 96%, 97%, 98%, 99% or 100% sequence identity to the sequence of SEQ ID NO. 11;

the heavy chain variable region comprises an amino acid sequence with at least 95%, 96%, 97%, 98%, 99% or 100% sequence identity to the sequence of SEQ ID NO. 12, and the light chain variable region comprises an amino acid sequence with at least 95%, 96%, 97%, 98%, 99% or 100% sequence identity to the sequence of SEQ ID NO. 11; or the heavy chain variable region comprises an amino acid sequence with at least 95%, 96%, 97%, 98%, 99% or 100% sequence identity to the sequence of SEQ ID NO. 14, and the light chain variable region comprises an amino acid sequence with at least 95%, 96%, 97%, 98%, 99% or 100% sequence identity to the sequence of SEQ ID NO. 11.

In a further aspect, the application provides a bispecific antibody, comprising a first antibody or antigen binding fragment that specifically binds to GPC3 or a variant thereof and a second antigen binding fragment that specifically binds to one or more subunits or structural domains of CD3 or a variant thereof. In a further aspect, the first antibody or antigen binding fragment is the above-mentioned GPC3 antibody or antigen binding fragment, and the second antigen binding fragment is the above-mentioned CD3 antigen binding fragment.

In a specific embodiment, the first antibody or antigen binding fragment (i.e. GPC3 antibody or antigen binding fragment) specifically binds to one or more subunits or structural domains of GPC3(e.g. including full length human GPC3 protein and/or the C-terminal of GPC3 protein). In a further embodiment, the GPC3 antibody or antigen binding fragment specifically binds to the C-terminal of GPC3; a cleavage between Arg358 and Cys359 of the full length human GPC3 protein by furin results in a 40-kDa N-terminal subunit and a 30-kDa C-terminal subunit linked by a disulfide bond, wherein the 30-kDa C-terminal subunit is referred to herein as the C-terminal of GPC3.

In a specific embodiment, the second antigen binding fragment (i.e. a CD3 antigen binding fragment) specifically binds to one or more subunits or structural domains of CD3. In a further embodiment, the CD3 antigen binding fragment specifically binds to one or more domains of CD3ε.

In a further aspect, the bispecific antibody comprises two identical heavy chain and two identical light chain fusion polypeptides. Specifically, for the bispecific antibody of the application, the first antibody or antigen binding fragment comprises two identical heavy chains and two identical light chains, and the second antigen binding fragment comprises two identical single chain antibody fragments (scFv), wherein the light chain of the first antibody or antigen binding fragment is fused to the single chain antibody fragment (scFv) of the second antigen binding fragment directly or via a linker so as to form the light chain fusion polypeptide. Preferably the C-terminal of the constant region of each of the light chains of the first antibody or antigen binding fragment is fused to the N-terminal of the heavy chain variable region of each of the said single chain antibody fragments (scFv) of the second antigen binding fragment directly or via a linker. Further, the linker is a peptide linker. Preferably, the peptide linker may be GGGGSGGGGSGGGGS.

In a further embodiment, the Fc domain of the bispecific antibody contains one or more mutations that abrogate binding of Fc to Fc receptors (FcγRI-III), thereby reducing or eliminating an effect of antibody directed cytotoxicity (ADCC) and/or complement dependent cytotoxicity (CDC).

In a further aspect, the above-mentioned bispecific antibody includes a monoclonal antibody that is an immunoglobulin that binds to GPC3, said immunoglobulin comprises two identical heavy chains and two identical light chains, said light chains are a first light chain and a second light chain, wherein the first light chain is fused to a first single chain variable fragment (scFv), directly or via a peptide linker, to create a first light chain fusion polypeptide, and wherein the second light chain is fused to a second scFv, directly or via a peptide linker, to create a second light chain fusion polypeptide, wherein the first and second scFv are identical, and bind to CD3, and wherein the first and second light chain fusion polypeptides are identical. Further, the peptide linker for the light chain fusion polypeptides may be GGGGSGGGGSGGGGS.

In a specific aspect, the heavy chain variable region and the light chain variable region of the second antigen-binding fragment are linked through a peptide linker, the sequence of peptide linker may be GGGGSGGGGSGGGGS; preferably, in the order of VH-GGGGSGGGGSGGGGS-VL from N terminus to C terminus.

In a particular aspect, also provided herein is a bispecific antibody, the bispecific antibody comprising a first antibody or antigen binding fragment that specifically binds to GPC3 and a second antigen binding fragment that specifically binds to CD3, wherein the first antibody or antigen binding fragment specifically binding to GPC3 comprises a heavy chain variable region comprising an amino acid sequence with at least 95%, 96%, 97%, 98%, 99% or 100% sequence identity to the sequence of SEQ ID NO. 7, SEQ ID NO. 18 or SEQ ID NO.19, and/or a light chain variable region comprising an amino acid sequence with at least 95%, 96%, 97%, 98%, 99% or 100% sequence identity to the sequence of SEQ ID NO. 8, SEQ ID NO. 9 or SEQ ID NO. 20. Optionally, the first antibody or antigen binding fragment comprises the heavy chain variable region comprises an amino acid sequence with at least 95%, 96%, 97%, 98%, 99% or 100% sequence identity to the sequence of SEQ ID NO. 7 and the light chain variable region comprises an amino acid sequence with at least 95%, 96%, 97%, 98%, 99% or 100% sequence identity to the sequence of SEQ ID NO. 8; or comprises the heavy chain variable region comprises an amino acid sequence with at least 95%, 96%, 97%, 98%, 99% or 100% sequence identity to the sequence of SEQ ID NO. 7 and the light chain variable region comprises an amino acid sequence with at least 95%, 96%, 97%, 98%, 99% or 100% sequence identity to the sequence of SEQ ID NO. 9. And in a further aspect, wherein the second antigen binding fragment specifically binding to CD3 comprises a heavy chain variable region (VH domain) and a light chain variable region (VL domain) wherein:

the heavy chain variable region comprises an amino acid sequence with at least 95%, 96%, 97%, 98%, 99% or 100% sequence identity to the sequence of SEQ ID NO. 10, and the light chain variable region comprises an amino acid sequence with at least 95%, 96%, 97%, 98%, 99% or 100% sequence identity to the sequence of SEQ ID NO. 11; or the heavy chain variable region comprises an amino acid sequence with at least 95%, 96%, 97%, 98%, 99% or 100% sequence identity to the sequence of SEQ ID NO. 12, and the light chain variable region comprises an amino acid sequence with at least 95%, 96%, 97%, 98%, 99% or 100% sequence identity to the sequence of SEQ ID NO. 11; or the heavy chain variable region comprises an amino acid sequence with at least 95%, 96%, 97%, 98%, 99% or 100% sequence identity to the sequence of SEQ ID NO. 14, and the light chain variable region comprises an amino acid sequence with at least 95%, 96%, 97%, 98%, 99% or 100% sequence identity to the sequence of SEQ ID NO. 11.

The present application also provides a chimeric antigen receptor (CAR) comprising the anti-GPC3 antibodies or the antigen-binding fragments described herein, related CAR-T cells, and preparation methods and uses of the same.

Specifically, in one aspect, the chimeric antigen receptor (CAR) of the present application includes any one of the above GPC3 antibodies or antigen binding fragments, the GPC3 antibody or antigen binding fragment comprises a light chain variable region and/or a heavy chain variable region: the light chain variable region comprises CDR1 comprising an amino acid sequence represented by SEQ ID NO. 1, CDR2 comprising an amino acid sequence represented by SEQ ID NO. 2 and CDR3 comprising an amino acid sequence represented by SEQ ID NO. 3, and/or the heavy chain variable region comprises CDR1 comprising an amino acid sequence represented by SEQ ID NO. 4, CDR2 comprising an amino acid sequence represented by SEQ ID NO. 5 and CDR3 comprising an amino acid sequence represented by SEQ. ID NO. 6; preferably, the antigen binding fragment is selected from a Fab fragment, a Fab' fragment, a Fab'-SH fragment, a F(ab')2 fragment, a Fv fragment and a scFv fragment; more preferably, the antibody is a monoclonal antibody and/or a humanized antibody.

In another aspect, the chimeric antigen receptor (CAR) of the present application includes any one of the above GPC3 antibodies or antigen binding fragments, the GPC3 antibody or antigen binding fragment comprises a light chain variable region and/or a heavy chain variable region, the heavy chain variable region comprises an amino acid sequence that is at least about 95%, 96%, 97%, 98%, 99% or 100% identical to the amino acid sequence of SEQ ID NO. 7, and/or the light chain variable region comprises an amino acid sequence that is at least about 95%, 96%, 97%, 98%, 99% or 100% identical to the amino acid sequence of SEQ ID NO. 8 or SEQ ID NO. 9; preferably, the heavy chain variable region comprises an amino acid sequence that is at least about 95%, 96%, 97%, 98%, 99% or 100% identical to the amino acid sequence of SEQ ID NO. 7, and the light chain variable region comprises an amino acid sequence that is at least about 95%, 96%, 97%, 98%, 99% or 100% identical to the amino acid sequence of SEQ ID NO. 8.

In another aspect, the chimeric antigen receptor of the present application sequentially comprises the GPC3 antibody or antigen binding fragment, an extracellular hinge region, a transmembrane region and an intracellular signaling region.

In another aspect, the GPC3 antibody or antigen binding fragment of the chimeric antigen receptor of the present application is directed by a signal peptide.

In another aspect, for the chimeric antigen receptor of the present application, the signal peptide may be a CD8α signal peptide, a VH3 signal peptide, an IL2 signal peptide or the like; the extracellular hinge region may be a CD8 hinge region; a CD28 hinge region or the like; the transmembrane region may be a CD8 transmembrane region, a CD28 transmembrane region, a 4-1BB transmembrane region or the like; and the intracellular signaling region may be a one or more of CD28 signaling region, a 4-1BB signaling region, an OX40 signaling region, a CD3ζ signaling region or the like.

In another aspect, for the chimeric antigen receptor of the present application, the extracellular hinge region is a CD8 hinge region, the transmembrane region is a CD8 transmembrane region, the intracellular signaling region is 4-1BB and CD3ζ, and the antibody or the antigen-binding fragment thereof is directed by a CD8α signal peptide. Preferably, the CD8α signal peptide is a CD8α signal peptide set forth in SEQ ID NO: 29, the extracellular hinge region is a CD8 hinge region set forth in SEQ ID NO: 30, the transmembrane region is a CD8 transmembrane region set forth in SEQ ID NO: 31, and the intracellular signaling region is 4-1BB set forth in SEQ ID NO: 32 and CD3ζ set forth in SEQ ID NO: 33.

In a further aspect, the application also provides an isolated nucleic acid comprising nucleic acid sequences encoding the above-described GPC3 antibody or antigen binding fragment, the above-mentioned bispecific antibody or the above-mentioned chimeric antigen receptor.

In another aspect, the present application relates to a vector comprising the nucleic acid encoding the above-mentioned GPC3 antibody or antigen binding fragments, the above-mentioned bispecific antibody, or the chimeric antigen receptor, or expressing the antibody or the antigen-binding fragment thereof, the above-mentioned bispecific antibody, or the chimeric antigen receptor according to any of the preceding aspects. Preferably, the vector may be a viral vector; preferably, the viral vector includes, but is not limited to, a lentivirus vector, an adenovirus vector, an adeno-associated virus vector or a retrovirus vector; preferably, the vector may be a non-viral vector; preferably, the non-viral vector may be a transposon vector; preferably, the transposon vector may be a Sleeping Beauty vector, a PiggyBac vector, or the like; preferably, the vector may be a mammalian expression vector; preferably, the expression vector may be a bacterial expression vector; preferably, the expression vector may be a fungal expression vector.

In another aspect, the vector that expresses the chimeric antigen receptor of the present application is a lentivirus vector. In another aspect, the lentivirus vector is plasmid pRRLSIN-GPC3 CAR-P2A-EGFRt shown in FIG. 11.

In a further aspect, the disclosure also provides an isolated host cell comprising the above-mentioned vector or the above-mentioned isolated nucleic acid.

The appropriate host cells are transformed with the above-mentioned vector, and the above-mentioned host cells express the above-mentioned GPC3 antibody or antigen binding fragments, the above-mentioned bispecific antibody, or the above-mentioned chimeric antigen receptor.

In a further aspect, the disclosure also provides various known host cell/expression vector combinations for antibody preparation by introducing isolated antibody genes into appropriate hosts. Appropriate eukaryotic cells used as host cells include animal cells, plant cells, and fungal cells. Specifically, the animal cells include, for example, the following cells: (1) mammalian cells: CHO, COS, myeloma, baby hamster kidney (BHK), HeLa, Vero, or such; (2) amphibian cells: Xenopus oocytes, or such; and (3) insect cells: sf9, sf21, Tn5, or such.

In a further aspect, the disclosure also provides a method of producing the above-mentioned antibody or antigen binding fragment or the above-mentioned bispecific antibody, comprising culturing the above-mentioned host cell so that the antibody or antigen binding fragment, or the bispecific antibody is produced. In a further aspect, the method further comprising recovering the antibody or antigen binding fragment or the bispecific antibody produced by the cell.

In another aspect, the present application provides a method for preparing the CAR-T cell according to the previous aspect, comprising transducing a T cell with a lentivirus comprising the chimeric antigen receptor vector according to any of the preceding aspects to produce the CAR-T cell.

In another aspect, the application also provides a cell that can express the chimeric antigen receptor of any of the preceding aspects. Preferably, the cells are mammalian cells; preferably, the mammalian cells are Chinese hamster ovary cells (CHO), human embryonic kidney cells (293), B cells, T cells, DC cells or NK cells, etc.

In a further aspect, the disclosure also provides the isolated antibody or antigen binding fragment or the bispecific antibody, or a cell expressing the chimeric antigen receptor (CAR) (e.g. the CAR-T cells) produced by the above-mentioned method.

In another aspect, the present application provides a use of the above-mentioned GPC3 antibody or antigen binding fragment, the above-mentioned bispecific antibody, the chimeric antigen receptor (CAR) or a nucleic acid encoding the same, the vector, or the cell according to any of the preceding aspects in preparing a pharmaceutical composition for treating or preventing a disease.

In another aspect, the present application provides a use of the above-mentioned GPC3 antibody or antigen binding fragment, the above-mentioned bispecific antibody, the chimeric antigen receptor(CAR) or a nucleic acid encoding the same, the vector, or the cell according to any of the preceding aspects in treating cancer.

In another aspect, the present application provides a use of the above-mentioned GPC3 antibody or antigen binding fragment, the above-mentioned bispecific antibody, the chimeric antigen receptor(CAR) or a nucleic acid encoding the same, the vector, or the cell according to any of the preceding aspects in preparing a pharmaceutical composition for treating cancer.

In a further aspect, the disclosure also provides a pharmaceutical composition comprising (e.g. a therapeutically effective amount of) the above-mentioned GPC3 antibody or antigen binding fragment, the above-mentioned bispecific antibody, the chimeric antigen receptor (CAR) or a nucleic acid encoding the same, or a cell expressing the chimeric antigen receptor (CAR) (e.g. the CAR-T cells), and optionally a pharmaceutically acceptable carrier.

In a further aspect, the present application also provides a use of the GPC3 antibody or antigen binding fragment in a preparation of a detection antibody or diagnostic antibody for identifying GPC3-positive tumor patients or GPC3-positive tumor cells. Furthermore, the method comprises a step of determining a percentage or level of GPC3-positive cancer cells, or a step of determining a number of binding sites of the GPC3 antibody or antigen binding fragment thereof on the GPC3-positive cancer cells.

In one embodiment, prior to administration of an antibody or antigen binding fragment or a bispecific antibody or a CAR T cell having the ability to bind to GPC3, a biological sample such as a tumor sample (e.g. a tumor biopsy) may be taken from the patient to determine the level of GPC3-positive cancer cells or to determine GPC3 expression level on the GPC3-positive cancer cells. Multiple samples may be taken to determine an average level and to account for possible fluctuations in those levels. If a patient has the desired percentage of GPC3-positive cancer cells, or desired GPC3 expression level on the GPC3-positive cancer cells, an antibody or antigen binding fragment or a bispecific antibody or a CAR T cell having the ability to bind to GPC3 may be administered.

In a further embodiment, quantitative assays are performed to determine the cell surface receptor occupancy (e.g. a number of binding sites) of GPC3 antibody or antigen binding fragment thereof on the GPC3 expressing cell lines. In this way, the GPC3 antibody or antigen binding fragment thereof may be used to determine GPC3 expression level on the GPC3-positive cancer cells, and specific dosing strategies may thus be developed for cancer cells with different GPC3 expression levels.

In one aspect, the present application provides a kit (e.g. a detection or diagnostic kit) comprising the antibody or the antigen-binding fragment thereof, a chimeric antigen receptor, or the nucleic acid encoding the same disclosed herein.

In a further aspect, the disclosure also provides a method of treating cancer in a subject in need thereof, comprising administering to the subject the above-mentioned GPC3 antibody or antigen binding fragment, the above-mentioned bispecific antibody, the chimeric antigen receptor (CAR) or a nucleic acid encoding the same, or a cell expressing the chimeric antigen receptor (CAR) (e.g. the CAR-T cells), or the above-mentioned pharmaceutical composition. Optionally, the method of treating cancer in a subject in need thereof, comprises administering a therapeutically effective amount of the above-mentioned GPC3 antibody or antigen binding fragment, the above-mentioned bispecific antibody, the chimeric antigen receptor (CAR) or a nucleic acid encoding the same, or a cell expressing the chimeric antigen receptor (CAR) (e.g. the CAR-T cells).

In a further aspect, the above-mentioned cancer is a Glypican-3-positive cancer; preferably, the Glypican-3-positive cancer is a solid cancer.

In a further aspect, the Glypican-3-positive cancer includes one or more of gastric cancer, pancreatic cancer, esophageal cancer, lung cancer, ovarian cancer, head and neck cancer, bladder cancer, cervical cancer, sarcoma, cytoma, colon cancer, kidney cancer, colorectal cancer, liver cancer, melanoma, breast cancer, myeloma, neuroglioma, leukemia, lymphoma, ovarian clear cell carcinoma, yolk sac tumor, neuroblastoma, and the like. And optionally, the Glypican-3-positive cancer includes one or more of liver cancer, melanoma, ovarian clear cell carcinoma, yolk sac tumor and neuroblastoma.

In a specific aspect, the pharmaceutically acceptable carrier includes one or more of the following: a pharmaceutically acceptable vehicle, disperser, additive, plasticizer, or excipient.

In some embodiments, the pharmaceutical composition may also comprise other therapeutic agents. In some embodiments, other therapeutic agents include chemotherapeutic agents, immunotherapeutic agents, hormone therapeutic agents, radiotherapy and surgery. The antibody or the antigen-binding fragment can be used in combination with other therapeutic agents to enhance the efficacy of the pharmaceutical composition.

In some embodiments, "to enhance the efficacy" refers to enhancing the efficacy of other therapeutic agents or modalities. The antibody or the antigen-binding fragment disclosed herein can be administered alone or in combination with other therapeutic agents or modalities. In some embodiments, other therapeutic agents or modalities include chemotherapeutic agents, immunotherapeutic agents, hormone therapeutic agents, radiotherapy and surgery.

The pharmaceutical compositions of the present application may be administered to patients by oral or parenteral administration, and parenteral administration is preferred. Specific embodiments of the administration method include administration by injection, transnasal administration, transpulmonary administration, and transdermal administration. Administration by injection includes intravenous injection, intramuscular injection, intraperitoneal injection, and subcutaneous injection. The method of administration can be selected appropriately according to the age and symptoms of the test animal. When administered as an aqueous solution, an aqueous solution containing only a bispecific antibody of the present disclosure may be used, or a solution also containing surfactants, excipients, coloring agents, perfumes, preservatives, stabilizers, buffers, suspending agents, isotonization agents, binders, disintegrants, lubricants, fluidity promoting agents, flavoring agents, and such may be used. The dose can be selected from the range of 0.0001 mg to 1000 mg per kilogram body weight for a single administration. Alternatively, for example, the dose may be selected from the range of 0.001 mg/body to 100000 mg/body per patient. However, the amount of the bispecific antibody administered in the method of treatment of the present application is not limited to these doses.

The technical solutions of the application have the following advantages:

1. The Glypican 3 (GPC3) antibodies or antigen binding fragments are highly selective and specific to GPC3; the bispecific antibodies have particularly advantageous properties such as high producibility, stability, binding affinity, biological activity, specific targeting of GPC3-positive cells, efficient TCR signaling strength, targeting efficiency, remaining tumor cell killing and reduced cytotoxicity.
2. The above-mentioned bispecific antibody with mutant CD3 binders provided here shows reduced binding affinity with CD3, and reduced cytokines release mediated by mutant CD3 binder variants compared to bispecific antibody with wild-type CD3 binders.
3. The CAR-T cells of present application have one or more of the following advantages: better killing ability against cells expressing GPC3; more IFN-gamma cytokine released; better tumor inhibition ability; better in-vivo expansion ability.
4. The application enables desirable treatment for cancer which has not only a high level of safety but also reduced physical burden, and is highly convenient for patients.

BRIEF DESCRIPTION OF THE DRAWINGS

The novel features of the application are set forth with particularity in the appended claims. Some of the features and advantages of the present application are explained in the following detailed description in the embodiments and in the examples.

FIG. 1 shows a schematic representation of GPC3/CD3 bispecific antibody structure of one or more embodiments of the present application.

FIG. 2A-FIG. 2B show lysis activity of pre-activated PBMCs to GPC3-expressing HepG2 tumor cells mediated by GPC3/CD3 bispecific antibodies of the application. Activated T cells (Effector) were cocultured with HepG2 Luc target cells (T) at E/T ratio: 10/1 in a serial dilution of GPC3/CD3 bispecific antibodies (GPC3/CD3-2, GPC3/CD3-40, GPC3/CD3-74, GPC3/CD3-109, and GPC3/CD3-182) for 16 hours. Luciferase quantitative assays were performed to determine cytotoxic activity against target cells.

FIG. 4A-FIG. 4C. GPC3/CD3 bispecific antibody induced NFAT activity in Jurkat cells in a GPC3 dependent manner. GPC3/CD3 BsAb mediated NFAT signaling in a GPC3 expressing manner. GPC3-transfected HEK293T cells (FIG. 4A) or GPC3 negative SK-Hep-1 cells (FIG. 4B) were cocultured with NFAT reporter Jurkat cell in the presence of GPC3/CD3 BsAbs for 8 hours. NFAT activity was reflected by Luciferase intensity. FIG. 4C. Analysis results including EC50 and Span for Jurkat/NFAT activation.

FIG. 5A-FIG. 5C. Humanized GPC3 retained potent cytotoxic ability (i.e. lysis ability) on GPC3 positive HepG2 tumor cells. Comparable lysis activity was observed in humanized GPC3/CD3 bispecific antibodies (H1L1/CD3, H1L3/CD3, and H3L3/CD3 bispecific antibodies) as compared with the chimeric GPC3-40/CD3 bispecific antibodies (Chi clone 40/CD3, Chi clone 2/CD3 bispecific antibodies). The bispecific antibodies were found to induce cytolysis of GPC3 expressing HepG2 target cells in a dose dependent manner (FIG. 5A, FIG. 5C). This lysis activity was found to be antigen specific cytotoxicity as no cytotoxic activity was observed in coculture of PBMCs with GPC3 negative HPAC or LS-174T tumor cell lines (FIG. 5B).

FIG. 7A-FIG. 7D. Effect of various binding affinities to CD3 in humanized GPC3/CD3 BsAbs on cytotoxic ability. The lower binding affinity to CD3 of GPC3/CD3 BsAbs with mutant CD3 binders slightly reduced the cytotoxic activity as compared with GPC3/CD3 BsAbs with wild-type CD3 binder that has higher binding affinity.

FIG. 8A-FIG. 8F. Binding affinity to CD3 in GPC3/CD3 BsAbs influenced cytokine release. Activated T cells were cocultured with GPC3 positive HepG2 cells in the presence of various GPC3/CD3 BsAbs for 18 hours. The supernatants were collected for measuring IFN-γ, TNF-α, and IL-2 by ELISA assay.

FIG. 9A: Comparison of in vivo efficacy of lead humanized anti-GPC3/CD3 bispecific antibody candidates (H1L1-CD3 1a3b, H1L3-CD3 1a3b and H1L3-CD3) in HepG2 induced xenograft humanized PBMC model. The response of an individual mouse to the indicated antibodies and PBS control.

SEQUENCE LISTING

Figure 3A:
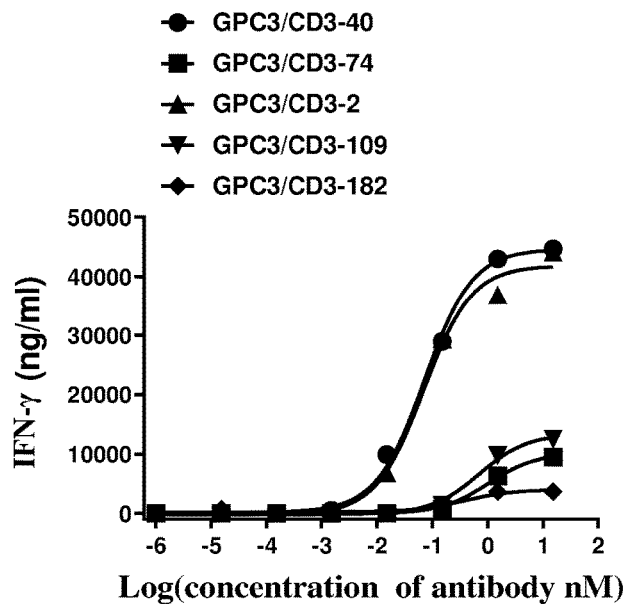
FIG. 3A-FIG. 3C show GPC3/CD3 bispecific antibody induced cytokines secretion in pre-activated human PBMCs. Activated T cells (Effector) were cocultured with HepG2 Luc target cells (T) at E/T ratio: 10/1 in a serial dilution of GPC3/CD3 bispecific antibodies (GPC3/CD3-2, GPC3/CD3-40, GPC3/CD3-74, GPC3/CD3-109, and GPC3/CD3-182 BsAbs) for 16 hours. The supernatants were collected for analysis of IFN-γ, TNF-α, and IL-2 by ELISA assay.

This application contains a Sequence Listing that has been submitted electronically as an ASCII text file named "48644-0011US1. txt." The ASCII text file, created on Dec. 19, 2022, is 73,728 bytes in size. The material in the ASCII text file is hereby incorporated by reference in its entirety.

DETAILED DESCRIPTION OF THE INVENTION

Unless defined otherwise, technical and scientific terms used herein have the same meaning as generally used in the art to which this disclosure belongs. For purposes of interpreting this specification, the following definitions will apply and whenever appropriate, terms used in the singular will also include the plural and vice versa. As used herein and in the appended claims, the singular forms "a", "an", and "the" also refer to the plural forms unless the context clearly dictates otherwise, e.g., reference to "a host cell" includes a plurality of such host cells.

As used herein, the term "antigen binding fragment" or "antigen binding molecule" refers in its broadest sense to a molecule that specifically binds an antigenic determinant. Examples of antigen binding molecules are antibodies, antibody fragments and scaffold antigen binding proteins. The term "antibody" herein is used in the broadest sense and encompasses various antibody structures, including but not limited to monoclonal antibodies, polyclonal antibodies, monospecific and multispecific antibodies (e.g., bispecific antibodies), and antibody fragments so long as they exhibit the desired antigen-binding activity.

The term "antibody" as used herein refers to an antibody obtained from a population of substantially homogeneous antibodies, i.e., the individual antibodies comprising the population are identical and/or bind the same epitope, except for possible variant antibodies, e.g., containing naturally occurring mutations or arising during production of a monoclonal antibody preparation, such variants generally being present in minor amounts. In contrast to polyclonal antibody preparations, which typically include different antibodies directed against different determinants (epitopes), each monoclonal antibody of a monoclonal antibody preparation is directed against a single determinant on an antigen.

A humanized antibody is also called a reshaped human antibody. Specifically, humanized antibodies prepared by grafting the CDR of a non-human animal antibody such as a mouse antibody to a human antibody and such are known. Common genetic engineering techniques for obtaining humanized antibodies are also known. Specifically, for example, overlap extension PCR is known as a method for grafting a mouse antibody CDR to a human FR. In overlap extension PCR, a nucleotide sequence encoding a mouse antibody CDR to be grafted is added to primers for synthesizing a human antibody FR. Primers are prepared for each of the four FRs. It is generally considered that when grafting a mouse CDR to a human FR, selecting a human FR that has high identity to a mouse FR is advantageous for maintaining the CDR function. That is, it is generally preferable to use a human FR comprising an amino acid sequence which has high identity to the amino acid sequence of the FR adjacent to the mouse CDR to be grafted.

The term "bispecific" means that the antibody is able to specifically bind to at least two distinct antigenic determinants, for example two binding sites each formed by a pair of an antibody heavy chain variable domain (VH) and an antibody light chain variable domain (VL) binding to different antigens or to different epitopes on the same antigen. Such a bispecific antibody is referred to as a 1+1 format. Other bispecific antibody formats are 2+1 formats (comprising two binding sites for a first antigen or epitope and one binding site for a second antigen or epitope) or 2+2 formats (comprising two binding sites for a first antigen or epitope and two binding sites for a second antigen or epitope). Typically, a bispecific antibody comprises two antigen binding sites, each of which is specific for a different antigenic determinant. The term "valent" as used within the current application denotes the presence of a specified number of binding domains in an antigen binding molecule. As such, the terms "bivalent", "tetravalent", and "hexavalent" denote the presence of two binding domains, four binding domains, and six binding domains, respectively, in an antigen binding molecule. The bispecific antibodies according to the disclosure are at least "bivalent" and may be "trivalent" or "multivalent" (e.g., "tetravalent" or "hexavalent"). In a particular aspect, the antibodies of the present disclosure have two or more binding sites and are bispecific. That is, the antibodies may be bispecific even in cases where there are more than two binding sites (i.e. that the antibody is trivalent or multivalent). The terms "full length antibody", "intact antibody", and "whole antibody" are used herein interchangeably to refer to an antibody having a structure substantially similar to a native antibody structure. "Native antibodies" refer to naturally occurring immunoglobulin molecules with varying structures. For example, native IgG-class antibodies are hetero-tetrameric glycoproteins of about 150,000 daltons, composed of two light chains and two heavy chains that are disulfide-bonded. From N- to C-terminus, each heavy chain has a variable region (VH), also called a variable heavy domain or a heavy chain variable domain, followed by three constant domains (CH1, CH2, and CH3), also called a heavy chain constant region. Similarly, from N- to C-terminus, each light chain has a variable region (VL), also called a variable light domain or a light chain variable domain, followed by a light chain constant domain (CL), also called a light chain constant region. The heavy chain of an antibody may be assigned to one of five types, called α (IgA), δ (IgD), ε (IgE), γ (IgG), or μ (IgM), some of which may be further divided into subtypes, e.g., γ1 (IgG1), γ2 (IgG2), γ3 (IgG3), γ4 (IgG4), α1 (IgA1) and α2 (IgA2). The light chain of an antibody may be assigned to one of two types, called kappa (κ) and lambda (λ), based on the amino acid sequence of its constant domain. An "antibody fragment" refers to a molecule other than an intact antibody that comprises a portion of an intact antibody that binds the antigen to which the intact antibody binds. Examples of antibody fragments include but are not limited to Fv, Fab, Fab', Fab'-SH, F(ab')2; diabodies, triabodies, tetrabodies, cross-Fab fragments; linear antibodies;

single-chain antibody molecules (e.g., scFv); multispecific antibodies formed from antibody fragments and single domain antibodies. Single-domain antibodies are antibody fragments comprising all or a portion of the heavy chain variable domain or all or a portion of the light chain variable domain of an antibody. In certain embodiments, a single-domain antibody is a human single-domain antibody. In addition, antibody fragments comprise single chain polypeptides having the characteristics of a VH domain, namely being able to assemble together with a VL domain, or of a VL domain, namely being able to assemble together with a VH domain to a functional antigen binding site and thereby providing the antigen binding property of full length antibodies. Antibody fragments can be made by various techniques, including but not limited to proteolytic digestion of an intact antibody as well as production by recombinant host cells (e.g., E. coli or phage), as described herein. Papain digestion of intact antibodies produces two identical antigen-binding fragments, called "Fab" fragments, each containing the heavy- and light-chain variable domains and also the constant domain of the light chain and the first constant domain (CH1) of the heavy chain. As used herein, the term "Fab fragment" refers to an antibody fragment comprising a light chain fragment comprising a VL domain and a constant domain of a light chain (CL), and a VH domain and a first constant domain (CH1) of a heavy chain. Fab' fragments differ from Fab fragments by the addition of a few residues at the carboxy terminus of the heavy chain CH1 domain including one or more cysteines from the antibody hinge region. Fab'-SH are Fab' fragments wherein the cysteine residue(s) of the constant domains bear a free thiol group. Pepsin treatment yields an F(ab')2 fragment that has two antigen-combining sites (two Fab fragments) and a part of the Fc region.

A "single-chain variable fragment (scFv)" is a fusion protein of the variable regions of the heavy (VH) and light chains (VL) of an antibody, connected with a short linker peptide of ten to about 25 amino acids. The linker is usually rich in glycine for flexibility, as well as serine or threonine for solubility, and can either connect the N-terminus of the VH with the C-terminus of the VL, or vice versa. This protein retains the specificity of the original antibody, despite removal of the constant regions and the introduction of the linker. In addition, antibody fragments comprising single chain polypeptides have the characteristics of a VH domain, namely being able to assemble together with a VL domain, or of a VL domain, namely being able to assemble together with a VH domain to a functional antigen binding site, thereby providing the antigen binding properties of full length antibodies.

By "specific binding" it is meant that the binding is selective for the antigen and can be distinguished from unwanted or non-specific interactions with substrates other than the antigen. The ability of an antigen binding molecule to bind to a specific antigen can be measured either through an enzyme-linked immunosorbent assay (ELISA) or other techniques familiar to one of skill in the ar, and traditional binding assays. In one embodiment of the present application, the extent of binding of an antigen binding molecule to an unrelated protein is less than about 10% of the binding of the antigen binding molecule to the antigen as measured, e.g., by SPR. In certain embodiments, a molecule that binds to the antigen has a dissociation constant (Kd) of <1 µM, <100 nM, <10 nM, <1 nM, <0.1 nM, <0.01 nM, or <0.001 nM (e.g., $10^{-7}$ M or less, e.g., from $10^{-7}$ M to $10^{-13}$ M, e.g., from $10^{-9}$ M to $10^{-13}$ M).

"Affinity" or "binding affinity" refers to the strength of the sum total of non-covalent interactions between a single binding site of a molecule (e.g., an antibody) and its binding partner (e.g., an antigen). Unless indicated otherwise, as used herein, "binding affinity" refers to intrinsic binding affinity which reflects a 1:1 interaction between members of a binding pair (e.g., antibody and antigen). The affinity of a molecule X for its partner Y can generally be represented by the dissociation constant ($K_d$), which is the ratio of dissociation and association rate constants ($k_{off}$ and $k_{on}$, respectively). Thus, equivalent affinities may comprise different rate constants, as long as the ratio of the rate constants remains the same. Affinity can be measured by common methods known in the art, including those described herein. A particular method for measuring affinity is Surface Plasmon Resonance (SPR). As used herein, the term "high affinity" of an antibody refers to an antibody having a $K_d$ of $10^{-9}$ M or less and even more particularly $10^{-19}$ M or less for a target antigen. The term "low affinity" of an antibody refers to an antibody having a $K_d$ of $10^{-8}$ or higher.

The term "variable region" or "variable domain" refers to the domain of an antibody heavy or light chain that is involved in binding the antigen binding molecule to antigen. The variable domains of the heavy chain and light chain (VH and VL, respectively) of a native antibody generally have similar structures, with each domain comprising four conserved framework regions (FRs) and three hypervariable regions (HVRs). A single VH or VL domain may be sufficient to confer antigen-binding specificity.

Hypervariable regions (HVRs) are also referred to as complementarity determining regions (CDRs), and these terms are used herein interchangeably in reference to portions of the variable region that form the antigen binding regions. This particular region has been described by Kabat et al., U.S. Dept. of Health and Human Services, where the definitions include overlapping or subsets of amino acid residues when compared against each other. Nevertheless, application of either definition to refer to a CDR of an antibody or variants thereof is intended to be within the scope of the term as defined and used herein. The appropriate amino acid residues which encompass the CDRs as defined by each of the above cited references are set forth below in Table A as a comparison. The exact residue numbers which encompass a particular CDR will vary depending on the sequence and size of the CDR. Those skilled in the art can routinely determine which residues comprise a particular CDR given the variable region amino acid sequence of the antibody.

Kabat et al. also defined a numbering system for variable region sequences that is applicable to any antibody. One of ordinary skill in the art can unambiguously assign this system of "Kabat numbering" to any variable region sequence, without reliance on any experimental data beyond the sequence itself. As used herein, "Kabat numbering" refers to the numbering system set forth by Kabat et al., U.S. Dept. of Health and Human Services. Unless otherwise specified, references to the numbering of specific amino acid residue positions in an antibody variable region herein are made according to the Kabat numbering system. With the exception of CDR1 in VH, CDRs generally comprise the amino acid residues that form the hypervariable loops. CDRs also comprise "specificity determining residues," or "SDRs," which are residues that contact antigen. SDRs are contained within regions of the CDRs called abbreviated-CDRs, or a-CDRs. Exemplary a-CDRs (a-CDR-L1, a-CDR-L2, a-CDR-L3, a-CDR-H1, a-CDR-H2, and a-CDR-H3) occur at amino acid residues 31-34 of LI, 50-55 of L2, 89-96 of L3, 31-35B of HI, 50-58 of H2, and 95-102 of H3.) Unless otherwise indicated, HVR residues and other residues in the variable domain (e.g., FR residues) are numbered herein according to Kabat et al.

By "fused to" or "connected to" is meant that the components (e.g., an antigen binding domain and a FC domain) are linked by peptide bonds, either directly or via one or more peptide linkers.

The terms "host cell", "host cell line," and "host cell culture" are used interchangeably and refer to cells into which exogenous nucleic acid has been introduced, including the progeny of such cells. Host cells include "transformants" and "transformed cells," which include the primary transformed cell and progeny derived therefrom without regard to the number of passages.

A "therapeutically effective amount" of an agent, e.g., a pharmaceutical composition, refers to an amount effective, at dosages and for periods of time necessary, to achieve the desired therapeutic or prophylactic result. A therapeutically effective amount of an agent for example eliminates, decreases, delays, minimizes or prevents adverse effects of a disease.

An "individual" or "subject" is a mammal. Mammals include, but are not limited to, domesticated animals (e.g., cows, sheep, cats, dogs, and horses), primates (e.g., humans and non-human primates such as monkeys), rabbits, and rodents (e.g., mice and rats). Particularly, the individual or subject is a human. The term "pharmaceutical composition" refers to a preparation which is in such form as to permit the biological activity of an active ingredient contained therein to be effective, and which contains no additional components which are unacceptably toxic to a subject to which the formulation would be administered. A "pharmaceutically acceptable excipient" refers to an ingredient in a pharmaceutical composition, other than an active ingredient, which is nontoxic to a subject. A pharmaceutically acceptable excipient includes, but is not limited to, a buffer, a stabilizer, or a preservative.

As used herein, "treatment" (and grammatical variations thereof such as "treat" or "treating") refers to clinical intervention in an attempt to alter the natural course of the individual being treated, and can be performed either for prophylaxis or during the course of clinical pathology. Desirable effects of treatment include, but are not limited to, preventing occurrence or recurrence of disease, alleviation of symptoms, diminishment of any direct or indirect pathological consequences of the disease, preventing metastasis, decreasing the rate of disease progression, amelioration or palliation of the disease state, and remission or improved prognosis. In some embodiments, the molecules of the application are used to delay development of a disease or to slow the progression of a disease.

The term "cancer" as used herein refers to proliferative diseases, such as lymphomas, lymphocytic leukemias, lung cancer, non-small cell lung (NSCL) cancer, bronchioloalviolar cell lung cancer, bone cancer, pancreatic cancer, skin cancer, cancer of the head or neck, cutaneous or intraocular melanoma, uterine cancer, ovarian cancer, rectal cancer, cancer of the anal region, stomach cancer, gastric cancer, colon cancer, breast cancer, uterine cancer, carcinoma of the fallopian tubes, carcinoma of the endometrium, carcinoma of the cervix, carcinoma of the vagina, carcinoma of the vulva, Hodgkin's Disease, cancer of the esophagus, cancer of the small intestine, cancer of the endocrine system, cancer of the thyroid gland, cancer of the parathyroid gland, cancer of the adrenal gland, sarcoma of soft tissue, cancer of the urethra, cancer of the penis, prostate cancer, cancer of the bladder, cancer of the kidney or ureter, renal cell carcinoma, carcinoma of the renal pelvis, mesothelioma, hepatocellular cancer, biliary cancer, neoplasms of the central nervous system (CNS), spinal axis tumors, brain stem glioma, glioblastoma multiforme, astrocytomas, schwanomas, ependymonas, medulloblastomas, meningiomas, squamous cell carcinomas, pituitary adenoma and Ewings sarcoma, including refractory versions of any of the above cancers, or a combination of one or more of the above cancers. The cells used for measurement of cytotoxic activity may be the desired GPC3-expressing cells or a desired tissue containing these cells, for example, HepG2, PC-10 or NCI-H446 which are GPC3-expressing human cancer cell lines. GPC3 negative cells HPAC and LS-174T tumor cell lines are used herein as a control.

The present application provides a novel GPC3 antibody or antigen binding fragment and related bispecific antibody or chimeric antigen receptor (CAR) with particularly advantageous properties such as high producibility, stability, binding affinity, biological activity, specific targeting of GPC3-positive cells, targeting efficiency, remaining tumor cell killing and reduced toxicity.

The present application also relates to polynucleotides encoding the GPC3 antibody or antigen binding fragment, the bispecific antibody, or the chimeric antigen receptor (CAR) of the present application, and they may be inserted into discretionary expression vectors. Suitable hosts may be transformed with the expression vectors to produce cells that express the GPC3 antibody or antigen binding fragment, the bispecific antibody, or the chimeric antigen receptor (CAR) of the application. GPC3 antibody or antigen binding fragment, the bispecific antibody, or the chimeric antigen receptor (CAR) encoded by the polynucleotides can be obtained by culturing the cells that express the GPC3 antibody or antigen binding fragment, the bispecific antibody, or the chimeric antigen receptor (CAR). That is, the present application relates to vectors comprising a polynucleotide encoding a GPC3 antibody or antigen binding fragment, the bispecific antibody, or the chimeric antigen receptor (CAR) of the present application, cells carrying such a vector, and methods for producing GPC3 antibody or antigen binding fragment, the bispecific antibody, or the chimeric antigen receptor (CAR) of the application, which comprises culturing the cells and collecting GPC3 antibody or antigen binding fragment or the bispecific antibody from culture supernatants or collecting cells expressing the chimeric antigen receptor(CAR). These can be obtained by techniques similar to those for recombinant antibodies mentioned above.

Definitions

The following is an explanation of the nomenclature of dual functional (bispecific) antibodies in the different formats generated as used herein:

GPC3/CD3 bispecific antibody: (bispecific antibody against human Glypican 3 and CD3)

GPC3/CD3-2 clone (bispecific antibody chimeric 2 against human Glypican 3 and CD3)

GPC3/CD3-40 clone (bispecific antibody chimeric 40 against human Glypican 3 and CD3)

GPC3/CD3-74 clone (bispecific antibody chimeric 74 against human Glypican 3 and CD3)

GPC3/CD3-109 clone (bispecific antibody chimeric 109 against human Glypican 3 and CD3)

GPC3/CD3-182 clone (bispecific antibody chimeric 182 against human Glypican 3 and CD3)

GPC3 H1 (Humanized Heavy Chain candidate of rabbit Clone 40 Heavy chain against human Glypican 3)
GPC3 H3 (Humanized Heavy Chain candidate of rabbit Clone 40 Heavy chain against human Glypican 3)
GPC3 L1 (Humanized Light chain candidate of rabbit Clone 40 Light chain against human Glypican 3)
GPC3 L3 (Humanized Light chain candidate of rabbit Clone 40 Light chain against human Glypican 3)
GPC3 H1L1/CD3 (GPC3/CD3 humanized bispecific antibody of rabbit clone 40 against human Glypican 3 and CD3)
GPC3 H1L1/CD3OPT1a3b (GPC3/CD3 bispecific antibody candidate of rabbit clone 40 against human Glypican 3 and CD3)
GPC3 H1L1/CD3OPT1a3b2b1 (GPC3/CD3 bispecific antibody candidate of rabbit clone 40 against human Glypican 3 and CD3)
GPC3 H1L3/CD3 (GPC3/CD3 bispecific antibody candidate of rabbit clone 40 against human Glypican 3 and CD3)
GPC3 H1L3/CD3OPT1a3b (GPC3/CD3 bispecific antibody candidate of rabbit clone 40 against human Glypican 3 and CD3)
GPC3 H1L3/CD3OPT1a3b2b1 (GPC3/CD3 bispecific antibody candidate of rabbit clone 40 against human Glypican 3 and CD3)
GPC3 H3L3/CD3 (GPC3/CD3 bispecific antibody candidate of rabbit clone 40 against human Glypican 3 and CD3)
GPC3 H3L3/CD3OPT1a3b (GPC3/CD3 bispecific antibody candidate of rabbit clone 40 against human Glypican 3 and CD3)
GPC3 H3L3/CD3OPT1a3b2b1 (GPC3/CD3 bispecific antibody candidate of rabbit clone 40 against human Glypican 3 and CD3)

EXAMPLES

Example 1. Generation and Identification of Anti-Human GPC3 Monoclonal Antibodies 1. Generation of Anti-Human GPC3 Monoclonal Antibodies 1) Human GPC3 protein: A full length human GPC3 protein consists of 580 amino acids (GeneBank accession no. AFM30911.1), with two heparan sulfate (HS) side chains attached close to the C-terminal portion. Cleavage by furin between Arg358 and Cys359 of the full length human GPC3 protein by furin results in a 40-kDa N-terminal subunit and a 30-kDa C-terminal subunit (i.e. C-terminal fragment) linked by a disulfide bond. The C-terminal of the full length human GPC3 protein is close to a cell membrane (i.e. anchored via GPI to a cell membrane), and binding of an antibody to the membrane proximal region will help T cell engager to improve the antibody's killing activity.

2) Obtaining Anti-Human GPC3 Monoclonal Antibodies

Three New England White rabbits were immunized with the full length human GPC3 protein, and antibodies against the membrane-anchored region (i.e. C-terminal of the human GPC3 protein) are screened with the C-terminal of the full length human GPC3 protein (e.g. the C-terminal fragment or C-terminal subunit).

ELISA assay was performed to assess the immune response of the 3 rabbits against the full length human GPC3 protein as well as the C-terminal of full length human GPC3 protein. Two immunized rabbits that have the optimal titer against the full length human GPC3 protein as well as the C-terminal of GPC3 protein were chosen for the development of anti-human GPC3 monoclonal antibodies.

PBMCs were isolated from the two immunized rabbits that have the optimal titer against GPC3, and antigen-specific B cells were enriched via density gradient centrifugation using Ficoll-Pague, then the antigen-specific B cells were differentiated to plasma cells for a 5 to 7-day culture. ELISA assay was performed to identify clones that were selectively positive to C-terminal of full length human GPC3 protein. A total of 117 clones were recovered from recombinant expression. Among the 117 clones, the top 15 clones with strongest binding affinity to human GPC3 proteins and cynomolgus monkey GPC3 protein were selected for further testing. The VH and VL sequences of the above said top 15 clones are shown in Table 1.

TABLE 1

The VH or VL sequence of the top 15 clones

| Clone | V domain | Sequence |
|---|---|---|
| 17 | Heavy Chain | QCQSVEESGGRLVTPGTPLTLTCTVSGFSLSTYDMSWVRQAPGKGLEYIGWIN SGGSPYYARWAKGRFTISKTSSTTVDLKMTSPTTEDTATYFCARHRSGYYGDI WGPGTLVTVSL (SEQ ID NO. 37) |
| 17 | Light Chain | DPVLTQTPSSVSAAVGDTVSINCQSSQNVYKNRLAWYQQKPGQPPKLLIYGA STLASGVPSRFKGSGSGTQFTLTISDLECDDAATYYCAGGYSTIVDNTFGGGT EVVVK (SEQ ID NO. 38) |
| 23 | Heavy Chain | QCQSVEESGGRLVTPGTALTLTCTVSGFSLSTYWMTWVRQAPGKGLEWIGIIN PGGSAYYASWAKGRFTISKTSSATVDLKMTSLTAADTATYFCAGGGGMDPW GPGTLVTVSS (SEQ ID NO. 39) |
| 23 | Light Chain | DPVLTQTPSSVSAAVGGTVSISCQSSQSIIKNYLSWFQHKPGQPPKRLIYRASTL PSGVPSRFEGSGSGTEFTLTISDLECDDAATYYCAASYSDNIYVFGGGTEVVV K (SEQ ID NO. 40) |
| 41 | Heavy Chain | HCQSVEESGGRLVTPGTALTLTCTVSGFSLSTYWMTWVRQAPGKGLEWIGIIN PGGSAYYASWAKGRFTISKASSATVDLKMTSLTAADTATYFCAGGGGMDPW GPGTLVTVSS (SEQ ID NO. 41) |

TABLE 1-continued

The VH or VL sequence of the top 15 clones

| Clone | V domain | Sequence |
|---|---|---|
| 41 | Light Chain | DPVLTQTPSSVSAAVGGTVSISCQSSQSIIKNYLSWFQHKPGQPPKRLIYRASTL PSGVPSRFEGSGSGTEFTLTINDLECDDAATYYCAASYSDNIYVFGGGTEVVV K (SEQ ID NO. 42) |
| 8 | Heavy Chain | QCQSVEESGGRLVTPGTALTLTCTVSGFSLSTYWMTWVRQAPGKGLEWIGIIN PGGSAYYASWAKGRFTISKTSSATVDLKMTSLTAADTATYFCAGGGGMDPW GPGTLVTVSS (SEQ ID NO. 43) |
| 8 | Light Chain | DPVLTQTPSSVSAAVGGTVSISCQSSQSIIKNYLSWFQHKPGQPPKRLIYRASTL PSGVPSRFEGSGSGTEFTLTISDLECDAATYYCAASYSDNIYVFGGGTEVVV K (SEQ ID NO. 44) |
| 12 | Heavy Chain | QCQSVEESGGRLVTPGTPLTLTCTVSGFSLSTYWMTWVRQAPGKGLEWIGIIN PGGSAFYASWAKGRFTISKTSSATVDLKMTSLTAADTATYFCAGGGGMDPW GPGTLVTVSS (SEQ ID NO. 45) |
| 12 | Light Chain | DPVLTQTPSSVSAAVGGTVSISCQSSQSIVKNYLSWFQQKPGQPPKRLIYKAST LPSGVPSRFKGSGSGTEFTLTISDLECDDAATYYCAASYSDNIYVFGGGTEVV VK (SEQ ID NO. 46) |
| 22 | Heavy Chain | QCQSVEESGGRLVTPGTPLTLTCTVSGFSLSTYWMTWVRQAPGKGLEWIGIIN PTGRAYYASWAKGRFTISKTSSATVDLKMTSLTAADTATYFCAGGGGMDPW GPGTLVTVSS (SEQ ID NO. 47) |
| 22 | Light Chain | DPVLTQTPSSVSAAVGGTVTINCQSSQSVYSNYLSWFQKKPGQPPKRLIYKAS TLVSGVPSRFVGSGSGTEFTLTISDLECDDAATYYCAASYSGNIYVFGGGTEV VVK (SEQ ID NO. 48) |
| 40 | Heavy Chain | QCQSVEESGGRLVTPGTPLTLTCTVSGFSLSTYWMTWVRQAPGKGLEWIGIIS PAGSAYYASWAKGRFTISKTSSATVDLKMTSLTTADTATYFCAGGGGMDPW GPGTLVTVSS (SEQ ID NO. 16) |
| 40 | Light Chain | DPVLTQTPSSVSAAVGGTVSISCQSSQSIVKNYLSWFQQKPGQPPKRLIYKAST LPSGVPSRFKGSGSGTEFTLTISDLECDDAATYYCAASYSDNIYVFGGGTEVV VK (SEQ ID NO. 17) |
| 49 | Heavy Chain | QCQSVEESGGRLVTPGTPLTLTCTVSGFSLSTYWMTWVRQAPGKGLEWIGIIN PSGSAYYASWAKGRFTISKTSSATVDLKMTSLTAADTATYFCAGGGGMDPW GPGTLVTVSS (SEQ ID NO. 49) |
| 49 | Light Chain | DPVLTQTPSSVSAAVGGTVSISCQSSQSIVKNYLSWFQQKPGQPPKRLIYKAST LPSGVPSRFKGSGSGTEFTLTISDLECDDAATYYCAASYSDNIYVFGGGTEVV VK (SEQ ID NO. 50) |
| 74 | Heavy Chain | QCQSVEESGGRLVTPGTPLTLTYTVSGFSLNNYDMSWVRQAPGKGLQYIGWI NSGGTAYYASWAKGRFTISKTSSTTVDLKMTSPTTEDTATYFCARHRYGYYG DIWGPGTLVTVSL (SEQ ID NO. 51) |
| 74 | Light Chain | DPVLTQTPSSVSAAVGGTVTINCQSSQNVYNNNRLAWYQQKLGQPPKLLIYF ASKLASGVPSRFSGSGSGTQFTLTISGVQCDDAATYYCAGGYNTIVDNGFGGG TEVVVK (SEQ ID NO. 52) |
| 109 | Heavy Chain | QCQSVEESGGRLVTPGTPLTLTYTVSGFSLSSYDMSWVRQAPGKGLQYIGWM NTNGSAYYATWAKGRFTISKTSSTTVDLKMTSPTTEDTATYFCARHRSGYY (SEQ ID NO. 53) |
| 109 | Light Chain | DPVLTQTPSSVSAAVGGTVTINCQSSQNVLNQNRLAWYQQKPGQPPKLLIYW ASKLASGVPSRFKGSGSGTQFTLTISGVQCDDAATYYCAGGYSSIVYNAFGGG TEVVVK (SEQ ID NO. 54) |
| 121 | Heavy Chain | QCQSVEESGGRLVTPGTPLTLTCTVSGFSLSTYWMTWVRQAPGKGLEWIGIIN PAGSAYYASWAKGRFTISKTSSATVDLKMTSLTAVDTATYFCAGGGGMDPW GPGTLVTVSS (SEQ ID NO. 55) |
| 121 | Light Chain | DPVLTQTPSSVSAAVGGTVTISCQSSQNIIKDYLSWFQQKPGQPPKRLIYKTST LPSGVPSRFKGSGSGTEFTLTISDLECDDAATYYCAASYSGNIYVFGGGTEVV VK (SEQ ID NO. 56) |
| 122 | Heavy Chain | QCQSVEESGGRLVTPGTPLTLTYTVSGFSLSNYDMSWVRQAPGKGLEYIGWI NTGGSVYYASWAKGRFTISKTSSTTVDLKLTSPTTEDTATYFCARHRSGYFGD IWGPGTLVTVSL (SEQ ID NO. 57) |
| 122 | Light Chain | DPVLTQTPSSVSAAVGGTVTINCQSSQNVYNNNRLAWYQQKPGQPPKLLIYF ASKLASGVPSRFKGNGSGTQFTLTISGVQCDDAATYYCAGGYNSIVDNGFGG GTEVVVE (SEQ ID NO. 58) |

TABLE 1-continued

The VH or VL sequence of the top 15 clones

| Clone | V domain | Sequence |
|---|---|---|
| 182 | Heavy Chain | QCQSVEESGGRLVTPGTPLTLTYTVSGFSLSNYDMSWVRQAPGKGLEYIGWI NTGGSVYYASWAKGRFTISKTSSTTVDLKLTSPTTEDTATYFCARHRSGYFGD IWGPGTLVTVSL (SEQ ID NO. 59) |
| 182 | Light Chain | DPVLTQTPSSVSAAVGGTVTINCQSSQNVYNNNRLAWYQQKPGQPPKLLIYF ASKLASGVPSRFKGNGSGTQFTLTISGVQCDDAATYYCAGGYNSIVDNGFGA GTEVVVK (SEQ ID NO. 60) |
| 2 | Heavy Chain | QCQSVEESGGRLVTPGTPLTLTCTVSGFSLSTYNMGWIRQAPGEGLEYIGTISS STGNTYYATWAKGRFTISKTSSTTVDLKITNLTTEDTATYFCVRVNNMGDIW GPGTLVTVSL (SEQ ID NO. 27) |
| 2 | Light Chain | AIVMTQTPSSKSVAVGDTVTINCQASESVYKDNRLAWFQQKPGQAPKLLIYL ASTLASGVPSRFKGSGSGTEFTLTISDVVCDDAATYYCGGYKDSLFDGFPFGG GTEVVVK (SEQ ID NO. 28) |
| 5 | Heavy Chain | QCQSVEESGGRLVTPGTPLTLTCTVSGFSLSTYNMGWVRQAPGEGLEYIGTIS SSTGNTYYATWAKGRFTISKTSSTTVDLKITNLTTEDTATYFCVRVNNMG DIWGPGTLVTVSL (SEQ ID NO. 61) |
| 5 | Light Chain | AIVMTQTPSSKSVAVGDTVTINCQASESVYKDNRLAWFQQKPGQPPKLLIYLA STLASGVPSRFKGSGSGTEFTLTISDVVCDDAATYYCGGYKDSLFDGFPFGGG TEVVVK (SEQ ID NO. 62) |

2. Identification of Anti-Human GPC3 IgG1 Antibodies

The Rabbit CL, CH1, CH2 and CH3 sequences were replaced with human CL, CH1, CH2 and CH3 sequences in the rabbit anti-human GPC3 clones to obtain anti-human GPC3 IgG1 antibodies. Sequences of CL, CH1, CH2, CH3 and Hinge regions for anti-human GPC3 IgG1 antibodies are shown in table 2.

TABLE 2

Sequences of CL, CH1, CH2, CH3 and Hinge regions for anti-human GPC3 IgG1 antibodies

| | |
|---|---|
| CL of human | RTVAAPSVFIFPPSDEQLKSGTASVVCLLN NFYPREAKVQWKVDNALQSGNSQESVTE QDSKDSTYSLSSTLTLSKADYEKHKVYAC EVTHQGLSSPVTKSFNRGECTS (SEQ ID NO. 63) |
| CH1 of human | ASTKGPSVFPLAPSSKSTSGGTAALGCLVK DYFPEPVTVSWNSGALTSGVHTFPAVLQSS GLYSLSSVVTVPSSSLGTQTYICNVNHKPS NTKVDKKVEPKSC (SEQ ID NO. 64) |
| Hinge | EPKSCDKTHTCPPCP (SEQ ID NO. 65) |
| CH2 of human IgG1 heavy chain (wild type) | APEAAGGPSVFLFPPKPKDTLMISRTPEVT CVVVDVSHEDPEVKFNWYVDGVEVHNAK TKPREEQYNSTYRVVSVLTVLHQDWLNG KEYKCKVSNKALPAPIEKTISKAK (SEQ ID NO. 15) |
| CH3 of human IgG1 heavy chain | GQPREPQVYTLPPSREEMTKNQVSLTCLV KGFYPSDIAVEWESNGQPENNYKTTPPVL DSDGSFFLYSKLTVDKSRWQQGNVFSCSV MHEALHNHYTQKSLSLSPGK (SEQ ID NO. 66) |

1) Antigen binding affinity of the top 15 clones (i.e. 15 anti-human GPC3 IgG1 antibodies) was assessed by Biacore assays (data shown in Table 3).

In general, full length human GPC3 His was immobilized on CMS sensor chip using amine coupling method followed by anti-human GPC3 IgG1 antibodies on CMS chip in HBS-EP buffer at a concentration ranging from 1 μg/mL to 0.125 μg/mL. Binding affinity was determined by SPR using a Biacore T200 instrument.

TABLE 3

Antigen binding affinity of the top 15 clones was assessed by Biacore assays

| Ranking (Excel) | Antibodies | Ka (a/s) | Kd (1/s) | KD (nM) | RuMax |
|---|---|---|---|---|---|
| 1 | 74 | $1.0 \times 10^7$ | $3.4 \times 10^{-4}$ | 0.02 | 24.32 |
| 2 | 2 | $8.0 \times 10^5$ | $3.9 \times 10^{-4}$ | 0.00004 | 2.0 |
| 3 | 5 | — | — | — | — |
| 4 | 182 | $1.0 \times 10^7$ | $1.9 \times 10^{-3}$ | 0.02 | 24.32 |
| 5 | 109 | $2.2 \times 10^6$ | $9.3 \times 10^{-4}$ | 0.4 | 11.62 |
| 6 | 122 | $9.1 \times 10^6$ | $1.8 \times 10^{-3}$ | 0.2 | 17.32 |
| 7 | 17 | $1.7 \times 10^7$ | $3.7 \times 10^{-3}$ | 0.2 | 10.74 |
| 8 | 8 | $3.5 \times 10^6$ | $4.2 \times 10^{-4}$ | 0.1 | 3.7 |
| 9 | 40 | $2.7 \times 10^6$ | $1.8 \times 10^{-3}$ | 0.6 | 2.4 |
| 10 | 23 | — | — | — | — |
| 11 | 41 | $2.4 \times 10^6$ | $3.2 \times 10^{-3}$ | 1.3 | 1.49 |
| 12 | 12 | $2.5 \times 10^6$ | $1.6 \times 10^{-3}$ | 0.6 | 1.4 |
| 13 | 22 | $3.1 \times 10^6$ | $5.2 \times 10^{-4}$ | 1.6 | 2.9 |
| 14 | 49 | $1.7 \times 10^6$ | $1.7 \times 10^{-3}$ | 0.9 | 1.7 |
| 15 | 121 | $2.9 \times 10^6$ | $1.5 \times 10^{-3}$ | 0.5 | 2.0 |

2) HepG2 cell surface binding affinity of the top 15 clones (i.e. 15 anti-human GPC3 IgG1 antibodies) was assessed by flow cytometry (data shown in Table 4).

A HepG2 cell line expressing full length human GPC3 was used for flow cytometry analysis. In general, after dissociating cells and washing in PBS, $1 \times 10^5$ target cells were seeded in a 96 well plate. The anti-GPC3 IgG1 antibodies prepared in a final concentration of 25 μg/mL were incubated with cells for 1 hour at 4° C. After washing with FACS wash buffer, plates were incubated with PE conjugated goat anti-Human IgG, Fc Fragment Specific antibody (1:200 diluted in FACS wash buffer) for 20 minutes at 4° C. Mean fluorescence intensity (MFI) was measured using NovoCyte 2060 and results were analyzed by Graph-Pad software.

TABLE 4

Assessment of HepG2 cell surface binding affinity of the top 15 clones by flow cytometry

| Ranking | Antibodies | HepG2 Cell binding (Fold ratio) | EC50 (nM) |
|---|---|---|---|
| 1 | 74 | 142.62 | 0.0042 |
| 2 | 2 | 693.58 | 0.0076 |
| 3 | 5 | — | — |
| 4 | 182 | — | — |
| 5 | 109 | 89.1 | 0.0045 |
| 6 | 122 | 128.99 | 0.0053 |
| 7 | 17 | 39.85 | 0.043 |
| 8 | 8 | 79.5 | 0.012 |
| 9 | 40 | 103.94 | 0.013 |
| 11 | 41 | 116.12 | 0.014 |
| 12 | 12 | 124.88 | 0.014 |
| 13 | 22 | 120.58 | 0.013 |
| 14 | 49 | 114.66 | 0.012 |
| 15 | 121 | 74.57 | 0.0061 |

3) Confirmation of binding specificity to GPC3 proteins (i.e. C-terminal fragment) of anti-GPC3 antibody by ELISA.

The N-terminal of the GPC3 protein can be shed and is present in circulation. Therefore, the antibody of interest needs to target the C-terminal of the GPC3 protein and avoid binding to the soluble N-terminal fragment. The GPC3 binding epitopes of the top 15 clones (i.e. 15 anti-human GPC3 IgG1 antibodies) were determined by their competitive binding to benchmark antibody GC33 (which is known to bind to the C-terminal of the GPC3 protein, see US20180244805A1 for reference), the results are shown in Table 5, Table 5 shows all 15 Clones are specificity binding to the C-terminal fragment of the full length human GPC3 protein, and binding epitopes of the clones are non-overlapped, overlapped and partially overlapped with that of GC33.

TABLE 5

The GPC3 binding epitopes of the top clones.

| | The clones that binds to | | |
|---|---|---|---|
| | (A) Non-overlapped epitopes with GC33 | (B) Same epitopes as GC33 Indications | (C) Partially overlapped epitopes with GC33 |
| | Positive binding to GPC3 antigen on GC33-coated ELISA and individual Ab-coated ELISA | Negative binding to GPC3 antigen on GC33-coated ELISA and individual Ab-coated ELISA | Inconsistent binding to GPC3 in all repeating binning experiments |
| Clone ID | 17 | 41 | 22 |
| | 109 | 8 | 40 |
| | 122 | 12 | 49 |
| | | 121 | 74 |
| | | | 182 |
| | | | 2 |
| | | | 5 |

Based on the above results from affinity ranking, cell surface binding, binding specificity, binding epitope and sequence analysis, the top 5 candidates (Clone 2, Clone 40, Clone 74, Clone 109, and Clone 182) were selected for the development of GPC3/CD3 bispecific antibody.

Example 2. Generation of Rabbit-Human Chimeric GPC3/CD3 Bispecific Antibody

The symmetric molecule structure of bispecific antibody was chosen for the format of GPC3/CD3 bispecific antibody development. A schematic representation of GPC3/CD3 bispecific antibody structure of one or more embodiments of the present application is shown in FIG. 1. The C-terminal of the constant region of each of the light chains of the GPC3 antibody (e.g. GPC3 IgG1 antibody) is fused to the N-terminal of the heavy chain variable region of each of the CD3 single chain antibody fragments (scFv) directly or via a linker. Link 1 and Link 2 in FIG. 1 may be the same or different, for example, Link 1 and Link 2 may be a peptide linker with a sequence of GGGGSGGGGSGGGS.

Further, to avoid Ig Fc mediated-ADCC/CDC function, LALA mutation (L234A, L235A) was incorporated in the human IgG1 Fc region to eliminate effector functions in the present application. The position of the mutations in IgG1 Fc region of the present application are in Eu Numbering.

The VH and VL sequences of the 5 Chimeric bispecific antibodies selected for testing are shown in Table 6. Sequences of CL, CH1, CH2, CH3 and Hinge regions for the 5 Chimeric bispecific antibodies selected are shown in Table 7.

TABLE 6

VH and VL sequences of the 5 Chimeric bispecific antibodies selected (Underlined Sequences represent CDRs, the analysis system is Kabat system)

| BsAb | anti-GPC3 VH | anti-GPC3 VL | anti-CD3 (wild-type) VH | anti-CD3 (wild-type) VL |
|---|---|---|---|---|
| GPC3/CD3-2 | QCQSVEESGGRLVTPGT PLTLTCTVSGFSLSTYN MGWIRQAPGEGLEYIGT ISSSTGNTYYATWAKGR FTISKTSSTTVDLKITNL TTEDTATYFCVRVNNM GDIWGPGTLVTVSL (SEQ ID NO. 27) CDRs: STYNMG (SEQ ID NO. 21) TISSSTGNTYYATWAKG (SEQ ID NO. 22) VNNMGDI (SEQ ID NO. 23) | AIVMTQTPSSKSVAVGDTV TINCQASESVYKDNRLAW FQQKPGQAPKLLIYLASTL ASGVPSRFKGSGSGTEFTL TISDVVCDDAATYYCGGY KDSLFDGFPFGGGTEVVV K (SEQ ID NO. 28) CDRs: QASESVYKDNRLA (SEQ ID NO. 24) LASTLAS (SEQ ID NO. 25) GGYKDSLFDGFP (SEQ ID NO. 26) | EVQLVESGGG LVQPGGSLKL SCAASGFTFN KYAMNWVR QAPGKGLEW VARIRSKYNN YATYYADSV KDRFTISRDD SKNTAYLQM NNLKTEDTA VYYCVRHGN FGNSYISYWA YWGQGTLVT VSS (SEQ ID NO. 10) | QTVVTQEPSL TVSPGGTVTL TCGSSTGAVT SGYYPNWVQ QKPGQAPRGL IGGTKFLAPG TPARFSGSLL GGKAALTLSG VQPEDEAEYY CALWYSNRW VFGGGTKLTV L (SEQ ID NO. 11) |
| GPC3/CD3-40 | QCQSVEESGGRLVTPGT PLTLTCTVSGFSLSTYW MTWVRQAPGKGLEWIG IISPAGSAYYASWAKGR FTISKTSSATVDLKMTS LTTADTATYFCAGGGG MDPWGPGTLVTVSS (SEQ ID NO. 16) CDRs: GFSLSTYWMT (SEQ ID NO. 1) IISPAGSAYYASWAKG (SEQ ID NO. 2) AGGGGMDP (SEQ ID NO. 3) | DPVLTQTPSSVSAAVGGTV SISCQSSQSIVKNYLSWFQ QKPGQPPKRLIYKASTLPS GVPSRFKGSGSGTEFTLTIS DLECDDAATYYCAASYSD NIYVFGGGTEVVVK (SEQ ID NO. 17) CDRs: QSSQSIVKNYLS (SEQ ID NO. 4) KASTLPS (SEQ ID NO. 5) AASYSDNIYV (SEQ ID NO. 6) | | |
| GPC3/CD3-74 | QCQSVEESGGRLVTPGT PLTLTYTVSGFSLNNYD MSWVRQAPGKGLQYIG WINSGGTAYYASWAKG RFTISKTSSTTVDLKMTS PTTEDTATYFCARHRYG YYGDIWGPGTLVTVSL (SEQ ID NO. 67) | DPVLTQTPSSVSAAVGGTV TINCQSSQNVYNNNRLAW YQQKLGQPPKLLIYFASKL ASGVPSRFSGSGSGTQFTL TISGVQCDDAATYYCAGG YNTIVDNGFGGGTEVVVK (SEQ ID NO. 68) | | |
| GPC3/CD3-109 | QCQSVEESGGRLVTPGT PLTLTYTVSGFSLSSYD MSWVRQAPGKGLQYIG WMNTNGSAYYATWAK GRFTISKTSSTTVDLKM TSPTTEDTATYFCARHR SGYY (SEQ ID NO. 69) | DPVLTQTPSSVSAAVGGTV TINCQSSQNVLNQNRLAW YQQKPGQPPKLLIYWASK LASGVPSRFKGSGSGTQFT LTISGVQCDDAATYYCAG GYSSIVYNAFGGGTEVVV K (SEQ ID NO. 70) | | |

TABLE 6-continued

VH and VL sequences of the 5 Chimeric bispecific antibodies selected (Underlined Sequences represent CDRs, the analysis system is Kabat system)

| | anti-GPC3 | | anti-CD3 (wild-type) | |
|---|---|---|---|---|
| BsAb | VH | VL | VH | VL |
| GPC3/CD3-182 | QCQSVEESGGRLVTPGT PLTLTYTVSGFSLSNYD MSWVRQAPGKGLEYIG WINTGGSVYYASWAKG RFTISKTSSTTVDLKLTS PTTEDTATYFCARHRSG YFGDIWGPGTLVTVSL (SEQ ID NO. 71) | DPVLTQTPSSVSAAVGGTV TINCQSSQNVYNNNRLAW YQQKPGQPPKLLIYFASKL ASGVPSRFKGNGSGTQFTL TISGVQCDDAATYYCAGG YNSIVDNGFGAGTEVVVK (SEQ ID NO. 72) | | |

Underline shows the CDRs

TABLE 7

Sequences of CL, CH1, CH2, CH3 and Hinge regions for the 5 Chimeric bispecific antibodies selected

| | |
|---|---|
| CL of human | RTVAAPSVFIFPPSDEQLKSGTASVVCLLN NFYPREAKVQWKVDNALQSGNSQESVTE QDSKDSTYSLSSTLTLSKADYEKHKVYAC EVTHQGLSSPVTKSFNRGECTS (SEQ ID NO. 63) |
| CH1 of human | ASTKGPSVFPLAPSSKSTSGGTAALGCLVK DYFPEPVTVSWNSGALTSGVHTFPAVLQSS GLYSLSSVVTVPSSSLGTQTYICNVNHKPS NTKVDKKVEPKSC (SEQ ID NO. 64) |
| Hinge | EPKSCDKTHTCPPCP (SEQ ID NO. 65) |
| CH2 of human IgG1 heavy chain (with LALA mutation) | APELLGGPSVFLFPPKPKDTLMISRTPEVTC VVVDVSHEDPEVKFNWYVDGVEVHNAKT KPREEQYNSTYRVVSVLTVLHQDWLNGK EYKCKVSNKALPAPIEKTISKAK (SEQ ID NO. 13) |
| CH3 of human IgG1 heavy chain | GQPREPQVYTLPPSREEMTKNQVSLTCLV KGFYPSDIAVEWESNGQPENNYKTTPPVL DSDGSFFLYSKLTVDKSRWQQGNVFSCSV MHEALHNHYTQKSLSLSPGK (SEQ ID NO. 66) |

Example 3. Chimeric GPC3/CD3 Bispecific Antibody Mediates T Cell Killing of GPC3-Expressing Target Cells In Vitro To test whether GPC3/CD3 bispecific antibodies render T cells cytotoxic toward GPC3-positive targets, we performed standard cytotoxicity assays. PBMCs were pre-activated by culturing with anti-CD3 and anti-CD28 antibodies (stem cell technologies) in the presence of IL2 (20 ng/mL) for 6 days at E:T ratio of 10:1. The cytotoxicity (i.e. lysis activity) mediated by different GPC3/CD3 bispecific antibodies was assessed by Luciferase from live HepG2 Luc cells after 16 hour-incubation in a serial dilution of testing GPC3/CD3 bispecific antibodies. GPC3/CD3 bispecific antibodies (Clones GPC3/CD3-2 and GPC3/CD3-40) enhanced T-cell redirected cytotoxicity of GPC3-expressing HepG2 tumor cells in a dose-dependent manner. However, lower lysis to GPC3-expressing HepG2 tumor cells was observed in the treatment of GPC3/CD3-74, GPC3/CD3-109, and GPC3/CD3-182 (FIG. 2A, FIG. 2B).

Figure 3B:
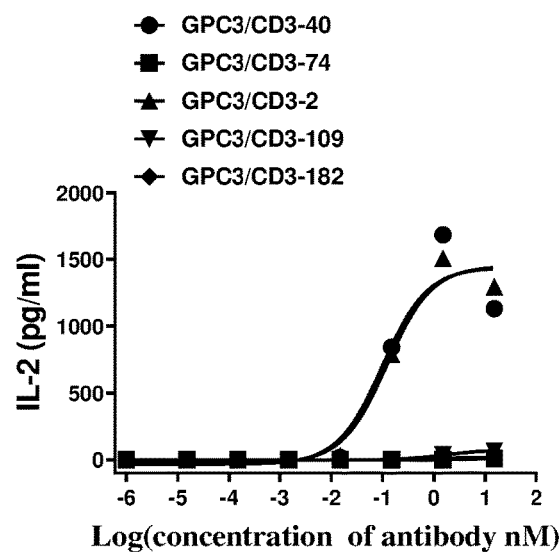
Figure 3C:
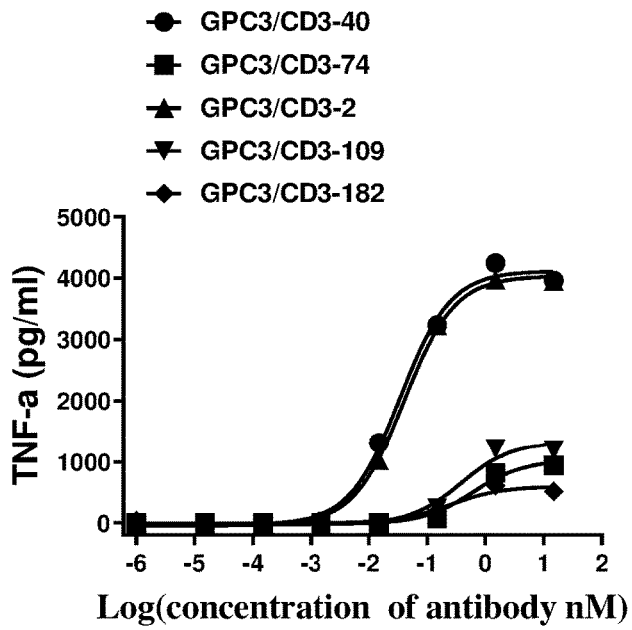

Example 4. Chimeric GPC3/CD3 Bispecific Antibodies Induce Cytokines Release by PBMCs Cytokines secreted by activated T cells can profoundly affect immune responses in vitro and in vivo. Several cytokines limit tumor cell growth by direct anti-proliferative or pro-apoptotic activity, or indirectly by stimulating the cytotoxic activity of immune cells against tumor cells. IFN-γ and IL-2 play a very important role at the interface of innate and adaptive immune systems. INF-α signaling increases the presence of antigenic peptides to T lymphocytes and increase antigen specific CD8+ T cell activation and T cell mediated tumor killing. To clearly determine the functional effects of GPC3/CD3 bispecific antibody on effector cytokines production in vitro, pre-activated T cells were cocultured with GPC3-expressing target cells in the presence of GPC3/CD3 bispecific antibodies at serial dilution for 16 hours. The supernatant was collected for cytokines assay. Similarly, IFN-γ, IL-2, and TNF-α secretion markedly increased in GPC3/CD3-2 clone and GPC3/CD3-40 clone treated PBMCs (FIG. 3A-FIG. 3C). Interestingly, although IFN-γ and TNF-α production slightly increased by GPC3/

CD3-74 clone, GPC3/CD3-109 clone, and GPC3/CD3-182 clone treated PBMCs (FIG. 3A and FIG. 3C), no clear IL-2 release was observed in coculture with GPC3-expressing HepG2 cells (FIG. 3B). More importantly, there is no detectable INF-γ, IL-2, and TNF-α release in coculture with GPC3 negative HT29 tumor cells, suggesting GPC3 specific cytokines release. The data provides strong evidence that GPC3/CD3 bispecific antibody can enhance T cell activity against GPC3 positive target cells.

Example 5. Triggering TCR by Chimeric GPC3/CD3 Bispecific Antibody Induces GPC3 Dependent-NFAT Activity in Jurkat Cells In Vitro The binding of antigens or anti-CD3 antibodies to T cell receptor initiates TCR/CD3-mediated signaling, which leads to activation of the NFAT pathway. Activating NFAT signaling drives T cell proliferation, cytokine production, and activation cell surface marker expression. To assess whether crosslinking of TCR by GPC3/CD3 bispecific antibodies can induce activation signaling on T cells, we used a classical TCR-NFAT-luciferase gene report system to perform NFAT activity assay. Three settings were designed to assess T cell immune response mediated by GPC3/CD3 antibodies (bispecific antibody with wild-type anti-CD3 sequences in table 6): a) adding GPC3/CD3 bispecific antibodies into coculture of Jurkat cells and GPC3-transfected HEK293 T cells; b) adding GPC3/CD3 bispecific antibodies into coculture of Jurkat cells and GPC3 negative SK-Hep-1 cells; and 3) adding isotype control/CD3 bispecific antibody (bispecific antibody with wild-type anti-CD3 sequences in table 6) as negative control into coculture of Jurkat cells and GPC3-transfected HEK293 T cells. As expected, a strong upregulation of the NFAT reporter gene activity was only observed in treatment of Jurkat cells with GPC3/CD3 bispecific antibody clone 2 and clone 40 in coculture with GPC3 transfected HEK293 T cells, however NFAT activity levels were low with GPC3/CD3 bispecific antibody clones 74, 109, and 182 (FIG. 4A), in line with the observed cytotoxicity and cytokine release that were mediated by GPC3/CD3 bispecific antibody clone 2 and clone 40. In contrast, there is no significant activation of NFAT observed in the treatment of Jurkat cells with GPC3/CD3 bispecific antibodies in co-culture with GPC3 negative SK-Hep1 cells (FIG. 4B). For FIG. 4C, the analysis results including EC50 and Span for Jurkat/NFAT activation further indicates that efficient TCR signaling is initiated upon bridging T cells to GPC3-positive target tumor cells by GPC3/CD3 bispecific antibody. VH and VL sequences of IC (isotype control) antibody are shown in Table 8.

TABLE 8

VH and VL sequences of IC (isotype control) antibody

| | |
|---|---|
| VH | EVQLVQSGAEVKKSGESLKISCKGSGYSFTSY WIGWVRQMPGKGLEWMGIFYPGDSSTRYSPS FQGQVTISADKSVNTAYLQWSSLKASDTAMY YCARRRNWGNAFDIWGQGTMVTVSS (SEQ ID NO. 73) |
| VL | EIVLTQSPGTLSLSPGERATLSCRASQSVSSSYL AWYQQKPGQAPRLLIYGASSRATGIPDRFSGS GSGTDFTLTISRLEPEDFAVYYCQQYGSSTWTF GQGTKVEIK (SEQ ID NO. 74) |

Example 6. Humanization of Lead Anti-GPC3 candidates, and Characterization of Top Humanized Anti-GPC3 Candidates and Humanized GPC3/CD3 Bispecific Antibody Humanization of two lead anti-GPC3 candidates (clone #40 and clone #2), selected based on better cytotoxicity and better cytokines readout, were performed. Sequences of rabbit anti-GPC3 antibodies were analyzed for homologous germ-line variable regions of database. Further antibodies were also optimized for optimal thermal stability and developability assessment. The humanized versions of the heavy and the light chain were transiently expressed in combinations to identify the antibody variants with best retention of antigen binding in vitro, thermostability and specific binding.

Since chimeric antibodies could potentially elicit immunogenic responses in human patients, the lead chimeric anti-GPC3 clone 40 must be humanized via grafting the non-human complementarity-determining regions (CDRs) onto a human germline framework. As a result, three humanized light chains L1, L2, L3, and three humanized heavy chains H1, H2, H3, were generated through a grafting process. Two humanized light chains L1, L3, and two humanized heavy chains H1, H3, were chosen. The variable region sequences of the humanized anti-GPC3 clone 40 are shown in Table 9. Sequences of CL, CH1, CH2, CH3 and Hinge regions for the humanized anti-GPC3 clone 40 are shown in Table 7.

TABLE 9

Variable region sequences of the humanized anti-GPC3 clone 40 (Underlined Sequences represent CDRs, the analysis system is Kabat system)

| | |
|---|---|
| H1 (VH1) | QCQSVEESGGGLVQPGGSLRLSCAVSGFSLSTYWMTWVRQAPGKGLEWIGIISPAGSAY YASWAKGRFTISRDNSATVYLQMNSLRAEDTAVYFCAGGGGMDPWGQGTLVTVSS (SEQ ID NO. 7) |
| H2 (VH2) | QCQSVEESGGGLVQPGGSLRLSCAVSGFSLSTYWMTWVRQAPGKGLEWIGIISPAGSAY YASWAKGRFTISKTNSATVYLQMNSLRAEDTATYFCAGGGGMDPWGQGTLVTVSS (SEQ ID NO. 18) |
| H3 (VH3) | QCQSVEESGGGLVQPGGSLRLSCTVSGFSLSTYWMTWVRQAPGKGLEWIGIISPAGSAY YASWAKGRFTISKTNSATVYLQMNSLRAEDTATYFCAGGGGMDPWGQGTLVTVSS (SEQ ID NO. 19) |
| L1 (VL1) | DIVLTQSPSAMSASVGDRVTITCQSSQSIVKNYLSWFQQKPGKPPKRLIYKASTLPSGVPS RFSGSGSGTEFTLTISSLQPEDFATYYCAASYSDNIYVFGGGTKVEIK (SEQ ID NO. 8) |

TABLE 9-continued

Variable region sequences of the humanized anti-GPC3 clone 40 (Underlined Sequences represent CDRs, the analysis system is Kabat system)

```
L2       DPVLTQSPSAMSASVGDRVTITCQSSQSIVKNYLSWFQQKPGKPPKRLIYKASTLPSGVP
(VL2)    SRFSGSGSGTEFTLTISSLQPEDFATYYCAASYSDNIYVFGGGTKVEIK (SEQ ID NO. 20)

L3       DPVLTQSPSAMSASVGDRVTITCQSSQSIVKNYLSWFQQKPGQPPKRLIYKASTLPSGVP
(VL3)    SRFSGSGSGTEFTLTISSLQPEDFATYYCAASYSDNIYVFGGGTKVEIK (SEQ ID NO. 9)
```

Underline shows the CDRs

We further assessed whether the humanized versions of anti-GPC3 clone 40 were able to exhibit lysis activity as potent as seen previously in a chimeric form of anti-GPC3 clone 40 and so we compared in vitro cytotoxicity of humanized anti-GPC3 clone H1L1, H1L3 and H3L3 pairs in CD3 bispecific format (i.e. humanized GPC3/CD3 bispecific antibody with wild-type anti-CD3 sequences in table 6). The humanized H1L1/CD3, H1L3/CD3, and H3L3/CD3 bispecific antibodies were tested for redirecting T cell-mediated cytotoxicity against GPC3 positive and GPC3 negative tumor cell lines. HepG2 tumor cells were cocultured with stimulated human PBMCs at an effector/target ratio of 10:1 in a serial dilution of GPC3/CD3 BsAbs for 16 hours. The bispecific antibodies were found to induce cytolysis of GPC3 expressing HepG2 target cells in a dose dependent manner (FIG. 5A, FIG. 5C). This lysis activity was found to be antigen specific cytotoxicity as no cytotoxic activity was observed incoculture of PBMCs with GPC3 negative HPAC or LS-174T tumor cell lines (FIG. 5B). Interestingly, H1L3 and H3L3 pairs maintained similar potent lysis activity as the chimeric parental clone 40, while the cytotoxicity induced by the H1L1 pair significantly decreased, which suggests that the humanized L3 played a critical role in cytotoxic activity (i.e. lysis activity).

Example 7. Characterization of Humanized Anti-GPC3/CD3 Bispecific Antibodies To characterize humanized GPC3 antibody, humanized Heavy chains and Light chains were combined with various CD3 binders to generate humanized GPC3/CD3 bispecific antibodies. Important objectives of humanization are also the retention of high antigen binding affinity as well as preservation of preferred biophysical properties of the parental chimeric antibodies. The variable region sequences of various CD3 binders used herein are shown in Table 10.

TABLE 10

The variable region sequences of various CD3 binders

| | VH | VL |
|---|---|---|
| CD3 (wild-type) | EVQLVESGGGLVQPGGSLKLSCAA SGFTFNKYAMNWVRQAPGKGLE WVARIRSKYNNYATYYADSVKDR FTISRDDSKNTAYLQMNNLKTEDT AVYYCVRHGNFGNSYISYWAYWG QGTLVTVSS (SEQ ID NO. 10) | QTVVTQEPSLTVSPGGTVTLTCG SSTGAVTSGYYPNWVQQKPGQA PRGLIGGTKFLAPGTPARFSGSLL GGKAALTLSGVQPEDEAEYYCA LWYSNRWVFGGGTKLTVL (SEQ ID NO. 11) |
| CD3OPT 1a3b (mutant-type) | EVQLVESGGGLVKPGGSLKLSCAA SGFTFSTYAMNWVRQAPGKGLEW VARIRSKYNNYATYYADSVKDRFT ISRDDSKNTAYLQMNNLRTEDTAV YYCVRHGNWGNSYISYWAYWGQ GTTVTVSS (SEQ ID NO. 12) | QTVVTQEPSLTVSPGGTVTLTCG SSTGAVTSGYYPNWVQQKPGQA PRGLIGGTKFLAPGTPARFSGSLL GGKAALTLSGVQPEDEAEYYCA LWYSNRWVFGGGTKLTVL (SEQ ID NO. 11) |
| CD3OPT1a3b2b1 (mutant-type) | EVQLVESGGGLVKPGGSLKLSCAA SGFTFSTYAMNWVRQAPGKGLEW VARIRSKYNNYATTYADSVKDRFTI SRDDSKNTAYLQMNNLRTEDTAV YYCVRHGNWGNSYISYWAYWGQ GTTVTVSS (SEQ ID NO. 14) | QTVVTQEPSLTVSPGGTVTLTCG SSTGAVTSGYYPNWVQQKPGQA PRGLIGGTKFLAPGTPARFSGSLL GGKAALTLSGVQPEDEAEYYCA LWYSNRWVFGGGTKLTVL (SEQ ID NO. 11) |

Based on our hypothesis that reducing affinity for either antigen in a bispecific antibody format may reduce cytokine release without necessarily reducing cytotoxic activity (i.e. lysis activity), various sets of anti-GPC3 and anti-CD3 arms having different affinities against each antigen were generated and produced in a bispecific antibody format. The resultant GPC3 bispecific antibodies were designated as H1L1/CD3, H1L1/CD3OPT1a3b, H1L1/CD3OPT1a3b2b1, H1L3/CD3, H1L3/CD3OPT1a3b, and H1L3/CD3OPT1a3b2b1. Each of the two light chains of anti-GPC3 (e.g., H1L1 or H1L3) is fused to a single chain variable fragment (scFv) of anti-CD3 (e.g., CD3, CD3OPT1a3b, or CD3OPT1a3b2b1) via a peptide linker GGGGSGGGGSGGGGS, to create two light chain fusion polypeptides.

Figure 6A:
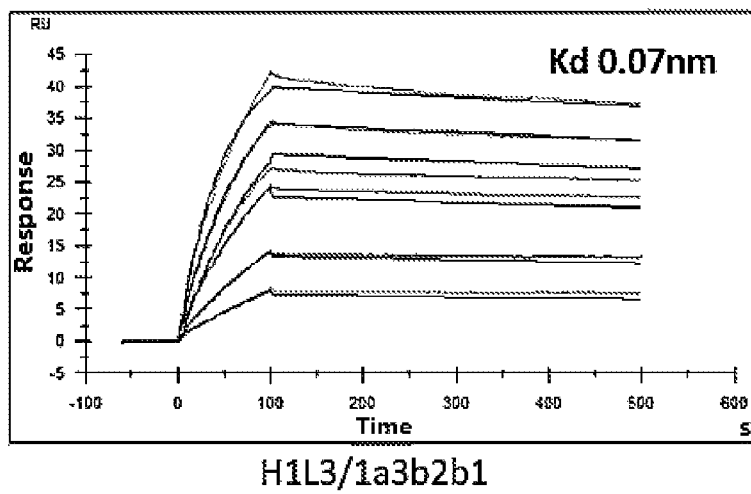
FIG. 6A-FIG. 6C. Analysis of binding affinity of huGPC3/CD3 bispecific antibodies. GPC3/CD3 bispecific antibodies with humanized GPC3 antibodies and GPC3/CD3 bispecific antibodies with parental chimeric GPC3 antibodies have similar binding affinity to GPC3 protein (Biacore) and membrane bound GPC3 protein (FACS).
Figure 6B:
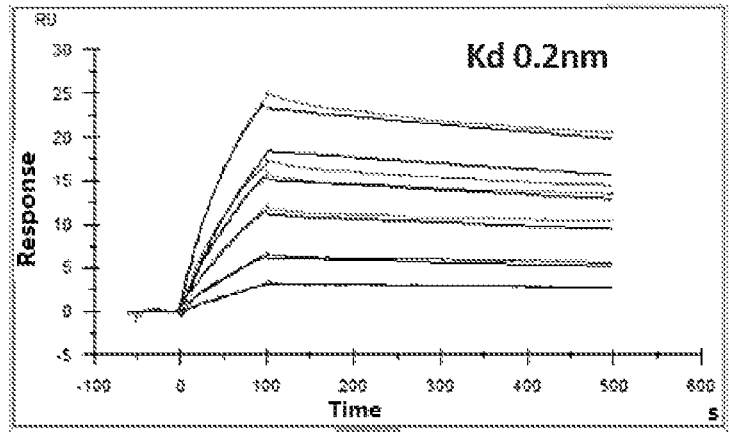
Figure 6C:
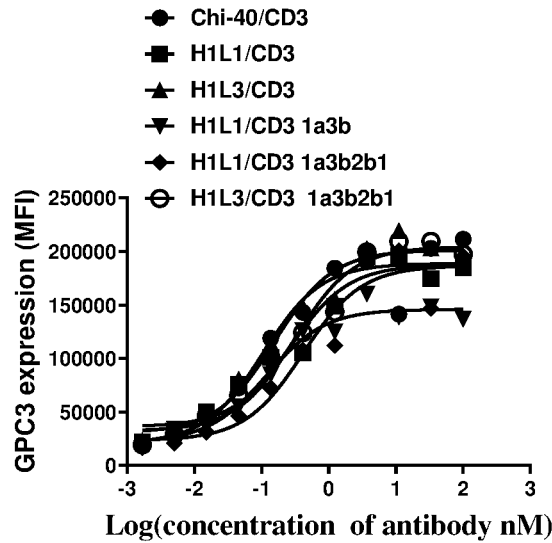

The binding affinities of humanized GPC3/CD3 bispecific antibodies to human GPC3 protein were measured by Biacore and cell binding assays. As shown in FIG. 6A-FIG. 6C, the binding affinity of H1L1/1a3b2b1 and H1L3/1a3b2b1 (that is, H1L1/CD3OPT1a3b2b1 and H1L3/CD3OPT1a3b2b1; or H1L1/CD3 1a3b2b1 and H1L3/CD3 1a3b2b1) to human GPC3 protein were 0.07 nM and 0.2 nm in Biacore analysis (FIG. 6A-FIG. 6B), and there was no significant difference between GPC3/CD3 bispecific antibodies with parental chimeric GPC3 clone 40 and GPC3/CD3 bispecific antibodies with humanized GPC3 antibodies in the cell based assay (FIG. 6C). In addition, the humanized GPC3 antibodies were also titrated against cynomolgus GPC3 protein in ELISA assay and both H1L1 and H1L3 had cross reactivity with cynomolgus GPC3 similar to parental clone 40. The data confirmed that humanization of the chimeric GPC3 antibodies did not change binding affinity to Human or cynomolgus monkey GPC3.

As T-cell bispecific antibodies may induce cytokine release syndrome and result in severe infusion-related reaction, the major challenge for T-cell bispecific antibody development is how to substantially reduce cytokine release but retain a significant cytotoxic activity.

The resultant humanized GPC3/CD3 bispecific antibodies H1L1/CD3, H1L1/CD3OPT1a3b, H1L1/CD3OPT1a3b2b1, H1L3/CD3, H1L3/CD3OPT1a3b, and H1L3/CD3OPT1a3b2b1, in which OPT CD3 binders were fully characterized by cytotoxicity and cytokine release assays in the generation of our other (non-GPC3) bispecific antibody programs (see U.S. Ser. No. 62/974,744 or PCT/CN2020/136452). As expected, the combination of humanized anti-GPC3 antibody with mutant CD3 binders CD31a3b (EC50, H1L1: 0.01 nM and H1L3: 0.004 nM) and CD3 1a3b2b1 (EC50, H1L1: 0.0076 nM and H1L3: 0.00086 nM) that have lower binding affinity to CD3 reduced cytotoxic activity as compared to pairing with wild-type CD3 binder (EC50, H1L1: 0.00036 nM and H1L3: 0.00013 nM) in coculture of activated PBMCs (FIG. 7A, FIG. 7B) and freshly isolated PBMCs (FIG. 7C, FIG. 7D), but the remaining cytotoxic activity was still significant. To analyze the cytokines release alone in the co-culture of humanized GPC3/CD3 BsAb-treated PBMC and tumor target cell, supernatants of cell cultures were analyzed for IFN-γ, TNF-α, and IL-2 by ELISA assays. Clearly, lower levels of IFN-γ (112 fold reduction for H1L1/CD3 1a3b and 178 fold reduction for H1L1/CD31a3b2b1 construct) (FIG. 8A, FIG. 8B), TNF-α (100 fold reduction for H1L1/CD31a3b and 62 fold reduction for H1L1/CD3 1a3b2b1 construct) (FIG. 8C, FIG. 8D), and IL-2 (FIG. 8E, FIG. 8F) release were observed in GPC3/CD3 1a3b and GPC3/1a3b2b1 BsAbs as compared to humanized GPC3/CD3 bispecific antibodies. This data indicated that the binding affinity to CD3 in GPC3/CD3 BsAbs had a significant effect on cytokines production as wild-type CD3 binder has a higher binding affinity to CD3 than CD3OPT1a3b and CD3OPT1a3b2b1 mutant CD3 binders. Furthermore, although H1L3 and H3L3 pairs induced better cytotoxicity than H1L1, L1 has a higher sequence similarity to human Ig.

Example 8. In Vivo Efficacy Study of Humanized Anti-GPC3/CD3 Bispecific Antibodies We evaluated the effect of humanized anti-GPC3/CD3 bispecific antibodies on tumor development in an in vivo xenograft model. NSG mice were injected subcutaneously on the right flank at day 0 with HepG2 cells followed by healthy human donor PBMC administration intravenously once tumor growth reaches 70-100 mm³. Vehicle (PBS) or treatment antibodies (i.e. humanized anti-GPC3/CD3 bispecific antibodies) were administered intravenously twice a week for the next 14 days starting from the time of PBMC administration. In order to measure anti-tumor response, tumor growth was measured twice weekly with a caliper and calculated. As shown in FIG. 9A, humanized anti-GPC3/CD3 bispecific antibodies H1L1-CD3 1a3b, H1L3-CD3 1a3b and H1L3-CD3 inhibited HepG2 induced tumor growth at a 2 mg/kg dose compared to PBS control group. The study was terminated on Day 19 due to PBMC-induced GVHD development.

Figure 9B:
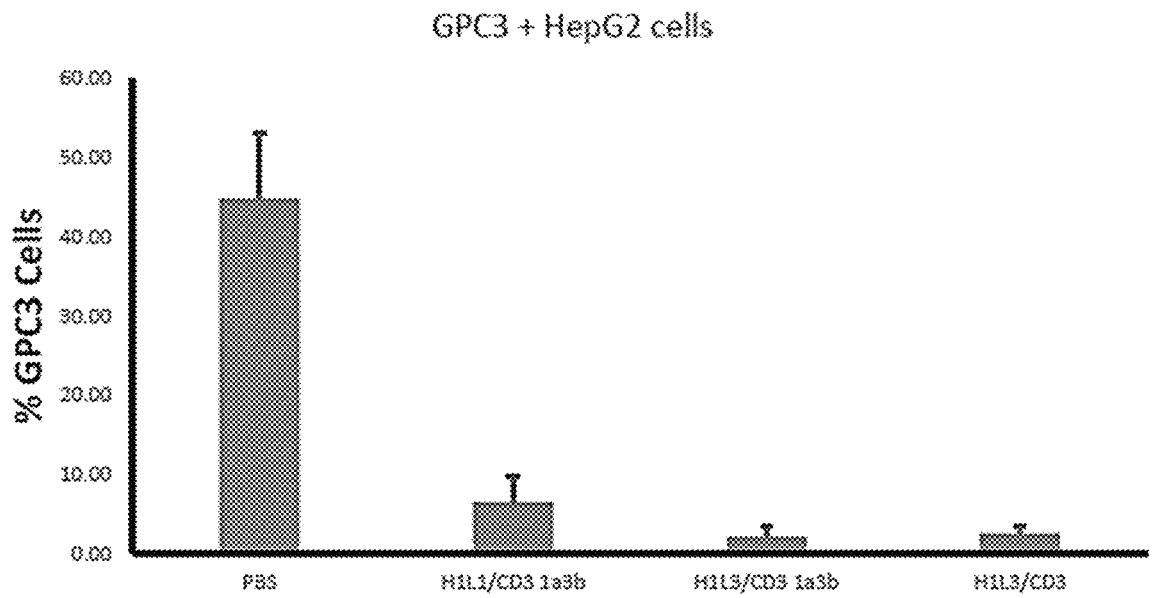
FIG. 9B: GPC3-positive cells recovered from HepG2 induce xenograft model at study end point. GPC3-positive cells were significantly higher in PBS control group compared to the antibody treatment groups.

Tumor was collected at study end point and investigated for GPC3 expression in tumor cells. Interestingly, 45% of tumor cells were GPC3-positive in the PBS treatment group compared to only 6.43%, 2.13% and 2.5% GPC3-positive cells observed in the H1L1-CD3 1a3b, H1L3-CD3 1a3b and H1L3-CD3 groups respectively (FIG. 9B). This explains the observed absence of complete regression in antibody treatment groups in vivo.

Example 9. Studies on an Anti-GPC3 Chimeric Antigen Receptor 9.1 Preparation of Chimeric Antigen Receptor Gene Fragments The present application designs fusion gene fragments of the anti-GPC3 chimeric antigen receptor through gene synthesis technology in the order of the following coding genes: CD8α signal peptide coding gene, anti-GPC3 scFv VH-linker-anti-GPC3 scFv VL coding genes, CD8 hinge region coding gene, CD8 transmembrane (TM) region coding gene, and 4-1BB and CD3ζ intracellular signal regions coding genes. The expressed chimeric antigen receptor has the amino acid structure of scFv VH-linker-scFv VL-CD8hinge-CD8TM-4-1BB-CD3ζ. The sequence of linker is GGGGSGGGGSGGGGS, the sequence of the CD8α signal peptide is SEQ ID NO: 29, the sequence of the CD8 hinge region is SEQ ID NO: 30, the sequence of the CD8 transmembrane region (CD8TM) is SEQ ID NO: 31, the 4-1BB sequence is SEQ ID NO: 32, and the CD3ζ sequence is SEQ ID NO: 33.

Figure 10:
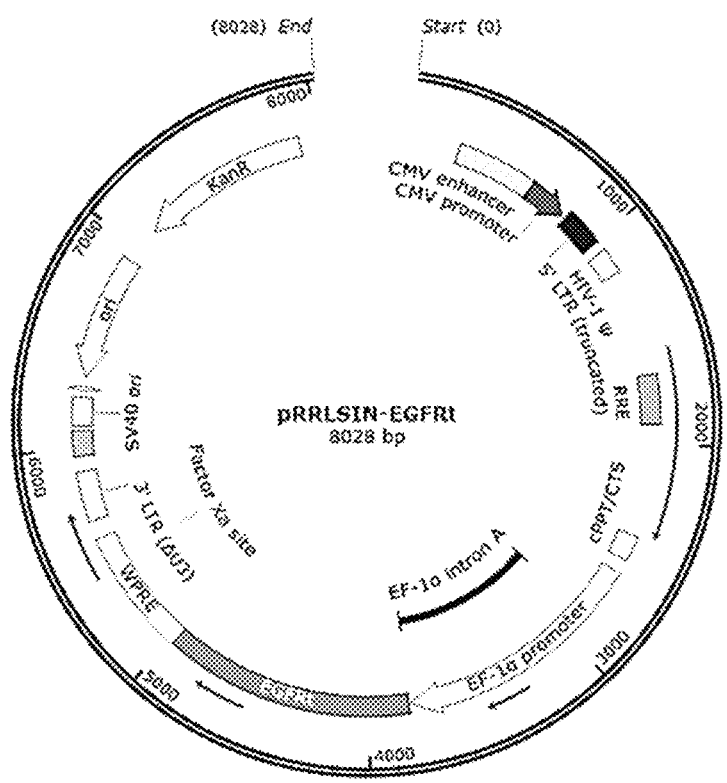
FIG. 10. A schematic diagram of the structure of plasmid pRRLSIN-EGFRt.

The pRRLSIN lentiviral vector was synthesized by a whole gene of the pRRLSIN lentiviral vector. The vector contains a human EF1a promoter, and the GFP (green fluorescent protein) sequence was replaced with the EGFRt marker protein sequence to obtain the pRRLSIN-EGFRt vector (see FIG. 10).

9.2 Construction of Chimeric Antigen Receptor Lentiviral Expression Vector

The vector system used in this example belongs to the third-generation of self-inactivating lentiviral vector systems. The system consists of three plasmids, packaging plasmids pMDLg-pRRE encoding Gag/Pol protein, pRSV-rev encoding Rev protein; and an envelope plasmid PMD2.G encoding VSV-G protein.

Figure 11:
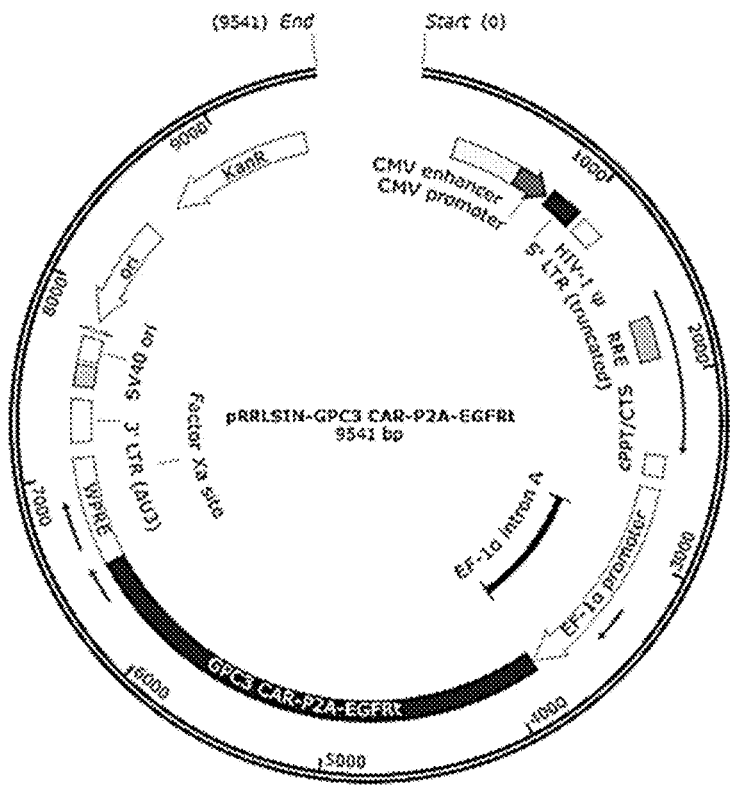
FIG. 11. A schematic diagram of the structure of the recombinant plasmid pRRLSIN-GPC3 CAR-P2A-EGFRt.

In this example, a lentiviral expression vector that co-expressed the specific CAR (i.e. the anti-GPC3 chimeric antigen receptor) and EGFRt (SEQ ID NO:35) linked by P2A (SEQ ID NO:34) was constructed by linking the target gene obtained in Section 9.1 to the pRRLSIN-EGFRt vector. A recombinant plasmid was formed and named pRRLSIN-GPC3 CAR-P2A-EGFRt (see FIG. 11). The specific structure is pRRLSIN-CD8α-scFv VH-linker-scFv VL-CD8hinge-CD8TM-4-1BB-CD3ζ-P2A-EGFRt. After verification by enzyme digestion and sequencing, the successfully constructed vector was ready to package. CAR-P2A-EGFRt was transcribed into a single mRNA, but finally translated into two peptide chains of EGFRt and anti-GPC3 chimeric antigen receptor. Anti-GPC3 CAR was located on the cell membrane under the direction of the CD8α signal peptide.

The control was named as GC33 Benchmark, which was obtained by fusing GC33 CAR, P2A and EGFRt in tandem. The amino acid sequence of GC33 CAR is set forth in SEQ ID NO: 36.

The target CAR structures obtained in this example are as follows:
- scFv clone40VH-clone 40VL-CD8hinge-CD8TM-4-1BB-CD3ζ-P2A-EGFRt (G8)
- scFv VH1-VL1-CD8hinge-CD8TM-4-1BB-CD3ζ-P2A-EGFRt (VH1-VL1)
- scFv VH1-VL2-CD8hinge-CD8TM-4-1BB-CD3ζ-P2A-EGFRt (VH1-VL2)
- scFv VH1-VL3-CD8hinge-CD8TM-4-1BB-CD3ζ-P2A-EGFRt (VH1-VL3)
- scFv VH2-VL1-CD8hinge-CD8TM-4-1BB-CD3ζ-P2A-EGFRt (VH2-VL1)
- scFv VH2-VL2-CD8hinge-CD8TM-4-1BB-CD3ζ-P2A-EGFRt (VH2-VL2)
- scFv VH2-VL3-CD8hinge-CD8TM-4-1BB-CD3ζ-P2A-EGFRt (VH2-VL3)
- scFv VH3-VL1-CD8hinge-CD8TM-4-1BB-CD3ζ-P2A-EGFRt (VH3-VL1)
- scFv VH3-VL2-CD8hinge-CD8TM-4-1BB-CD3ζ-P2A-EGFRt (VH3-VL2)
- scFv VH3-VL3-CD8hinge-CD8TM-4-1BB-CD3ζ-P2A-EGFRt (VH3-VL3) GC33 CAR-P2A-EGFRt (GC33 Benchmark)

9.3 Preparation of Chimeric Antigen Receptor Lentivirus

The pRRLSIN-GPC3 CAR-P2A-EGFRt expression plasmid and pMDLg-pRRE, pRSV-rev and pMD2. G helper plasmids were extracted and mixed with the transfection reagent polyethyleneimine (PEI) in a certain ratio to co-transfect 293T cells. The main steps are as follows:

(1) 293T cells (ATCC CRL-3216) cultured to 5-8 generations were inoculated at a cell density of $7 \times 10^6$ in a 75 cm$^3$ cell culture flask with DMEM medium (purchased from GIBCO) containing 10% FBS (purchased from GIBCO). The cells were mixed well and put in a $CO_2$ incubator for 24 hours to prepare for transfection. The culture conditions were 37° C. and 5% $CO_2$. The next day, cell confluence of about 70-80% was observed, and 293T cells were ready for transfection.

(2) After 24 h, the target expression plasmid pRRLSIN-GPC3 CAR-P2A-EGFRt was mixed with pMDLg-pRRE, pRSV-rev and pMD2. G auxiliary plasmid according to a ratio of 4:3:2:2, and diluted with an Opti-MEM medium (purchased from GIBCO) to obtain a solution A. PEI dilution solution was prepared according to a ratio of total plasmid: PEI=3:1, and diluted with the Opti-MEM medium to obtain a solution B. The liquid A and liquid B were mixed and incubated at room temperature for 15 minutes so as to obtain plasmid-PEI mixture.

TABLE 11

| Relevant sequences of CAR structures | |
|---|---|
| CD8α signal peptide | MALPVTALLLPLALLLHAARP (SEQ ID NO: 29) |
| CD8 hinge | TTTPAPRPPTPAPTIASQPLSLRPEACRPAAGGAVHTRGLDFACDIY (SEQ ID NO: 30) |
| CD8 transmembrane region (CD8TM) | IWAPLAGTCGVLLLSLVITLYC (SEQ ID NO: 31) |
| 4-1BB | KRGRKKLLYIFKQPFMRPVQTTQEEDGCSCRFPEEEEGGCEL (SEQ ID NO: 32) |
| CD3ζ | RVKFSRSADAPAYKQGQNQLYNELNLGRREEYDVLDKRRGRDPE MGGKPRRKNPQEGLYNELQKDKMAEAYSEIGMKGERRRGKGHDG LYQGLSTATKDTYDALHMQALPPR (SEQ ID NO: 33) |
| P2A | GSGATNFSLLKQAGDVEENPGP (SEQ ID NO: 34) |
| EGFRt | LLLVTSLLLCELPHPAFLLIPACGADSYEMEEDGVRKCKKCEGPCR KVCNGIGIGEFKDSLSINATNIKHFKNCTSISGDLHILPVAFRGDSFT HTPPLDPQELDILKTVKEITGFLLIQAWPENRTDLHAFENLEIIRGRT KQHGQFSLAVVSLNITSLGLRSLKEISDGDVIISGNKNLCYANTINW KKLFGTSGQKTKIISNRGENSCKATGQVCHALCSPEGCWGPEPRDC VSCRNVSRGRECVDKCNLLEGEPREFVENSECIQCHPECLPQAMNIT CTGRGPDNCIQCAHYIDGPHCVKTCPAGVMGENNTLVWKYADAG HVCHLCHPNCTYGCTGPGLEGCPTNGPKIPSIATGMVGALLLLLVV ALGIGLFMRRRHIV (SEQ ID NO: 35) |
| GC33 CAR | DVVMTQSPLSLPVTPGEPASISCRSSQSLVHSNANTYLHWYLQKPG QSPQLLIYKVSNRFSGVPDRFSGSGSGTDFTLKISRVEAEDVGVYYC SQNTHVPPTFGQGTKLEIKRGGGGSGGGGSGGGGSQVQLVQSGAE VKKPGASVKVSCKASGYTFTDYEMHWVRQAPGQGLEWMGALDP KTGDTAYSQKFKGRVTLTADESTSTAYMELSSLRSEDTAVYYCTRF YSYTYWGQGTLVTVSSTTTPAPRPPTPAPTIASQPLSLRPEACRPAA GGAVHTRGLDFACDIYIWAPLAGTCGVLLLSLVITLYCRSKRSRLL HSDYMNMTPRRPGPTRKHYQPYAPPRDFAAYRSKRGRKKLLYIFK QPFMRPVQTTQEEDGCSCRFPEEEEGGCELRVKFSRSADAPAYKQG QNQLYNELNLGRREEYDVLDKRRGRDPEMGGKPRRKNPQEGLYN ELQKDKMAEAYSEIGMKGERRRGKGHDGLYQGLSTATKDTYDAL HMQALPPR (SEQ ID NO: 36) |

(3) The plated 293T cells were taken out, and the plasmid-PEI mixture was slowly added to the cell supernatant medium. The resulting mixture was shaken gently and put in a $CO_2$ incubator for 4-6 hours. The culture conditions were 37° C. and 5% $CO_2$. After culture, the medium was replaced with a fresh DMEM medium containing 10% FBS.

(4) After 48 h and 96 h post-transfection, the cell culture supernatant containing the virus was collected and centrifuged at 3000 rpm for 5 min at 4° C. After filtering the supernatant through a 0.45 μm filter, it was mixed with PEG8000/NaCl at a ratio of 4:1. After standing at 4° C. for 2 to 3 hours, it was centrifuged at high speed for 30 minutes. The supernatant was discarded and the precipitate was resuspended with precooled T cell medium X-VIVO 15 (Lonza, 04-418Q) or PBS to give a virus concentrate which was stored at −80° C. for later use.

9.4 Lentivirus Titer Detection

Figure 12:
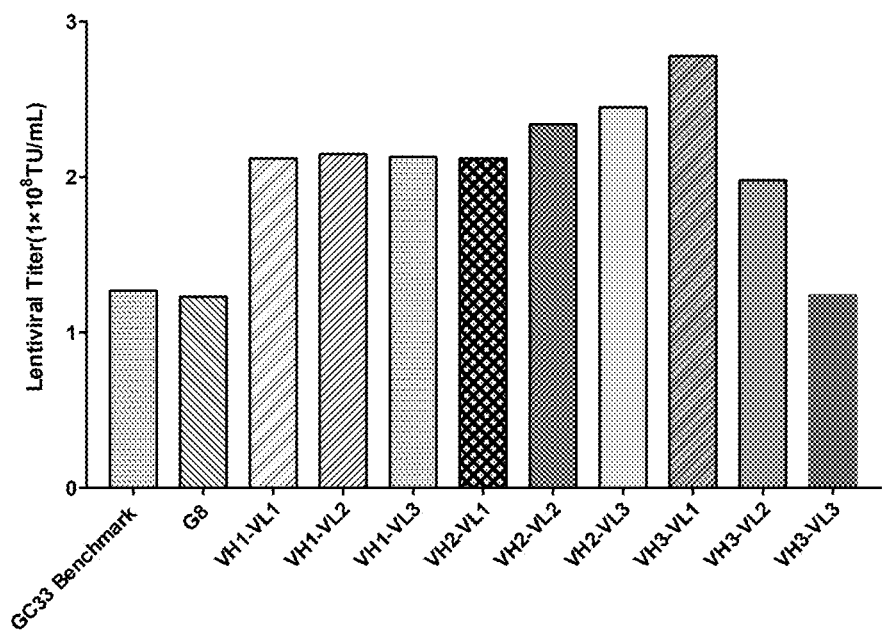
FIG. 12. Lentiviral activity titers of different chimeric antigen receptors.

In this example, a cell infection method was used to determine the biological activity titer of the lentivirus. The 293T cells were used for lentivirus activity assay, and $1\times10^5$ cells were inoculated to each well of a 24-well culture plate. 1 mL of fresh DMEM medium containing 10% FBS was added to each well. The mixture was diluted to a final concentration of 6 μg/mL with transfection additive Polybrene. The lentivirus concentrate was serially diluted by 3× to the 5th concentration, added at 1 μL/well in duplicate (two repeats for each lentivirus concentrate), and mixed well. The cells were incubated in a $CO_2$ incubator at 37° C./5% $CO_2$ for 24 h. After 24 h, the cells were digested, and the positive rate of protein expression of CAR or EGFRt was detected by a flow cytometer using an anti-human IgG(Fab)$_2$ (Jackson ImmunoResearch, 109-065-006) or anti-human EGFRt (Biolegend, 352904) flow dye. The titer was calculated by the following formula: Lentiviral activity titer (TU/mL)=positive rate×dilution factor×100×$10^5$. The activity titer of lentiviral concentrates of the above CARs (G8, VH1-VL1, VH1-VL2, VH1-VL3, VH2-VL1, VH2-VL2, VH2-VL3, VH3-VL1, VH3-VL2, VH3-VL3, GC33 Benchmark) packaged by PEI transfection method were greater than $1\times10^8$ TU/mL (FIG. 12).

9.5 Preparation of T lymphocytes

Peripheral blood mononuclear cells (PBMCs) purchased from AllCells were marked with microbeads through a CD3 MicroBeads human-lyophilized Kit (purchased from Miltenyi Biotech). CD3+ T lymphocytes with high purity were selected, with a proportion of CD3 positive T cells over 95%. The purified T cells were activated and proliferated using a human CD3/CD28 T cell activator (Dynabeads Human T-Activator CD3/CD28, Thermo Fisher, 11132D).

9.6 Lentivirus Transduces T lymphocytes

CAR-T cells were obtained by transducing T cells with the lentivirus prepared in Section 9.3. T lymphocytes in Section 9.5 were stimulated for 24-48 hours, then microscopic examination was performed to observe whether T lymphocytes were activated. After activation, the T lymphocytes became larger in volume and elongated or irregular in shape. The activated T lymphocytes were collected, centrifuged and resuspended in a T cell medium X-VIVO 15 (Lonza, 04-418Q) with a final concentration of 10 ng/mL IL-7 and 5 ng/mL IL-15. The final volume was 1 mL, and added into a 12-well culture plate. The lentivirus was diluted to MOI=5 with the same medium and mixed with $1\times10^6$ activated T lymphocytes for infection. The cells and the lentivirus mixture were mixed thoroughly and added to the 24-well plate, placed in a 37° C., 5% $CO_2$ incubator and incubated overnight. The next day, the cells were centrifuged again and the medium was refreshed. The cell density was measured every 2 days thereafter, and the cells were further expanded with the cell density controlled at NMT $2\times10^6$ cells/mL. After 48-72 h of lentivirus infection, the expression of different chimeric antigen receptors was detected by flow cytometry. With non-transduced T lymphocytes as a negative control, the positive rates of T lymphocytes expressing different chimeric antigen receptors are shown in Table 12.

TABLE 12

| \multicolumn{2}{c}{Positive rates of T lymphocytes expressing different chimeric antigen receptors} | |
|---|---|
| CAR | CAR Positive rate |
| G8 | 18.8% |
| GC33 Benchmark | 12.2% |
| VH1-VL1 | 73.9% |
| VH1-VL2 | 78.2% |
| VH1-VL3 | 79.7% |
| VH2-VL1 | 68.9% |
| VH2-VL2 | 74.2% |
| VH2-VL3 | 74.0% |
| VH3-VL1 | 69.7% |
| VH3-VL2 | 75.4% |
| VH3-VL3 | 80.7% |

After being infected with lentivirus packaging different chimeric antigen receptors, T lymphocytes were cultured to about 300-fold expansion on the 9th day, indicating that T lymphocytes expressing different chimeric antigen receptors could be expanded in vitro to a certain extent, providing a guarantee that sufficient quantities could be produced for subsequent in vitro functional studies and in vivo drug efficacy studies in animals.

9.7 In Vitro Toxicity Test

Hepatocellular Carcinoma Tumor Cell

Human HCC cell lines (HepG2, SK-HEP-1) were obtained from ATCC. These cell lines were tested and authenticated by DNA profiling for polymorphic short tandem repeat markers. HCC cells were cultured in DMEM supplemented with 10% FBS. All cells were routinely tested for mycoplasma contamination. Surface GPC3 expression on various human HCC cell lines were detected by flow cytometry.

Target Specific Test

Figure 13:
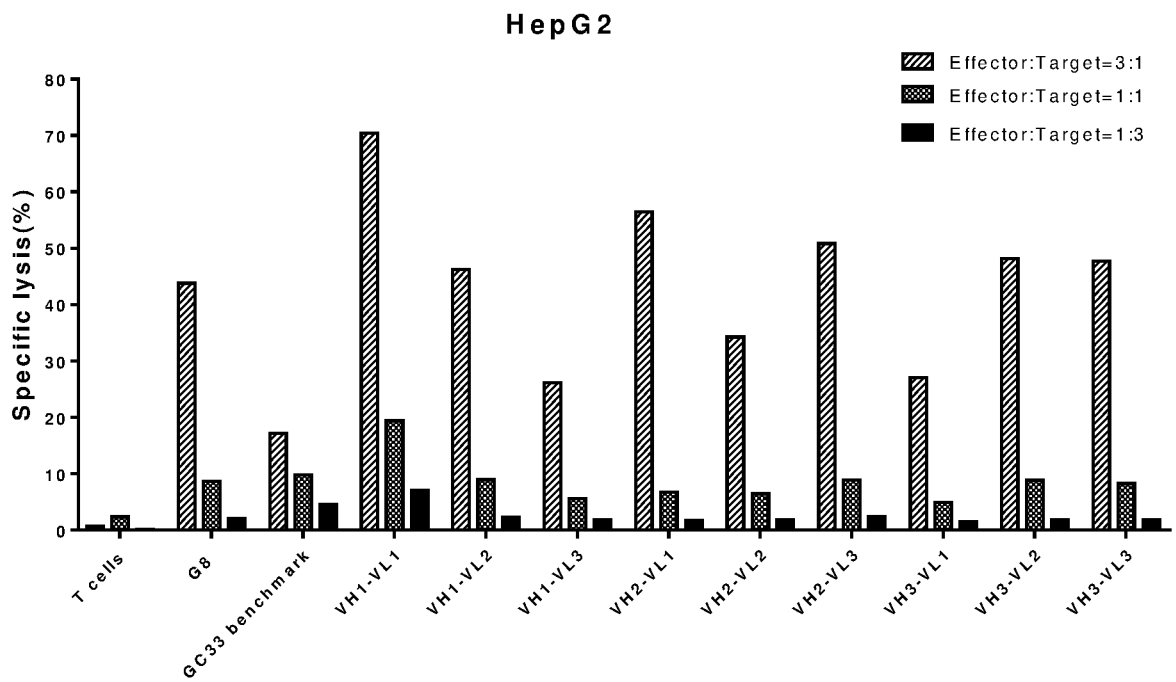
FIG. 13. Test results of the specific killing ability of different chimeric antigen receptors on GPC3-positive tumor cells.
Figure 14:
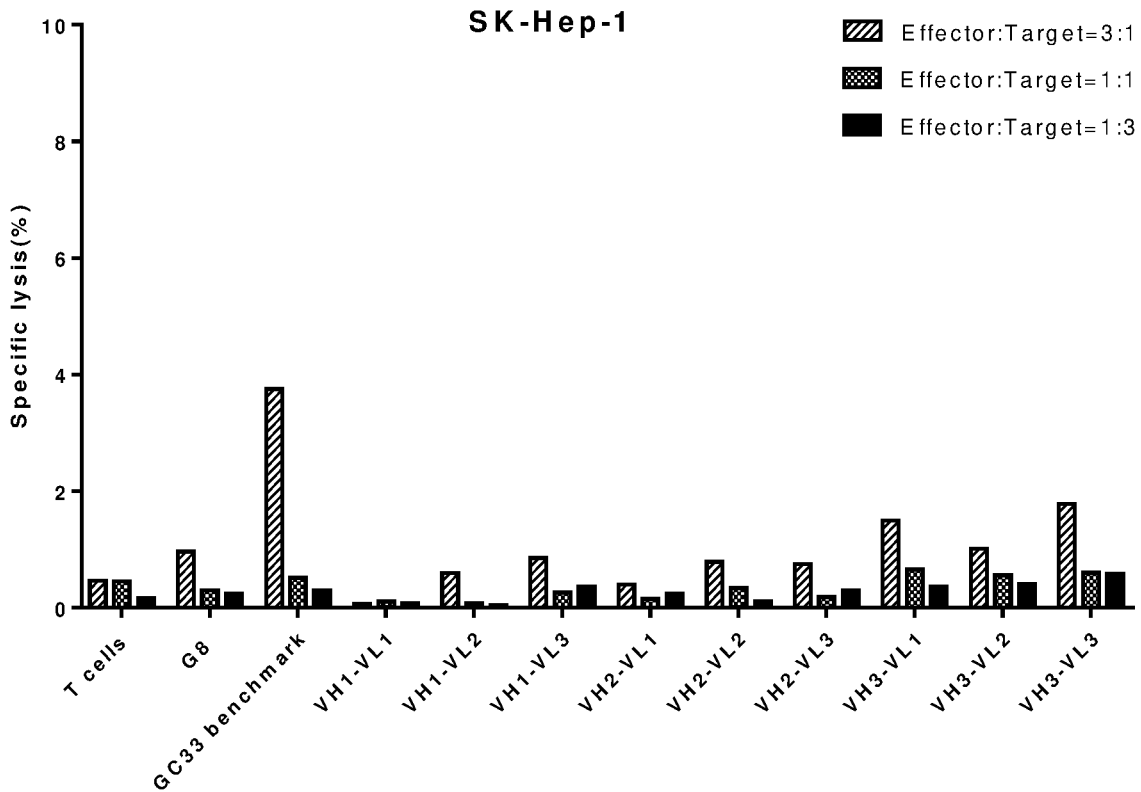
FIG. 14. Test results of the specific killing ability of different chimeric antigen receptors on GPC3-negative tumor cells.
Figure 15:
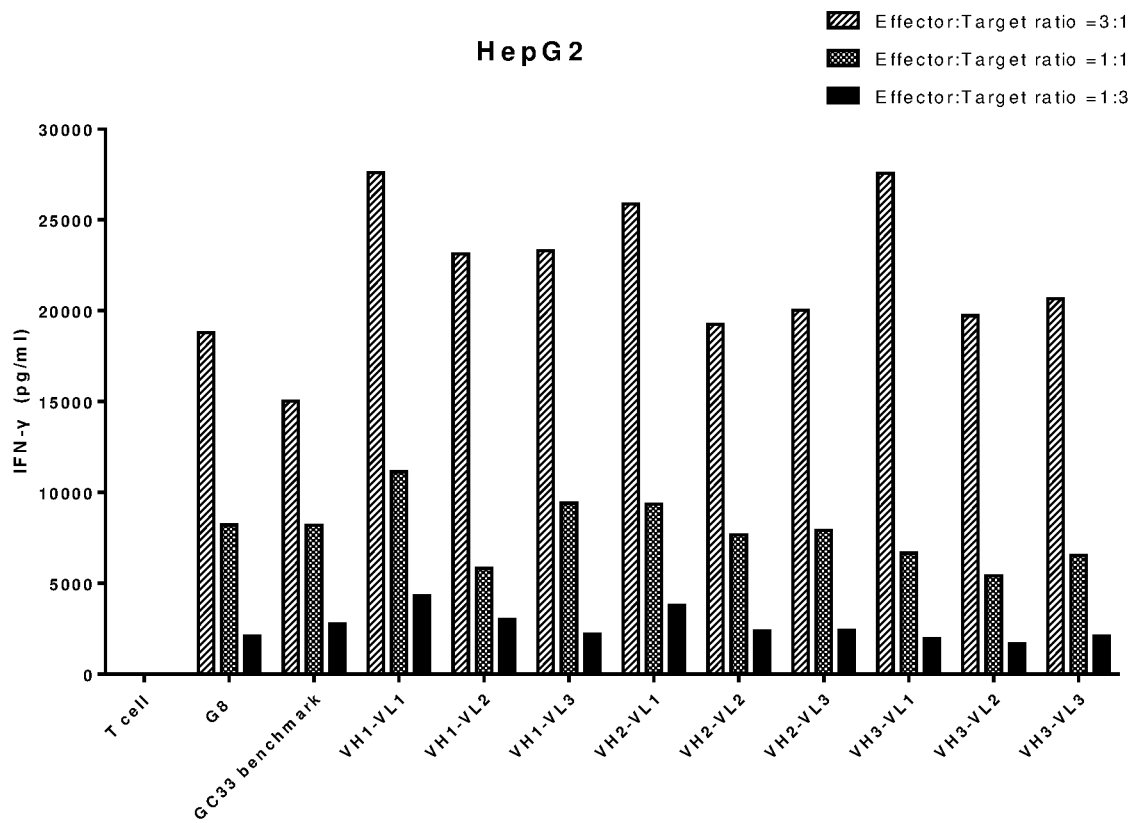
FIG. 15. Test results of IFN-gamma cytokine released in the supernatant of anti-GPC3 CAR-T co-cultured with GPC3-positive tumor cells.
Figure 16:
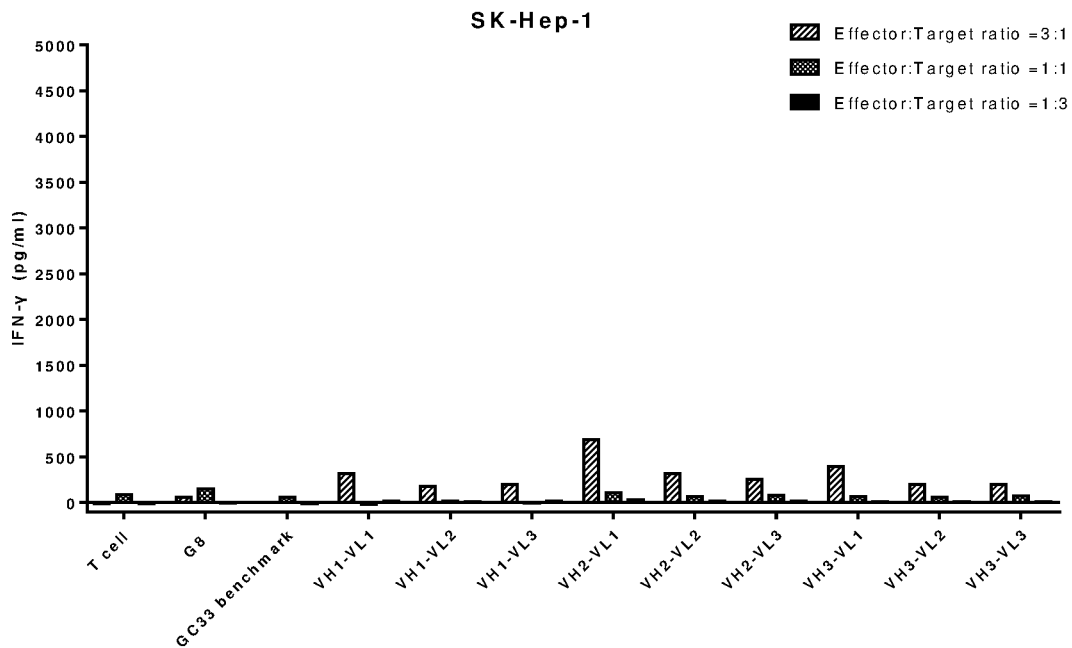
FIG. 16. Test results of IFN-gamma cytokine released in the supernatant of anti-GPC3 CAR-T co-cultured with GPC3-negative tumor cells.

In this example, HepG2 cells (purchased from ATCC, HTB-8065) overexpressing GPC3 protein were used as target cells, SK-HEP-1 cells (purchased from ATCC, HTB-52) which do not express GPC3 protein were used as negative target cells and anti-GPC3 CAR-T cells were used as effector cells according to different E:T (effector cell: target cell) ratios (e.g. 3:1,1:1,1:3). The results of in vitro experiments (FIG. 13) show that by co-culturing anti-GPC3 CAR-T (G8, VH1-VL1, VH1-VL2, VH1-VL3, VH2-VL1, VH2-VL2, VH2-VL3, VH3-VL1, VH3-VL2, VH3-VL3, GC33 Benchmark) with HepG2 cells for 18 h, the efficiency of killing tumor cells (i.e. specific lysis) can reach 20%-50% at 24 h (Table 13). FIG. 14 and Table 14 show the results of the specific killing ability of different CAR-T cells on GPC3-negative tumor cells. At the same time, the CAR-T specific response was evaluated by detecting the content of cytokine (IFN-gamma) in the supernatant of the culture medium. After co-culturing anti-GPC3 CAR-T (G8, VH1-VL1, VH1-VL2, VH1-VL3, VH2-VL1, VH2-VL2, VH2-VL3, VH3-VL1, VH3-VL2, VH3-VL3, GC33 Benchmark) with HepG2 cells for 18 h, the IFN-gamma cytokine levels released in the co-culture supernatant was consistent with the killing test results (FIG. 15, Table 15). The specific lysis ability and IFN-gamma cytokine released in the supernatant of the VH1-VL1 group was significantly higher than those in other CAR groups. FIG. 16 and Table 16 show the results of IFN-gamma cytokine released in the supernatant of anti-GPC3 CAR-T co-cultured with GPC3-negative tumor cells.

The following specific killing detection method was used: an LDH Release Assay Kit (Dojindo, CK12) was used for assay, which is an INT chromogenic reaction catalyzed by diaphorase, and measures the activity of LDH released during cytotoxicity via colorimetry. Damage to the cell membrane structure caused by cell apoptosis or necrosis will lead to release of enzymes in cytoplasm into the cultures, including lactate dehydrogenase (LDH) with relatively stable enzymatic activity. The cytotoxicity can be quantitatively analyzed by activity assay of LDH released from lysed cells into the cultures. LDH release is considered to be an important indicator of cell membrane integrity and is widely used as a cytotoxicity assay.

The following cytokine detection method was used: Human IFN-gamma ELISA kit (R&D Systems, SIF50) was used for measuring cytokines, which is based on the immobilization of an antigen or antibody and enzymatic labeling of the antigen or antibody. The antigen or antibody that binds to the surface of a solid carrier retains immunological activity, while the enzyme labeled antigen or antibody retains both immunological activity and enzymatic activity. During the assay, the test substance (the antigen or antibody) in the sample are bound to the immobilized antibody or antigen. Non-binding substances are removed by washing, and the enzyme-labeled antigen or antibody is added. In this case, the amount of enzyme immobilized is associated with the amount of the test substance in the sample. After a substrate that reacts with the enzyme is added for color development, the content of the test substance in the sample could be judged by the color for qualitative or quantitative analysis.

TABLE 13

Results of the specific killing ability of different cells on GPC3-positive tumor cells

| Specific lysis (%) | Effector to Target ratio | | |
|---|---|---|---|
| | 3:1 | 1:1 | 1:3 |
| G8 | 43.81% | 8.66% | 2.01% |
| GC33 Benchmark | 17.17% | 9.78% | 4.57% |
| VH1-VL1 | 70.41% | 19.37% | 6.99% |
| VH1-VL2 | 46.19% | 8.94% | 2.24% |
| VH1-VL3 | 26.12% | 5.58% | 1.81% |
| VH2-VL1 | 56.49% | 6.72% | 1.73% |
| VH2-VL2 | 34.24% | 6.40% | 1.85% |
| VH2-VL3 | 50.82% | 8.85% | 2.33% |
| VH3-VL1 | 27.05% | 4.89% | 1.50% |
| VH3-VL2 | 48.14% | 8.80% | 1.79% |
| VH3-VL3 | 47.6% | 8.26% | 1.81% |

TABLE 14

Results of the specific killing ability of different cells on GPC3-negative tumor cells

| Specific lysis (%) | Effector to Target ratio | | |
|---|---|---|---|
| | 3:1 | 1:1 | 1:3 |
| G8 | 0.96% | 0.30% | 0.24% |
| GC33 Benchmark | 3.75% | 0.51% | 0.31% |
| VH1-VL1 | 0.07% | 0.10% | 0.07% |
| VH1-VL2 | 0.59% | 0.07% | 0.04% |
| VH1-VL3 | 0.85% | 0.26% | 0.36% |
| VH2-VL1 | 0.39% | 0.15% | 0.23% |
| VH2-VL2 | 0.79% | 0.33% | 0.10%3 |
| VH2-VL3 | 0.74% | 0.18% | 0.304% |
| VH3-VL1 | 1.49% | 0.65% | 0.36% |
| VH3-VL2 | 1.01% | 0.55% | 0.41% |
| VH3-VL3 | 1.78% | 0.60% | 0.58% |

TABLE 15

Results of IFN-gamma cytokine released in the supernatant of anti-GPC3 CAR-T cocultured with GPC3-positive tumor cells.

| IFN-gamma cytokine release | Effector to Target ratio | | |
|---|---|---|---|
| (pg/mL) | 3:1 | 1:1 | 1:3 |
| G8 | 18804.80 | 8216.72 | 2103.28 |
| GC33 Benchmark | 15021.38 | 8180.09 | 2761.31 |
| VH1-VL1 | 27612.18 | 11133.82 | 4331.44 |
| VH1-VL2 | 23127.24 | 5813.45 | 3021.09 |
| VH1-VL3 | 23304.62 | 9417.20 | 2189.11 |
| VH2-VL1 | 25867.36 | 9348.75 | 3792.64 |
| VH2-VL2 | 19251.72 | 7675.05 | 2386.92 |
| VH2-VL3 | 20025.15 | 7904.89 | 2415.53 |
| VH3-VL1 | 27571.58 | 6655.57 | 1956.82 |
| VH3-VL2 | 19723.78 | 5412.93 | 1689.79 |
| VH3-VL3 | 20670.78 | 6543.04 | 2110.36 |

TABLE 16

Results of IFN-gamma cytokine released in the supernatant of anti-GPC3 CAR-T cocultured with GPC3-negative tumor cells.

| IFN-gamma cytokine release | Effector to Target ratio | | |
|---|---|---|---|
| (pg/mL) | 3:1 | 1:1 | 1:3 |
| G8 | 59.08 | 146.29 | 0 |
| GC33 Benchmark | 5.64 | 60.83 | 0 |
| VH1-VL1 | 314.21 | 0 | 20.40 |
| VH1-VL2 | 178.82 | 16.58 | 7.31 |
| VH1-VL3 | 202.70 | 0 | 18.30 |
| VH2-VL1 | 690.03 | 109.55 | 27.91 |
| VH2-VL2 | 320.54 | 65.98 | 13.57 |
| VH2-VL3 | 254.74 | 80.37 | 15.97 |
| VH3-VL1 | 394.62 | 65.72 | 13.27 |
| VH3-VL2 | 195.91 | 56.94 | 8.54 |
| VH3-VL3 | 198.85 | 75.22 | 13.27 |

Based on in vitro cytotoxicity tests, it was shown that T lymphocytes expressing different chimeric antigen receptors can have good killing effects on GPC3-positive tumor cells, which provides a reasonable basis for the study of animal in vivo drug efficacy.

9.8 Animal Model Test

In this example, a pharmacodynamic model of immunodeficient mouse bearing Hepatocellular Carcinoma tumor was established. HepG2 cancer cell line was maintained in vitro as a monolayer culture in EMEM medium supplemented with 10% fetal calf serum in a humidified incubator at 37° C. in an atmosphere with 5% $CO_2$. The HepG2 tumor cells were routinely sub-cultured by trypsin-EDTA treatment three times a week. The HepG2 tumor cells in an exponential growth phase were harvested and counted for inoculation. $1 \times 10^7$ HepG2 tumor cells were injected into the skin of female NCG mice (purchased from GemPharmatech) based on in vivo studies. Anti-GPC3 CAR-T cells were administered on the 16th day after inoculation (tumor volume was around 80-120 $mm^3$), the solvent control group (Vehicle) was administered with 0.9% saline, the Mock T (T cells not transfected with plasmid) group was administered with $2 \times 10^7$ cells, anti-GPC3 CAR-T low dose and high-dose groups (positive cells) were administered with $3.00 \times 10^6$ and $1.00 \times 10^7$ respectively. The administration volume of solvent control group (Vehicle) was 200 µl The administration volume of Mock T and CAR-T groups was 100 µL. 6 animals were allocated in each group. Tumor volume was measured twice a week after administration; a tumor growth curve was drawn, TGI and T/C were calculated, and all tumors were photographed at the end of the experiment. Blood was collected before CAR-T administration (day-2), 2, 9 and 28 days after administration, and the copy number (VCN) of CAR in the peripheral blood of mice was detected by qPCR to confirm the expansion of CAR-T cells. The measurement of tumor size is conducted with a caliper and the tumor volume ($mm^3$) was estimated using the formula: $TV = 0.5 \times a \times b^2$, where "a" and "b" are long and short diameters of a tumor respectively.

Figure 17:
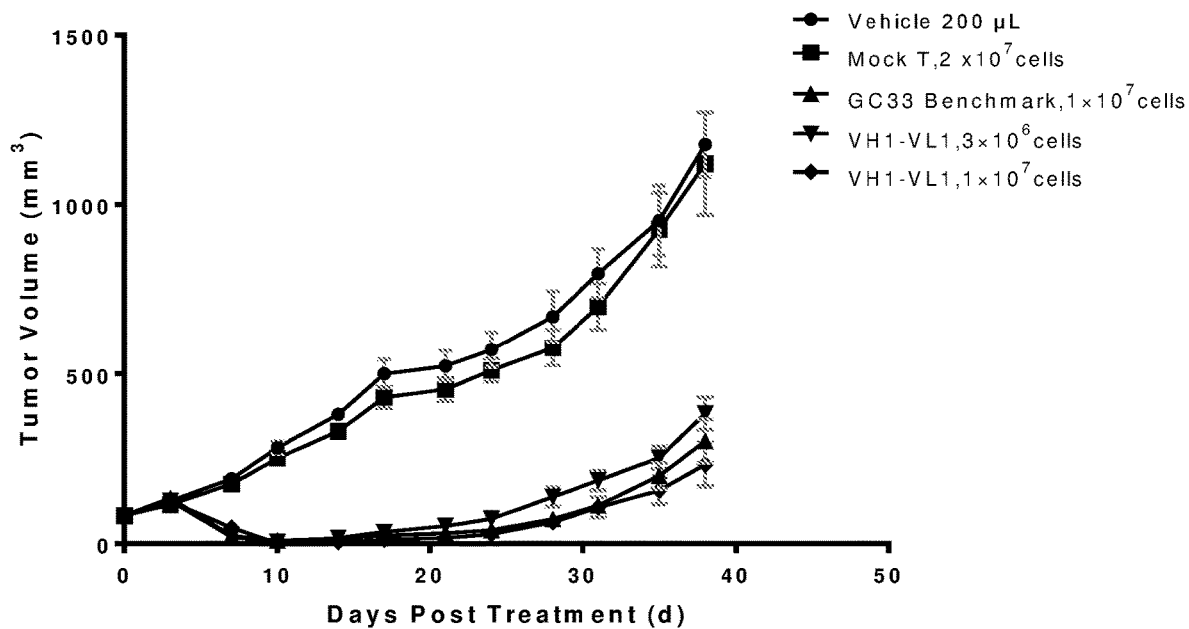
FIG. 17. Test results of anti-GPC3 CAR-T cells in female NCG mice carrying HepG2 tumor cells: tumor volume.

(1) Anti-tumor effect: The results showed that after 12 days of administration of CAR-T, the efficacy of each drug group was significant. Among them, the tumors of 6 mice in the high dose group of VH1-VL1 ($1 \times 10^7$ cells) completely regressed (6/6), 5 of 6 mice in the low dose group of VH1-VL1 ($3 \times 10^6$ cells) completely regressed (5/6), and 4 of 6 mice in the GC33 Benchmark group ($1 \times 10^7$ cells) completely regressed (4/6) (FIG. 17).

Figure 18:
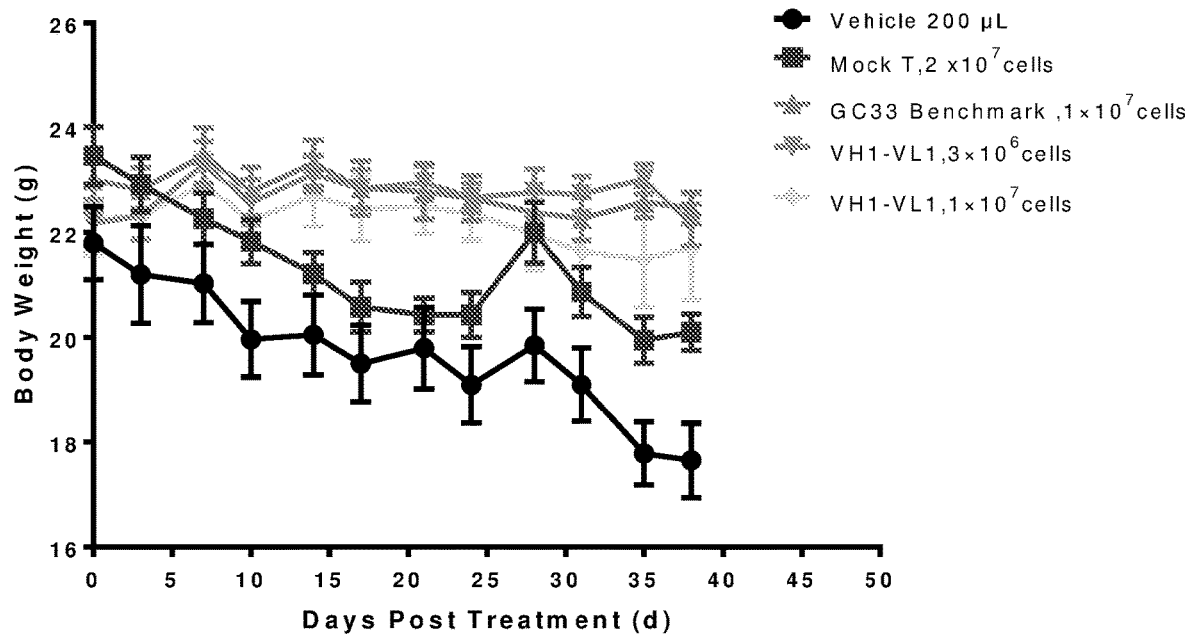
FIG. 18. Test results of anti-GPC3 CAR-T cells in female NCG mice carrying HepG2 tumor cells: body weight.

(2) Body weight: Due to the high tumor burden in mice, both the solvent control group (Vehicle) and Mock T group had a significant down-regulation of body weight on day 38. While compared with the solvent control group (Vehicle) and Mock T group, there was no significant change in body weight for the three CAR-T treatment groups. No obvious difference in body weight change was observed among the anti-GPC3 CAR-T treatment groups (VH1-VL1, $3 \times 10^6$ cells; VH1-VL1, $1 \times 10^7$ cells; GC33 Benchmark, $1 \times 10^7$ cells) (FIG. 18).

Figure 19:
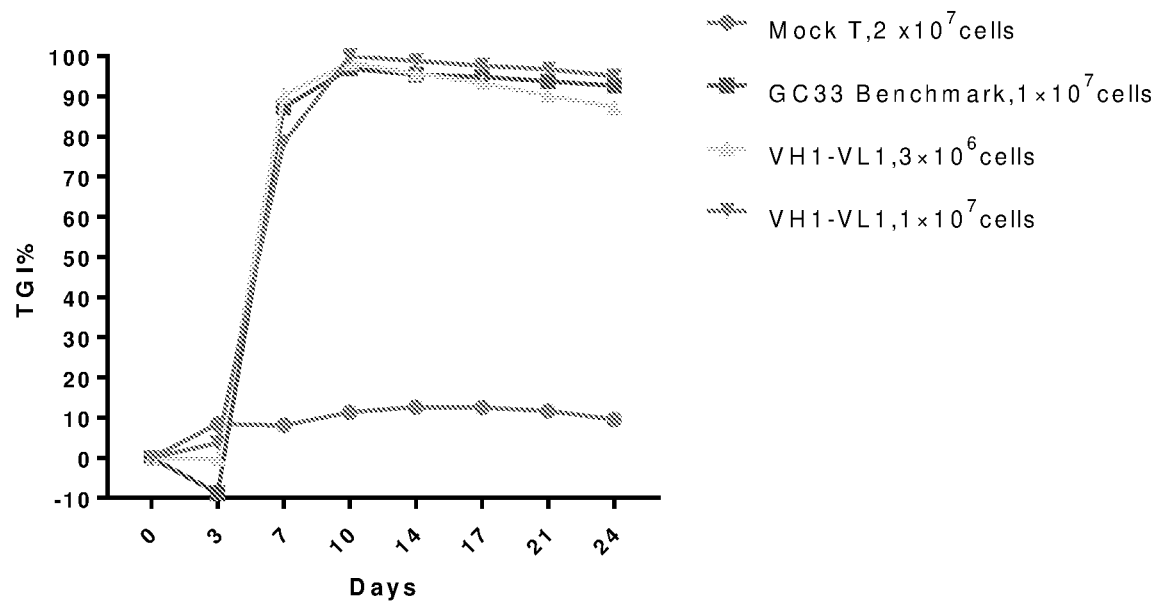
FIG. 19. Test results of anti-GPC3 CAR-T cells in female NCG mice carrying HepG2 tumor cells: tumor inhibition rate (TGI).

(3) Tumor inhibition rate (TGI) statistics: 10 days after CAR-T cell administration, the TGI of the high-dose group of VH1-VL1 ($1 \times 10^7$ cells) was higher than that of the low-dose group of VH1-VL1 ($3 \times 10^6$ cells) and GC33 Benchmark group ($1 \times 10^7$ cells) (FIG. 19).

Figure 20:
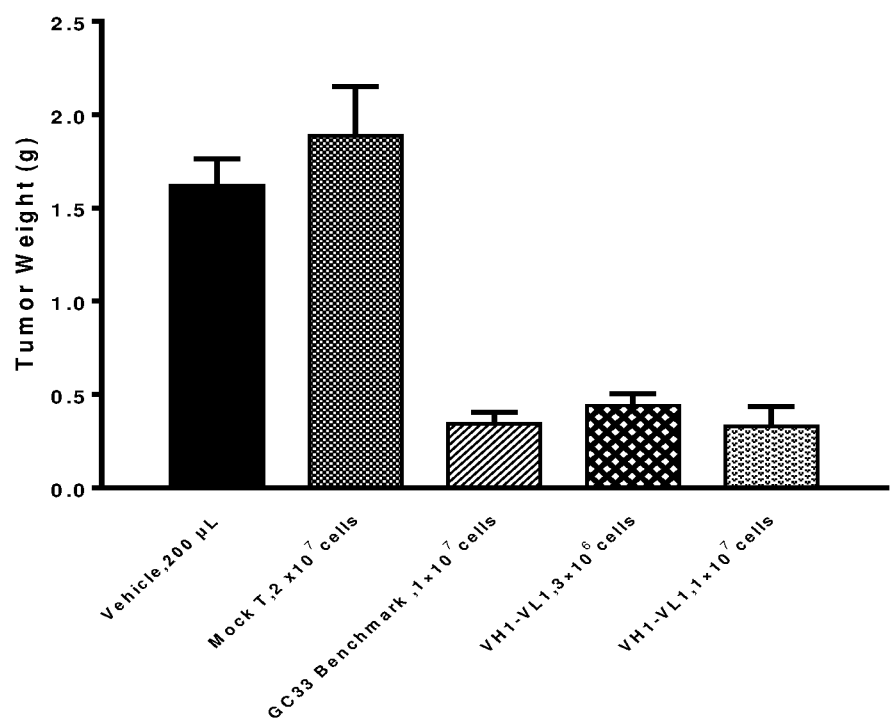
FIG. 20. Test results of anti-GPC3 CAR-T cells in female NCG mice carrying HepG2 tumor cells: tumor weight.

(4) Tumor weight: At the end of the experiment, the mice were sacrificed and the tumors were taken out and weighed. The tumor weights of anti-GPC3 CAR-T groups were lighter than solvent control group (Vehicle) and Mock T group (FIG. 20).

Figure 21:
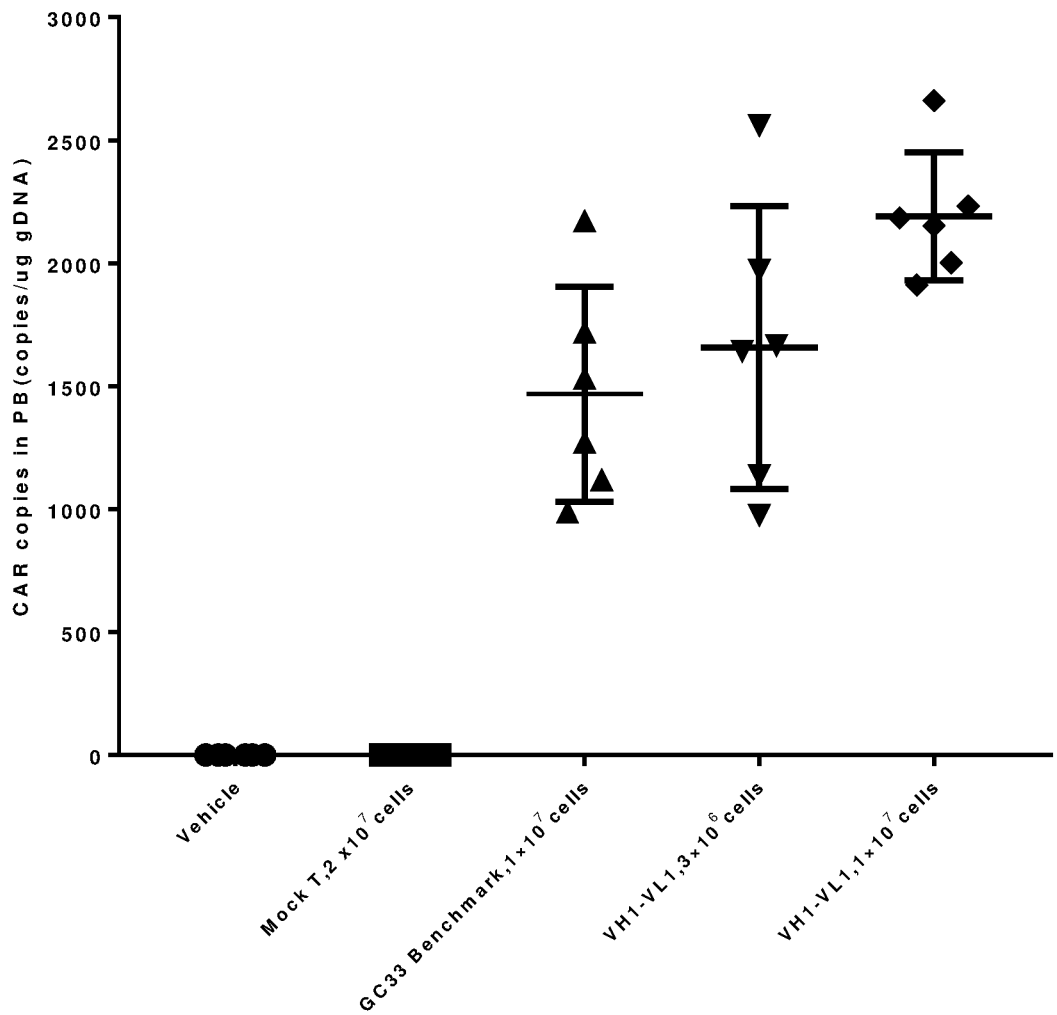
FIG. 21. CAR-T expansion in mouse peripheral blood on day 2, detected by a qPCR method.

(5) CAR-T expansion ability: CAR-T expansion in mouse peripheral blood detected by qPCR method shows that VH1-VL1 CAR-T has better expansion ability than GC33 Benchmark in an in vivo study (FIG. 21).

Other Embodiments

It is to be understood that while the disclosure has been described in conjunction with the detailed description thereof, the foregoing description is intended to illustrate and not limit the scope of the disclosure, which is defined by the scope of the appended claims. Other aspects, advantages, and modifications are within the scope of the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

CITATION LIST

1. Cao H, Phan H, and Yang L X. Improved chemotherapy for hepatocellular carcinoma. Anticancer Res. 2012; 32:1379-86.
2. Filmus J, Selleck S B. Glypicans: proteoglycans with a surprise. J.Clin Invest 2001; 108(4):497-501.
3. Wang Z Q. Fung M R. Barlow D P, and Wagner E F. Regulation of embryonic growth and lysosomal targeting by the imprinted IGF2/Mpr gene. Nature 1994. 372:464-467.
4. Lau M M, Stewart C E, Liu Z, Ghatt H, Rotwein P, and Stewart C L. Loss of the imprinted IGF2/cation-independent mannose 6-phosphate receptor results in fetal overgrowth and perinatal lethality. Genes Dev 1994. 8:2953-2963.
5. Ludwig T, Eggenschwiller J, Fisher P, D'Ercole A J, Devenport M L, and Efstratiadis A. Mouse mutants lacking the type 2 IGF receptor (IGF2R) are rescued from perinatal lethality in IGF2 and IGF1R null backgrounds. Dev Diol 1996. 177:517-535.
6. Filmus J. Capurro M. Glypican-3: a marker and a therapeutic target in hepatocellular carcinoma. FEBS J. 2013. 280(10):2471-6.
7. Suurs F, Lub-de Hoog M, De Ries E, De Groot D J. A review of bispecific antibodies and antibody constructs in oncology and clinical challenges. Pharmacol ther. 2019. 201:103-119.
8. Grupp S A, et al. Adoptive cellular therapy. Curr Top Microbiol Immunol., 2011; 344:149-72
9. Schmitz M, et al. Chimeric antigen receptor—T cells for immunotherapy of Cancer. J Biomed Biotechnol, 2010, doi:10.1155/2010/956304.
10. Dotti G. et al., CD28 costimulation improves expansion and persistence of chimeric antigen receptor modified T cells in lymphoma patients. J Clin Invest, 2011, 121 (5): 1822-1826.

The invention claimed is:

1. An antibody or antigen binding fragment thereof that specifically binds to a GPC3 protein, the antibody or antigen binding fragment thereof comprising a light chain variable region and a heavy chain variable region, wherein the heavy chain variable region comprises CDR1 having an amino acid sequence represented by SEQ ID NO. 1, CDR2 having an amino acid sequence represented by SEQ ID NO. 2 and CDR3 having an amino acid sequence represented by SEQ ID NO. 3, and the light chain variable region comprises CDR1 having an amino acid sequence represented by SEQ ID NO. 4, CDR2 having an amino acid sequence represented by SEQ ID NO. 5 and CDR3 having an amino acid sequence represented by SEQ ID NO. 6.

2. The antibody or antigen binding fragment thereof of claim 1, wherein the heavy chain variable region comprises an amino acid sequence that is at least about 95%, 96%, 97%, 98%, 99% or 100% identical to the amino acid sequence of SEQ ID NO. 7, and/or the light chain variable region comprises an amino acid sequence that is at least about 95%, 96%, 97%, 98%, 99% or 100% identical to the amino acid sequence of SEQ ID NO. 8 or SEQ ID NO. 9.

3. A bispecific antibody, comprising a first antibody or antigen binding fragment comprising the antigen binding fragment of claim 1, and a second antigen binding fragment that specifically binds to one or more subunits or structural domains of CD3.

4. The bispecific antibody of claim 3, wherein the first antibody or antigen binding fragment comprises two identical heavy chains and two identical light chain, and the second antigen binding fragment comprises two identical single chain antibody fragments (scFv), and wherein each of the light chains of the first antibody or antigen binding fragment is fused to the single chain antibody fragment (scFv) of the second antigen binding fragment directly or via a linker.

5. A chimeric antigen receptor (CAR), comprising the antibody or the antigen-binding fragment thereof of claim 1.

6. An isolated nucleic acid comprising a nucleic acid sequence encoding the antibody or antigen binding fragment thereof of claim 1.

7. A vector comprising the nucleic acid of claim 6.

8. An isolated host cell comprising the nucleic acid of claim 6.

9. A pharmaceutical composition, comprising the antibody or antigen binding fragment thereof of claim 1.

10. A method of treating cancer in a subject in need thereof, comprising administering to the subject the antibody or antigen binding fragment thereof of claim 1.

11. The antibody or antigen binding fragment of claim 1, wherein the antigen binding fragment is selected from a Fab fragment, a Fab' fragment, a Fab'-SH fragment, a F(ab')2 fragment, a Fv fragment and a scFv fragment.

12. The bispecific antibody of claim 3, wherein the second antigen binding fragment is selected from a scFv fragment, a Fv fragment, a F(ab')$_2$ fragment and a Fab' fragment.

13. The bispecific antibody of claim 4, wherein the single chain antibody fragment (scFv) comprises:
   a heavy chain variable region comprising an amino acid sequence of SEQ ID NO. 10, and a light chain variable region comprising an amino acid sequence of SEQ ID NO. 11;
   a heavy chain variable region comprising an amino acid sequence of SEQ ID NO. 12, and a light chain variable region comprising an amino acid sequence of SEQ ID NO. 11; or a heavy chain variable region comprising an amino acid sequence of SEQ ID NO. 14, and a light chain variable region comprising an amino acid sequence of SEQ ID NO. 11.

14. The CAR of claim 5, sequentially comprising the antibody or antigen-binding fragment thereof, an extracellular hinge region, a transmembrane region, and an intracellular signaling region.

15. The CAR of claim 14, wherein the extracellular hinge region is a CD8 hinge region, the transmembrane region is a CD8 transmembrane region, and the intracellular signaling region is 4-1BB and CD32.

16. The CAR of claim 15, wherein the extracellular hinge region comprises a CD8 hinge region as set forth in SEQ ID NO: 30, the transmembrane region comprises a CD8 transmembrane region as set forth in SEQ ID NO: 31, and the intracellular signaling region comprises 4-1BB as set forth in SEQ ID NO: 32 and CD35 as set forth in SEQ ID NO: 33.

17. The pharmaceutical composition of claim 9, wherein the pharmaceutical composition further comprises a pharmaceutically acceptable carrier.

18. The method of claim 10, wherein the cancer is a Glypican-3-positive cancer.

19. The method of claim 18, wherein the cancer is a solid cancer.

20. The method of claim 19, wherein the cancer is liver cancer, melanoma, ovarian clear cell carcinoma, yolk sac tumor or neuroblastoma.

* * * * *

UNITED STATES PATENT AND TRADEMARK OFFICE
CERTIFICATE OF CORRECTION

PATENT NO. : 12,492,252 B2
APPLICATION NO. : 18/014021
DATED : December 9, 2025
INVENTOR(S) : Avanish Varshney et al.

Page 1 of 1

It is certified that error appears in the above-identified patent and that said Letters Patent is hereby corrected as shown below:

In the Claims

In Column 101, Line 12, In Claim 15, delete "CD32." and insert -- CD3ζ. --

In Column 101, Line 18, In Claim 16, delete "CD35" and insert -- CD3ζ --

Signed and Sealed this
Twentieth Day of January, 2026

John A. Squires
*Director of the United States Patent and Trademark Office*